US008786479B2

(12) United States Patent
Tsuchi

(10) Patent No.: US 8,786,479 B2
(45) Date of Patent: Jul. 22, 2014

(54) DIGITAL ANALOG CONVERTER CIRCUIT, DIGITAL DRIVER AND DISPLAY DEVICE

(75) Inventor: Hiroshi Tsuchi, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 789 days.

(21) Appl. No.: 13/064,354

(22) Filed: Mar. 21, 2011

(65) Prior Publication Data

US 2011/0234571 A1 Sep. 29, 2011

(30) Foreign Application Priority Data

Mar. 26, 2010 (JP) ................................ 2010-071921

(51) Int. Cl.
*H03M 1/68* (2006.01)

(52) U.S. Cl.
USPC ............................ 341/145; 341/144; 345/692

(58) Field of Classification Search
USPC .............. 341/144–145; 345/87, 94, 204, 211, 345/690–693
See application file for complete search history.

(56) References Cited

U.S. PATENT DOCUMENTS

| | | | | |
|---|---|---|---|---|
| 6,373,419 | B1 * | 4/2002 | Nakao | 341/154 |
| 6,535,189 | B1 * | 3/2003 | Akiyama et al. | 345/87 |
| 7,126,518 | B2 * | 10/2006 | Tsuchi | 341/145 |
| 7,209,057 | B2 * | 4/2007 | Hashido et al. | 341/145 |
| 7,368,990 | B2 * | 5/2008 | Tsuchi | 341/145 |
| 7,369,075 | B2 * | 5/2008 | Ishii et al. | 341/145 |
| 7,812,752 | B2 * | 10/2010 | Tsuchi et al. | 341/145 |
| 8,111,184 | B2 * | 2/2012 | Tsuchi | 341/145 |
| 8,379,000 | B2 | 2/2013 | Tsuchi | |
| 2006/0132193 | A1 | 6/2006 | Tsuchi | |
| 2009/0213051 | A1 | 8/2009 | Tsuchi | |

FOREIGN PATENT DOCUMENTS

| | | | |
|---|---|---|---|
| JP | 2006-174180 | A | 6/2006 |
| JP | 2009-213132 | A | 9/2009 |
| JP | 2009-284310 | A | 12/2009 |

OTHER PUBLICATIONS

Japanese Office Action dated Jun. 25, 2013, with partial English translation.

* cited by examiner

*Primary Examiner* — Lam T Mai
(74) *Attorney, Agent, or Firm* — McGinn IP Law Group, PLLC

(57) ABSTRACT

Reference voltages of a reference voltage ensemble are classed into first to (z×S+1)th reference voltage groups, where S is a power of 2 inclusive of 1 and z is a power of 2 plus 1. A decoder includes first to (z×S+1)th sub-decoders provided in association with the first to (z×S+1)th reference voltage groups, and a (z×S+1) input and 2 output type sub-decoder. The first to (z×S+1)th sub-decoders select, from the reference voltage of the first to the (z×S+1)th reference voltage groups, those reference voltages allocated to columns in a two-dimensional array of the reference voltages associated with the values of a first bit group of an input digital signal. The (z×S+1) input and 2 output sub-decoder receives outputs of the first to (z×S+1)th sub-decoders to select the first and second voltages from the reference voltages selected by the first to (z×S+1)th sub-decoders in response to the value of a second bit group of the input digital signal. An interpolation circuit receives the first and second voltages, selected by the decoder, to output a voltage level obtained on interpolation with an interpolation ratio of 1:1 (FIG. 1).

18 Claims, 32 Drawing Sheets

FIG. 2

| INDEX N | level | Vref | INDEX N | level | Vref | INDEX N | level | Vref |
|---|---|---|---|---|---|---|---|---|
| | | | ∫ | ∫ | | ∫ | ∫ | |
| 0 | A | Vr1 | N | 4(z-1)N+A | Vr(zN+1) | (N'-1) | 4(z-1)N+A | Vr(z(N'-1)+1) |
| | 1+A | | | 4(z-1)N+(A+1) | | | 4(z-1)(N'-1)+(A+1) | |
| | 2+A | Vr2 | | 4(z-1)N+(A+2) | Vr(zN+2) | | 4(z-1)(N'-1)+(A+2) | Vr(z(N'-1)+2) |
| | 3+A | | | 4(z-1)N+(A+3) | | | 4(z-1)(N'-1)+(A+3) | |
| | 4+A | | | 4(z-1)N+(A+4) | | | 4(z-1)(N'-1)+(A+4) | |
| | 5+A | | | 4(z-1)N+(A+5) | | | 4(z-1)(N'-1)+(A+5) | |
| | 6+A | Vr3 | | 4(z-1)N+(A+6) | Vr(zN+3) | | 4(z-1)(N'-1)+(A+6) | Vr(z(N'-1)+3) |
| | 7+A | | | 4(z-1)N+(A+7) | | | 4(z-1)(N'-1)+(A+7) | |
| | 8+A | | | 4(z-1)N+(A+8) | | | 4(z-1)(N'-1)+(A+8) | |
| | 9+A | | | 4(z-1)N+(A+9) | | | 4(z-1)(N'-1)+(A+9) | |
| | 10+A | Vr4 | | 4(z-1)N+(A+10) | Vr(zN+4) | | 4(z-1)(N'-1)+(A+10) | Vr(z(N'-1)+4) |
| | ∫ | | | ∫ | | | ∫ | |
| | 4(z-1)+(A-2) | Vr(z) | | 4(z-1)(N+1)+(A-2) | Vr(z(N+1)) | | 4(z-1)N'+(A-2) | Vr(zN') |
| | 4(z-1)+(A-1) | | | 4(z-1)(N+1)+(A-1) | | | 4(z-1)N'+(A-1) | |
| 1 | 4(z-1)+A | Vr(z+1) | (N+1) | 4(z-1)(N+1)+A | Vr(z(N+1)+1) | N' | 4(z-1)N'+A | Vr(zN'+1) |
| | ∫ | | | ∫ | | | | |

FIG. 3

| | | GRADATION OF REFERENCE VOLTAGES IN REFERENCE VOLTAGE GROUP | | | | | | | |
|---|---|---|---|---|---|---|---|---|---|
| | | 1 | 2 | 3 | ~ | j | ~ | h-1 | h |
| REFERENCE VOLTAGE GROUP | 1 | Vr1 | Vr (zS+1) | Vr (2zS+1) | ~ | Vr {(j-1)x(zS)+1)} | ~ | Vr {(h-2)x(zS)+1)} | Vr {(h-1)x(zS)+1)} |
| | 2 | Vr2 | Vr (zS+2) | Vr (2zS+2) | ~ | Vr {(j-1)x(zS)+2)} | ~ | Vr {(h-2)x(zS)+2)} | Vr {(h-1)x(zS)+2)} |
| | 3 | Vr3 | Vr (zS+3) | Vr (2zS+3) | ~ | Vr {(j-1)x(zS)+3)} | ~ | Vr {(h-2)x(zS)+3)} | Vr {(h-1)x(zS)+3)} |
| | ⋮ | ⋮ | ⋮ | ⋮ | ⋮ | ⋮ | ⋮ | ⋮ | ⋮ |
| | i | Vr(i) | Vr (zS+i) | Vr (2zS+i) | ~ | Vr {(j-1)x(zS)+i)} | ~ | Vr {(h-2)x(zS)+i)} | Vr {(h-1)x(zS)+i)} |
| | ⋮ | ⋮ | ⋮ | ⋮ | ⋮ | ⋮ | ⋮ | ⋮ | ⋮ |
| | zS | Vr(zS) | Vr(2zS) | Vr(3zS) | ~ | Vr(jzS) | ~ | Vr {(h-1)x(zS)} | Vr (hzS) |
| | zS+1 | Vr(zS+1) | Vr(2zS+1) | Vr(3zS+1) | ~ | Vr(jzS+1) | ~ | Vr {(h-1)x(zS)+1)} | Vr (hzS+1) |

S DENOTES POWERS OF 2 INCLUSIVE OF 1 (1, 2, 4, 8 AND SO ON)
Z DENOTES POWERS OF 2 WITH 1, Z BEING NOT LESS THAN 5 (5, 9, 17 AND SO ON)

FIG. 4

SPECIFICATION EXAMPLE FOR TOTAL NUMBER OF OUTPUT LEVELS OF 1024 WITH Z=5

(1) h=64 FOR S=1

(2) h=32 FOR S=2

(3) h=16 FOR S=4

AND SO ON

TOTAL NUMBER OF REFERENCE VOLTAGES 321

VOLTAGE LEVEL → level; DECODER INPUT REFERENCE VOLTAGES → Vref; DECODER SELECTED VOLTAGES → V(T1), V(T2); DIGITAL DATA: MSB (D9) ↔ LSB (D0)

| level | Vref | V(T1) | V(T2) | D9 | D8 | D7 | D6 | D5 | D4 | D3 | D2 | D1 | D0 |
|---|---|---|---|---|---|---|---|---|---|---|---|---|---|
| 0 | Vr1 | Vr1 | Vr1 | 0 | 0 | 0 | 0 | 0 | 0 | 0 | 0 | 0 | 0 |
| 1 | | Vr2 | Vr1 | 0 | 0 | 0 | 0 | 0 | 0 | 0 | 0 | 0 | 1 |
| 2 | Vr2 | Vr2 | Vr2 | 0 | 0 | 0 | 0 | 0 | 0 | 0 | 0 | 1 | 0 |
| 3 | | Vr3 | Vr1 | 0 | 0 | 0 | 0 | 0 | 0 | 0 | 0 | 1 | 1 |
| 4 | | Vr3 | Vr2 | 0 | 0 | 0 | 0 | 0 | 0 | 0 | 1 | 0 | 0 |
| 5 | | Vr4 | Vr1 | 0 | 0 | 0 | 0 | 0 | 0 | 0 | 1 | 0 | 1 |
| 6 | Vr3 | Vr4 | Vr2 | 0 | 0 | 0 | 0 | 0 | 0 | 0 | 1 | 1 | 0 |
| 7 | | Vr5 | Vr1 | 0 | 0 | 0 | 0 | 0 | 0 | 0 | 1 | 1 | 1 |
| 8 | | Vr5 | Vr2 | 0 | 0 | 0 | 0 | 0 | 0 | 1 | 0 | 0 | 0 |
| 9 | | Vr6 | Vr2 | 0 | 0 | 0 | 0 | 0 | 0 | 1 | 0 | 0 | 1 |
| 10 | Vr4 | Vr5 | Vr3 | 0 | 0 | 0 | 0 | 0 | 0 | 1 | 0 | 1 | 0 |
| 11 | | Vr6 | Vr3 | 0 | 0 | 0 | 0 | 0 | 0 | 1 | 0 | 1 | 1 |
| 12 | | Vr5 | Vr4 | 0 | 0 | 0 | 0 | 0 | 0 | 1 | 1 | 0 | 0 |
| 13 | | Vr6 | Vr4 | 0 | 0 | 0 | 0 | 0 | 0 | 1 | 1 | 0 | 1 |
| 14 | Vr5 | Vr5 | Vr5 | 0 | 0 | 0 | 0 | 0 | 0 | 1 | 1 | 1 | 0 |
| 15 | | Vr6 | Vr5 | 0 | 0 | 0 | 0 | 0 | 0 | 1 | 1 | 1 | 1 |
| 16 | Vr6 | Vr6 | Vr6 | 0 | 0 | 0 | 0 | 0 | 1 | 0 | 0 | 0 | 0 |
| 17 | | Vr7 | Vr6 | 0 | 0 | 0 | 0 | 0 | 1 | 0 | 0 | 0 | 1 |
| 18 | Vr7 | Vr7 | Vr7 | 0 | 0 | 0 | 0 | 0 | 1 | 0 | 0 | 1 | 0 |
| 19 | | Vr8 | Vr6 | 0 | 0 | 0 | 0 | 0 | 1 | 0 | 0 | 1 | 1 |
| 20 | | Vr8 | Vr7 | 0 | 0 | 0 | 0 | 0 | 1 | 0 | 1 | 0 | 0 |
| 21 | | Vr9 | Vr6 | 0 | 0 | 0 | 0 | 0 | 1 | 0 | 1 | 0 | 1 |
| 22 | Vr8 | Vr9 | Vr7 | 0 | 0 | 0 | 0 | 0 | 1 | 0 | 1 | 1 | 0 |
| 23 | | Vr10 | Vr6 | 0 | 0 | 0 | 0 | 0 | 1 | 0 | 1 | 1 | 1 |
| 24 | | Vr10 | Vr7 | 0 | 0 | 0 | 0 | 0 | 1 | 1 | 0 | 0 | 0 |
| 25 | | Vr11 | Vr7 | 0 | 0 | 0 | 0 | 0 | 1 | 1 | 0 | 0 | 1 |
| 26 | Vr9 | Vr10 | Vr8 | 0 | 0 | 0 | 0 | 0 | 1 | 1 | 0 | 1 | 0 |
| 27 | | Vr11 | Vr8 | 0 | 0 | 0 | 0 | 0 | 1 | 1 | 0 | 1 | 1 |
| 28 | | Vr10 | Vr9 | 0 | 0 | 0 | 0 | 0 | 1 | 1 | 1 | 0 | 0 |
| 29 | | Vr11 | Vr9 | 0 | 0 | 0 | 0 | 0 | 1 | 1 | 1 | 0 | 1 |
| 30 | Vr10 | Vr10 | Vr10 | 0 | 0 | 0 | 0 | 0 | 1 | 1 | 1 | 1 | 0 |
| 31 | | Vr11 | Vr10 | 0 | 0 | 0 | 0 | 0 | 1 | 1 | 1 | 1 | 1 |
| 32 | Vr11 | Vr11 | Vr11 | 0 | 0 | 0 | 0 | 1 | 0 | 0 | 0 | 0 | 0 |

| | | | | | | | | | | | | | |
|---|---|---|---|---|---|---|---|---|---|---|---|---|---|
| 991 | | Vr310 | Vr311 | 1 | 1 | 1 | 1 | 0 | 1 | 1 | 1 | 1 | 1 |
| 992 | Vr311 | Vr311 | Vr311 | 1 | 1 | 1 | 1 | 1 | 0 | 0 | 0 | 0 | 0 |
| 993 | | Vr312 | Vr311 | 1 | 1 | 1 | 1 | 1 | 0 | 0 | 0 | 0 | 1 |
| 994 | Vr312 | Vr312 | Vr312 | 1 | 1 | 1 | 1 | 1 | 0 | 0 | 0 | 1 | 0 |
| 995 | | Vr313 | Vr311 | 1 | 1 | 1 | 1 | 1 | 0 | 0 | 0 | 1 | 1 |
| 996 | | Vr313 | Vr312 | 1 | 1 | 1 | 1 | 1 | 0 | 0 | 1 | 0 | 0 |
| 997 | | Vr314 | Vr311 | 1 | 1 | 1 | 1 | 1 | 0 | 0 | 1 | 0 | 1 |
| 998 | Vr313 | Vr314 | Vr312 | 1 | 1 | 1 | 1 | 1 | 0 | 0 | 1 | 1 | 0 |
| 999 | | Vr315 | Vr311 | 1 | 1 | 1 | 1 | 1 | 0 | 0 | 1 | 1 | 1 |
| 1000 | | Vr315 | Vr312 | 1 | 1 | 1 | 1 | 1 | 0 | 1 | 0 | 0 | 0 |
| 1001 | | Vr316 | Vr312 | 1 | 1 | 1 | 1 | 1 | 0 | 1 | 0 | 0 | 1 |
| 1002 | Vr314 | Vr315 | Vr313 | 1 | 1 | 1 | 1 | 1 | 0 | 1 | 0 | 1 | 0 |
| 1003 | | Vr316 | Vr313 | 1 | 1 | 1 | 1 | 1 | 0 | 1 | 0 | 1 | 1 |
| 1004 | | Vr315 | Vr314 | 1 | 1 | 1 | 1 | 1 | 0 | 1 | 1 | 0 | 0 |
| 1005 | | Vr316 | Vr314 | 1 | 1 | 1 | 1 | 1 | 0 | 1 | 1 | 0 | 1 |
| 1006 | Vr315 | Vr315 | Vr315 | 1 | 1 | 1 | 1 | 1 | 0 | 1 | 1 | 1 | 0 |
| 1007 | | Vr316 | Vr315 | 1 | 1 | 1 | 1 | 1 | 0 | 1 | 1 | 1 | 1 |
| 1008 | Vr316 | Vr316 | Vr316 | 1 | 1 | 1 | 1 | 1 | 1 | 0 | 0 | 0 | 0 |
| 1009 | | Vr317 | Vr316 | 1 | 1 | 1 | 1 | 1 | 1 | 0 | 0 | 0 | 1 |
| 1010 | Vr317 | Vr317 | Vr317 | 1 | 1 | 1 | 1 | 1 | 1 | 0 | 0 | 1 | 0 |
| 1011 | | Vr318 | Vr316 | 1 | 1 | 1 | 1 | 1 | 1 | 0 | 0 | 1 | 1 |
| 1012 | | Vr318 | Vr317 | 1 | 1 | 1 | 1 | 1 | 1 | 0 | 1 | 0 | 0 |
| 1013 | | Vr319 | Vr316 | 1 | 1 | 1 | 1 | 1 | 1 | 0 | 1 | 0 | 1 |
| 1014 | Vr318 | Vr319 | Vr317 | 1 | 1 | 1 | 1 | 1 | 1 | 0 | 1 | 1 | 0 |
| 1015 | | Vr320 | Vr316 | 1 | 1 | 1 | 1 | 1 | 1 | 0 | 1 | 1 | 1 |
| 1016 | | Vr320 | Vr317 | 1 | 1 | 1 | 1 | 1 | 1 | 1 | 0 | 0 | 0 |
| 1017 | | Vr321 | Vr317 | 1 | 1 | 1 | 1 | 1 | 1 | 1 | 0 | 0 | 1 |
| 1018 | Vr319 | Vr320 | Vr318 | 1 | 1 | 1 | 1 | 1 | 1 | 1 | 0 | 1 | 0 |
| 1019 | | Vr321 | Vr318 | 1 | 1 | 1 | 1 | 1 | 1 | 1 | 0 | 1 | 1 |
| 1020 | | Vr320 | Vr319 | 1 | 1 | 1 | 1 | 1 | 1 | 1 | 1 | 0 | 0 |
| 1021 | | Vr321 | Vr319 | 1 | 1 | 1 | 1 | 1 | 1 | 1 | 1 | 0 | 1 |
| 1022 | Vr320 | Vr320 | Vr320 | 1 | 1 | 1 | 1 | 1 | 1 | 1 | 1 | 1 | 0 |
| 1023 | | Vr321 | Vr320 | 1 | 1 | 1 | 1 | 1 | 1 | 1 | 1 | 1 | 1 |
| 1024 | Vr321 | | | | | | | | | | | | |

FIG. 11

SPECIFICATION EXAMPLE FOR TOTAL NUMBER OF OUTPUT LEVELS OF 1024 WITH z=9

(1) h=32 FOR S=1

(2) h=16 FOR S=2

AND SO ON

TOTAL NUMBER OF REFERENCE VOLTAGES 289

VOLTAGE LEVEL → level; DECODER INPUT REFERENCE VOLTAGES → Vref; DECODER SELECTED VOLTAGES → V(T1), V(T2); DIGITAL DATA: D9 (MSB) … D0

| level | Vref | V(T1) | V(T2) | D9 | D8 | D7 | D6 | D5 | D4 | D3 | D2 | D1 | D0 |
|---|---|---|---|---|---|---|---|---|---|---|---|---|---|
| 0 | Vr1 | Vr1 | Vr1 | 0 | 0 | 0 | 0 | 0 | 0 | 0 | 0 | 0 | 0 |
| 1 | | Vr2 | Vr1 | 0 | 0 | 0 | 0 | 0 | 0 | 0 | 0 | 0 | 1 |
| 2 | Vr2 | Vr2 | Vr2 | 0 | 0 | 0 | 0 | 0 | 0 | 0 | 0 | 1 | 0 |
| 3 | | Vr3 | Vr1 | 0 | 0 | 0 | 0 | 0 | 0 | 0 | 0 | 1 | 1 |
| 4 | | Vr3 | Vr2 | 0 | 0 | 0 | 0 | 0 | 0 | 0 | 1 | 0 | 0 |
| 5 | | Vr4 | Vr1 | 0 | 0 | 0 | 0 | 0 | 0 | 0 | 1 | 0 | 1 |
| 6 | Vr3 | Vr4 | Vr2 | 0 | 0 | 0 | 0 | 0 | 0 | 0 | 1 | 1 | 0 |
| 7 | | Vr5 | Vr1 | 0 | 0 | 0 | 0 | 0 | 0 | 0 | 1 | 1 | 1 |
| 8 | | Vr5 | Vr2 | 0 | 0 | 0 | 0 | 0 | 0 | 1 | 0 | 0 | 0 |
| 9 | | Vr6 | Vr1 | 0 | 0 | 0 | 0 | 0 | 0 | 1 | 0 | 0 | 1 |
| 10 | Vr4 | Vr6 | Vr2 | 0 | 0 | 0 | 0 | 0 | 0 | 1 | 0 | 1 | 0 |
| 11 | | Vr7 | Vr1 | 0 | 0 | 0 | 0 | 0 | 0 | 1 | 0 | 1 | 1 |
| 12 | | Vr7 | Vr2 | 0 | 0 | 0 | 0 | 0 | 0 | 1 | 1 | 0 | 0 |
| 13 | | Vr8 | Vr1 | 0 | 0 | 0 | 0 | 0 | 0 | 1 | 1 | 0 | 1 |
| 14 | Vr5 | Vr8 | Vr2 | 0 | 0 | 0 | 0 | 0 | 0 | 1 | 1 | 1 | 0 |
| 15 | | Vr9 | Vr1 | 0 | 0 | 0 | 0 | 0 | 0 | 1 | 1 | 1 | 1 |
| 16 | | Vr9 | Vr2 | 0 | 0 | 0 | 0 | 0 | 1 | 0 | 0 | 0 | 0 |
| 17 | | Vr10 | Vr2 | 0 | 0 | 0 | 0 | 0 | 1 | 0 | 0 | 0 | 1 |
| 18 | Vr6 | Vr9 | Vr3 | 0 | 0 | 0 | 0 | 0 | 1 | 0 | 0 | 1 | 0 |
| 19 | | Vr10 | Vr3 | 0 | 0 | 0 | 0 | 0 | 1 | 0 | 0 | 1 | 1 |
| 20 | | Vr9 | Vr4 | 0 | 0 | 0 | 0 | 0 | 1 | 0 | 1 | 0 | 0 |
| 21 | | Vr10 | Vr4 | 0 | 0 | 0 | 0 | 0 | 1 | 0 | 1 | 0 | 1 |
| 22 | Vr7 | Vr9 | Vr5 | 0 | 0 | 0 | 0 | 0 | 1 | 0 | 1 | 1 | 0 |
| 23 | | Vr10 | Vr5 | 0 | 0 | 0 | 0 | 0 | 1 | 0 | 1 | 1 | 1 |
| 24 | | Vr9 | Vr6 | 0 | 0 | 0 | 0 | 0 | 1 | 1 | 0 | 0 | 0 |
| 25 | | Vr10 | Vr6 | 0 | 0 | 0 | 0 | 0 | 1 | 1 | 0 | 0 | 1 |
| 26 | Vr8 | Vr9 | Vr7 | 0 | 0 | 0 | 0 | 0 | 1 | 1 | 0 | 1 | 0 |
| 27 | | Vr10 | Vr7 | 0 | 0 | 0 | 0 | 0 | 1 | 1 | 0 | 1 | 1 |
| 28 | | Vr9 | Vr8 | 0 | 0 | 0 | 0 | 0 | 1 | 1 | 1 | 0 | 0 |
| 29 | | Vr10 | Vr8 | 0 | 0 | 0 | 0 | 0 | 1 | 1 | 1 | 0 | 1 |
| 30 | Vr9 | Vr9 | Vr9 | 0 | 0 | 0 | 0 | 0 | 1 | 1 | 1 | 1 | 0 |
| 31 | | Vr10 | Vr9 | 0 | 0 | 0 | 0 | 0 | 1 | 1 | 1 | 1 | 1 |
| 32 | Vr10 | Vr10 | Vr10 | 0 | 0 | 0 | 0 | 1 | 0 | 0 | 0 | 0 | 0 |
| 991 | | Vr280 | Vr279 | 1 | 1 | 1 | 1 | 0 | 1 | 1 | 1 | 1 | 1 |
| 992 | Vr280 | Vr280 | Vr280 | 1 | 1 | 1 | 1 | 1 | 0 | 0 | 0 | 0 | 0 |
| 993 | | Vr281 | Vr280 | 1 | 1 | 1 | 1 | 1 | 0 | 0 | 0 | 0 | 1 |
| 994 | Vr281 | Vr281 | Vr281 | 1 | 1 | 1 | 1 | 1 | 0 | 0 | 0 | 1 | 0 |
| 995 | | Vr282 | Vr280 | 1 | 1 | 1 | 1 | 1 | 0 | 0 | 0 | 1 | 1 |
| 996 | | Vr282 | Vr281 | 1 | 1 | 1 | 1 | 1 | 0 | 0 | 1 | 0 | 0 |
| 997 | | Vr283 | Vr280 | 1 | 1 | 1 | 1 | 1 | 0 | 0 | 1 | 0 | 1 |
| 998 | Vr282 | Vr283 | Vr281 | 1 | 1 | 1 | 1 | 1 | 0 | 0 | 1 | 1 | 0 |
| 999 | | Vr284 | Vr280 | 1 | 1 | 1 | 1 | 1 | 0 | 0 | 1 | 1 | 1 |
| 1000 | | Vr284 | Vr281 | 1 | 1 | 1 | 1 | 1 | 0 | 1 | 0 | 0 | 0 |
| 1001 | | Vr285 | Vr280 | 1 | 1 | 1 | 1 | 1 | 0 | 1 | 0 | 0 | 1 |
| 1002 | Vr283 | Vr285 | Vr281 | 1 | 1 | 1 | 1 | 1 | 0 | 1 | 0 | 1 | 0 |
| 1003 | | Vr286 | Vr280 | 1 | 1 | 1 | 1 | 1 | 0 | 1 | 0 | 1 | 1 |
| 1004 | | Vr286 | Vr281 | 1 | 1 | 1 | 1 | 1 | 0 | 1 | 1 | 0 | 0 |
| 1005 | | Vr287 | Vr280 | 1 | 1 | 1 | 1 | 1 | 0 | 1 | 1 | 0 | 1 |
| 1006 | Vr284 | Vr287 | Vr281 | 1 | 1 | 1 | 1 | 1 | 0 | 1 | 1 | 1 | 0 |
| 1007 | | Vr288 | Vr280 | 1 | 1 | 1 | 1 | 1 | 0 | 1 | 1 | 1 | 1 |
| 1008 | | Vr288 | Vr281 | 1 | 1 | 1 | 1 | 1 | 1 | 0 | 0 | 0 | 0 |
| 1009 | | Vr289 | Vr281 | 1 | 1 | 1 | 1 | 1 | 1 | 0 | 0 | 0 | 1 |
| 1010 | Vr285 | Vr288 | Vr282 | 1 | 1 | 1 | 1 | 1 | 1 | 0 | 0 | 1 | 0 |
| 1011 | | Vr289 | Vr282 | 1 | 1 | 1 | 1 | 1 | 1 | 0 | 0 | 1 | 1 |
| 1012 | | Vr288 | Vr283 | 1 | 1 | 1 | 1 | 1 | 1 | 0 | 1 | 0 | 0 |
| 1013 | | Vr289 | Vr283 | 1 | 1 | 1 | 1 | 1 | 1 | 0 | 1 | 0 | 1 |
| 1014 | Vr286 | Vr288 | Vr284 | 1 | 1 | 1 | 1 | 1 | 1 | 0 | 1 | 1 | 0 |
| 1015 | | Vr289 | Vr284 | 1 | 1 | 1 | 1 | 1 | 1 | 0 | 1 | 1 | 1 |
| 1016 | | Vr288 | Vr285 | 1 | 1 | 1 | 1 | 1 | 1 | 1 | 0 | 0 | 0 |
| 1017 | | Vr289 | Vr285 | 1 | 1 | 1 | 1 | 1 | 1 | 1 | 0 | 0 | 1 |
| 1018 | Vr287 | Vr288 | Vr286 | 1 | 1 | 1 | 1 | 1 | 1 | 1 | 0 | 1 | 0 |
| 1019 | | Vr289 | Vr286 | 1 | 1 | 1 | 1 | 1 | 1 | 1 | 0 | 1 | 1 |
| 1020 | | Vr288 | Vr287 | 1 | 1 | 1 | 1 | 1 | 1 | 1 | 1 | 0 | 0 |
| 1021 | | Vr289 | Vr287 | 1 | 1 | 1 | 1 | 1 | 1 | 1 | 1 | 0 | 1 |
| 1022 | Vr288 | Vr288 | Vr288 | 1 | 1 | 1 | 1 | 1 | 1 | 1 | 1 | 1 | 0 |
| 1023 | | Vr289 | Vr288 | 1 | 1 | 1 | 1 | 1 | 1 | 1 | 1 | 1 | 1 |
| 1024 | Vr289 | | | | | | | | | | | | |

FIG. 17

<THIRD SPECIFICATION>

SPECIFICATION EXAMPLE
FOR TOTAL NUMBER OF OUTPUT LEVELS:
1024, z=17

(1) h=16 FOR S=1
(2) h=8 FOR S=2
AND SO ON

TOTAL NUMBER OF REFERENCE VOLTAGES
273

| level | Vref | V(T1) | V(T2) | D9 | D8 | D7 | D6 | D5 | D4 | D3 | D2 | D1 | D0 |
|---|---|---|---|---|---|---|---|---|---|---|---|---|---|
| 0 | Vr1 | Vr1 | Vr1 | 0 | 0 | 0 | 0 | 0 | 0 | 0 | 0 | 0 | 0 |
| 1 | | Vr2 | Vr1 | 0 | 0 | 0 | 0 | 0 | 0 | 0 | 0 | 0 | 1 |
| 2 | Vr2 | Vr2 | Vr2 | 0 | 0 | 0 | 0 | 0 | 0 | 0 | 0 | 1 | 0 |
| 3 | | Vr3 | Vr1 | 0 | 0 | 0 | 0 | 0 | 0 | 0 | 0 | 1 | 1 |
| 4 | | Vr3 | Vr2 | 0 | 0 | 0 | 0 | 0 | 0 | 0 | 1 | 0 | 0 |
| 5 | | Vr4 | Vr1 | 0 | 0 | 0 | 0 | 0 | 0 | 0 | 1 | 0 | 1 |
| 6 | Vr3 | Vr4 | Vr2 | 0 | 0 | 0 | 0 | 0 | 0 | 0 | 1 | 1 | 0 |
| 7 | | Vr5 | Vr1 | 0 | 0 | 0 | 0 | 0 | 0 | 0 | 1 | 1 | 1 |
| 8 | | Vr5 | Vr2 | 0 | 0 | 0 | 0 | 0 | 0 | 1 | 0 | 0 | 0 |
| 9 | | Vr6 | Vr1 | 0 | 0 | 0 | 0 | 0 | 0 | 1 | 0 | 0 | 1 |
| 10 | Vr4 | Vr6 | Vr2 | 0 | 0 | 0 | 0 | 0 | 0 | 1 | 0 | 1 | 0 |
| 11 | | Vr7 | Vr1 | 0 | 0 | 0 | 0 | 0 | 0 | 1 | 0 | 1 | 1 |
| 12 | | Vr7 | Vr2 | 0 | 0 | 0 | 0 | 0 | 0 | 1 | 1 | 0 | 0 |
| 13 | | Vr8 | Vr1 | 0 | 0 | 0 | 0 | 0 | 0 | 1 | 1 | 0 | 1 |
| 14 | Vr5 | Vr8 | Vr2 | 0 | 0 | 0 | 0 | 0 | 0 | 1 | 1 | 1 | 0 |
| 15 | | Vr9 | Vr1 | 0 | 0 | 0 | 0 | 0 | 0 | 1 | 1 | 1 | 1 |
| 16 | | Vr9 | Vr2 | 0 | 0 | 0 | 0 | 0 | 1 | 0 | 0 | 0 | 0 |
| 17 | | Vr10 | Vr1 | 0 | 0 | 0 | 0 | 0 | 1 | 0 | 0 | 0 | 1 |
| 18 | Vr6 | Vr10 | Vr2 | 0 | 0 | 0 | 0 | 0 | 1 | 0 | 0 | 1 | 0 |
| 19 | | Vr11 | Vr1 | 0 | 0 | 0 | 0 | 0 | 1 | 0 | 0 | 1 | 1 |
| 20 | | Vr11 | Vr2 | 0 | 0 | 0 | 0 | 0 | 1 | 0 | 1 | 0 | 0 |
| 21 | | Vr12 | Vr1 | 0 | 0 | 0 | 0 | 0 | 1 | 0 | 1 | 0 | 1 |
| 22 | Vr7 | Vr12 | Vr2 | 0 | 0 | 0 | 0 | 0 | 1 | 0 | 1 | 1 | 0 |
| 23 | | Vr13 | Vr1 | 0 | 0 | 0 | 0 | 0 | 1 | 0 | 1 | 1 | 1 |
| 24 | | Vr13 | Vr2 | 0 | 0 | 0 | 0 | 0 | 1 | 1 | 0 | 0 | 0 |
| 25 | | Vr14 | Vr1 | 0 | 0 | 0 | 0 | 0 | 1 | 1 | 0 | 0 | 1 |
| 26 | Vr8 | Vr14 | Vr2 | 0 | 0 | 0 | 0 | 0 | 1 | 1 | 0 | 1 | 0 |
| 27 | | Vr15 | Vr1 | 0 | 0 | 0 | 0 | 0 | 1 | 1 | 0 | 1 | 1 |
| 28 | | Vr15 | Vr2 | 0 | 0 | 0 | 0 | 0 | 1 | 1 | 1 | 0 | 0 |
| 29 | | Vr16 | Vr1 | 0 | 0 | 0 | 0 | 0 | 1 | 1 | 1 | 0 | 1 |
| 30 | Vr9 | Vr16 | Vr2 | 0 | 0 | 0 | 0 | 0 | 1 | 1 | 1 | 1 | 0 |
| 31 | | Vr17 | Vr1 | 0 | 0 | 0 | 0 | 0 | 1 | 1 | 1 | 1 | 1 |
| 32 | | Vr17 | Vr2 | 0 | 0 | 0 | 0 | 1 | 0 | 0 | 0 | 0 | 0 |
| 33 | | Vr18 | Vr2 | 0 | 0 | 0 | 0 | 1 | 0 | 0 | 0 | 0 | 1 |
| 34 | Vr10 | Vr17 | Vr3 | 0 | 0 | 0 | 0 | 1 | 0 | 0 | 0 | 1 | 0 |
| 35 | | Vr18 | Vr3 | 0 | 0 | 0 | 0 | 1 | 0 | 0 | 0 | 1 | 1 |
| 36 | | Vr17 | Vr4 | 0 | 0 | 0 | 0 | 1 | 0 | 0 | 1 | 0 | 0 |
| 37 | | Vr18 | Vr4 | 0 | 0 | 0 | 0 | 1 | 0 | 0 | 1 | 0 | 1 |
| 38 | Vr11 | Vr17 | Vr5 | 0 | 0 | 0 | 0 | 1 | 0 | 0 | 1 | 1 | 0 |
| 39 | | Vr18 | Vr5 | 0 | 0 | 0 | 0 | 1 | 0 | 0 | 1 | 1 | 1 |
| 40 | | Vr17 | Vr6 | 0 | 0 | 0 | 0 | 1 | 0 | 1 | 0 | 0 | 0 |
| 41 | | Vr18 | Vr6 | 0 | 0 | 0 | 0 | 1 | 0 | 1 | 0 | 0 | 1 |
| 42 | Vr12 | Vr17 | Vr7 | 0 | 0 | 0 | 0 | 1 | 0 | 1 | 0 | 1 | 0 |
| 43 | | Vr18 | Vr7 | 0 | 0 | 0 | 0 | 1 | 0 | 1 | 0 | 1 | 1 |
| 44 | | Vr17 | Vr8 | 0 | 0 | 0 | 0 | 1 | 0 | 1 | 1 | 0 | 0 |
| 45 | | Vr18 | Vr8 | 0 | 0 | 0 | 0 | 1 | 0 | 1 | 1 | 0 | 1 |
| 46 | Vr13 | Vr17 | Vr9 | 0 | 0 | 0 | 0 | 1 | 0 | 1 | 1 | 1 | 0 |
| 47 | | Vr18 | Vr9 | 0 | 0 | 0 | 0 | 1 | 0 | 1 | 1 | 1 | 1 |
| 48 | | Vr17 | Vr10 | 0 | 0 | 0 | 0 | 1 | 1 | 0 | 0 | 0 | 0 |
| 49 | | Vr18 | Vr10 | 0 | 0 | 0 | 0 | 1 | 1 | 0 | 0 | 0 | 1 |
| 50 | Vr14 | Vr17 | Vr11 | 0 | 0 | 0 | 0 | 1 | 1 | 0 | 0 | 1 | 0 |
| 51 | | Vr18 | Vr11 | 0 | 0 | 0 | 0 | 1 | 1 | 0 | 0 | 1 | 1 |
| 52 | | Vr17 | Vr12 | 0 | 0 | 0 | 0 | 1 | 1 | 0 | 1 | 0 | 0 |
| 53 | | Vr18 | Vr12 | 0 | 0 | 0 | 0 | 1 | 1 | 0 | 1 | 0 | 1 |
| 54 | Vr15 | Vr17 | Vr13 | 0 | 0 | 0 | 0 | 1 | 1 | 0 | 1 | 1 | 0 |
| 55 | | Vr18 | Vr13 | 0 | 0 | 0 | 0 | 1 | 1 | 0 | 1 | 1 | 1 |
| 56 | | Vr17 | Vr14 | 0 | 0 | 0 | 0 | 1 | 1 | 1 | 0 | 0 | 0 |
| 57 | | Vr18 | Vr14 | 0 | 0 | 0 | 0 | 1 | 1 | 1 | 0 | 0 | 1 |
| 58 | Vr16 | Vr17 | Vr15 | 0 | 0 | 0 | 0 | 1 | 1 | 1 | 0 | 1 | 0 |
| 59 | | Vr18 | Vr15 | 0 | 0 | 0 | 0 | 1 | 1 | 1 | 0 | 1 | 1 |
| 60 | | Vr17 | Vr16 | 0 | 0 | 0 | 0 | 1 | 1 | 1 | 1 | 0 | 0 |
| 61 | | Vr18 | Vr16 | 0 | 0 | 0 | 0 | 1 | 1 | 1 | 1 | 0 | 1 |
| 62 | Vr17 | Vr17 | Vr17 | 0 | 0 | 0 | 0 | 1 | 1 | 1 | 1 | 1 | 0 |
| 63 | | Vr18 | Vr17 | 0 | 0 | 0 | 0 | 1 | 1 | 1 | 1 | 1 | 1 |
| 64 | Vr18 | Vr18 | Vr18 | 0 | 0 | 0 | 1 | 0 | 0 | 0 | 0 | 0 | 0 |

| | | | | | | | | | | | | | |
|---|---|---|---|---|---|---|---|---|---|---|---|---|---|
| 959 | | Vr255 | Vr256 | 1 | 1 | 1 | 0 | 1 | 1 | 1 | 1 | 1 | 1 |
| 960 | Vr256 | Vr256 | Vr256 | 1 | 1 | 1 | 1 | 0 | 0 | 0 | 0 | 0 | 0 |
| 961 | | Vr257 | Vr256 | 1 | 1 | 1 | 1 | 0 | 0 | 0 | 0 | 0 | 1 |
| 962 | Vr257 | Vr257 | Vr257 | 1 | 1 | 1 | 1 | 0 | 0 | 0 | 0 | 1 | 0 |
| 963 | | Vr258 | Vr256 | 1 | 1 | 1 | 1 | 0 | 0 | 0 | 0 | 1 | 1 |
| 964 | | Vr258 | Vr257 | 1 | 1 | 1 | 1 | 0 | 0 | 0 | 1 | 0 | 0 |
| 965 | | Vr259 | Vr256 | 1 | 1 | 1 | 1 | 0 | 0 | 0 | 1 | 0 | 1 |
| 966 | Vr258 | Vr259 | Vr257 | 1 | 1 | 1 | 1 | 0 | 0 | 0 | 1 | 1 | 0 |
| 967 | | Vr260 | Vr256 | 1 | 1 | 1 | 1 | 0 | 0 | 0 | 1 | 1 | 1 |
| 968 | | Vr260 | Vr257 | 1 | 1 | 1 | 1 | 0 | 0 | 1 | 0 | 0 | 0 |
| 969 | | Vr261 | Vr256 | 1 | 1 | 1 | 1 | 0 | 0 | 1 | 0 | 0 | 1 |
| 970 | Vr259 | Vr261 | Vr257 | 1 | 1 | 1 | 1 | 0 | 0 | 1 | 0 | 1 | 0 |
| 971 | | Vr262 | Vr256 | 1 | 1 | 1 | 1 | 0 | 0 | 1 | 0 | 1 | 1 |
| 972 | | Vr262 | Vr257 | 1 | 1 | 1 | 1 | 0 | 0 | 1 | 1 | 0 | 0 |
| 973 | | Vr263 | Vr256 | 1 | 1 | 1 | 1 | 0 | 0 | 1 | 1 | 0 | 1 |
| 974 | Vr260 | Vr263 | Vr257 | 1 | 1 | 1 | 1 | 0 | 0 | 1 | 1 | 1 | 0 |
| 975 | | Vr264 | Vr256 | 1 | 1 | 1 | 1 | 0 | 0 | 1 | 1 | 1 | 1 |
| 976 | | Vr264 | Vr257 | 1 | 1 | 1 | 1 | 0 | 1 | 0 | 0 | 0 | 0 |
| 977 | | Vr265 | Vr256 | 1 | 1 | 1 | 1 | 0 | 1 | 0 | 0 | 0 | 1 |
| 978 | Vr261 | Vr265 | Vr257 | 1 | 1 | 1 | 1 | 0 | 1 | 0 | 0 | 1 | 0 |
| 979 | | Vr266 | Vr256 | 1 | 1 | 1 | 1 | 0 | 1 | 0 | 0 | 1 | 1 |
| 980 | | Vr266 | Vr257 | 1 | 1 | 1 | 1 | 0 | 1 | 0 | 1 | 0 | 0 |
| 981 | | Vr267 | Vr256 | 1 | 1 | 1 | 1 | 0 | 1 | 0 | 1 | 0 | 1 |
| 982 | Vr262 | Vr267 | Vr257 | 1 | 1 | 1 | 1 | 0 | 1 | 0 | 1 | 1 | 0 |
| 983 | | Vr268 | Vr256 | 1 | 1 | 1 | 1 | 0 | 1 | 0 | 1 | 1 | 1 |
| 984 | | Vr268 | Vr257 | 1 | 1 | 1 | 1 | 0 | 1 | 1 | 0 | 0 | 0 |
| 985 | | Vr269 | Vr256 | 1 | 1 | 1 | 1 | 0 | 1 | 1 | 0 | 0 | 1 |
| 986 | Vr263 | Vr269 | Vr257 | 1 | 1 | 1 | 1 | 0 | 1 | 1 | 0 | 1 | 0 |
| 987 | | Vr270 | Vr256 | 1 | 1 | 1 | 1 | 0 | 1 | 1 | 0 | 1 | 1 |
| 988 | | Vr270 | Vr257 | 1 | 1 | 1 | 1 | 0 | 1 | 1 | 1 | 0 | 0 |
| 989 | | Vr271 | Vr256 | 1 | 1 | 1 | 1 | 0 | 1 | 1 | 1 | 0 | 1 |
| 990 | Vr264 | Vr271 | Vr257 | 1 | 1 | 1 | 1 | 0 | 1 | 1 | 1 | 1 | 0 |
| 991 | | Vr272 | Vr256 | 1 | 1 | 1 | 1 | 0 | 1 | 1 | 1 | 1 | 1 |
| 992 | | Vr272 | Vr257 | 1 | 1 | 1 | 1 | 1 | 0 | 0 | 0 | 0 | 0 |
| 993 | | Vr273 | Vr257 | 1 | 1 | 1 | 1 | 1 | 0 | 0 | 0 | 0 | 1 |
| 994 | Vr265 | Vr272 | Vr258 | 1 | 1 | 1 | 1 | 1 | 0 | 0 | 0 | 1 | 0 |
| 995 | | Vr273 | Vr258 | 1 | 1 | 1 | 1 | 1 | 0 | 0 | 0 | 1 | 1 |
| 996 | | Vr272 | Vr259 | 1 | 1 | 1 | 1 | 1 | 0 | 0 | 1 | 0 | 0 |
| 997 | | Vr273 | Vr259 | 1 | 1 | 1 | 1 | 1 | 0 | 0 | 1 | 0 | 1 |
| 998 | Vr266 | Vr272 | Vr260 | 1 | 1 | 1 | 1 | 1 | 0 | 0 | 1 | 1 | 0 |
| 999 | | Vr273 | Vr260 | 1 | 1 | 1 | 1 | 1 | 0 | 0 | 1 | 1 | 1 |
| 1000 | | Vr272 | Vr261 | 1 | 1 | 1 | 1 | 1 | 0 | 1 | 0 | 0 | 0 |
| 1001 | | Vr273 | Vr261 | 1 | 1 | 1 | 1 | 1 | 0 | 1 | 0 | 0 | 1 |
| 1002 | Vr267 | Vr272 | Vr262 | 1 | 1 | 1 | 1 | 1 | 0 | 1 | 0 | 1 | 0 |
| 1003 | | Vr273 | Vr262 | 1 | 1 | 1 | 1 | 1 | 0 | 1 | 0 | 1 | 1 |
| 1004 | | Vr272 | Vr263 | 1 | 1 | 1 | 1 | 1 | 0 | 1 | 1 | 0 | 0 |
| 1005 | | Vr273 | Vr263 | 1 | 1 | 1 | 1 | 1 | 0 | 1 | 1 | 0 | 1 |
| 1006 | Vr268 | Vr272 | Vr264 | 1 | 1 | 1 | 1 | 1 | 0 | 1 | 1 | 1 | 0 |
| 1007 | | Vr273 | Vr264 | 1 | 1 | 1 | 1 | 1 | 0 | 1 | 1 | 1 | 1 |
| 1008 | | Vr272 | Vr265 | 1 | 1 | 1 | 1 | 1 | 1 | 0 | 0 | 0 | 0 |
| 1009 | | Vr273 | Vr265 | 1 | 1 | 1 | 1 | 1 | 1 | 0 | 0 | 0 | 1 |
| 1010 | Vr269 | Vr272 | Vr266 | 1 | 1 | 1 | 1 | 1 | 1 | 0 | 0 | 1 | 0 |
| 1011 | | Vr273 | Vr266 | 1 | 1 | 1 | 1 | 1 | 1 | 0 | 0 | 1 | 1 |
| 1012 | | Vr272 | Vr267 | 1 | 1 | 1 | 1 | 1 | 1 | 0 | 1 | 0 | 0 |
| 1013 | | Vr273 | Vr267 | 1 | 1 | 1 | 1 | 1 | 1 | 0 | 1 | 0 | 1 |
| 1014 | Vr270 | Vr272 | Vr268 | 1 | 1 | 1 | 1 | 1 | 1 | 0 | 1 | 1 | 0 |
| 1015 | | Vr273 | Vr268 | 1 | 1 | 1 | 1 | 1 | 1 | 0 | 1 | 1 | 1 |
| 1016 | | Vr272 | Vr269 | 1 | 1 | 1 | 1 | 1 | 1 | 1 | 0 | 0 | 0 |
| 1017 | | Vr273 | Vr269 | 1 | 1 | 1 | 1 | 1 | 1 | 1 | 0 | 0 | 1 |
| 1018 | Vr271 | Vr272 | Vr270 | 1 | 1 | 1 | 1 | 1 | 1 | 1 | 0 | 1 | 0 |
| 1019 | | Vr273 | Vr270 | 1 | 1 | 1 | 1 | 1 | 1 | 1 | 0 | 1 | 1 |
| 1020 | | Vr272 | Vr271 | 1 | 1 | 1 | 1 | 1 | 1 | 1 | 1 | 0 | 0 |
| 1021 | | Vr273 | Vr271 | 1 | 1 | 1 | 1 | 1 | 1 | 1 | 1 | 0 | 1 |
| 1022 | Vr272 | Vr272 | Vr272 | 1 | 1 | 1 | 1 | 1 | 1 | 1 | 1 | 1 | 0 |
| 1023 | | Vr273 | Vr272 | 1 | 1 | 1 | 1 | 1 | 1 | 1 | 1 | 1 | 1 |
| 1024 | Vr273 | | | | | | | | | | | | |

FIG. 22A

NUMBER OF TRANSISTOR SWITCHES OF DECODER 910 OF COMPARATIVE EXAMPLE (FIG.32)

| 10 BITS | S=1 | S=2 |
|---|---|---|
| SUB-DECODER 913 | 18 | 26 |
| SUB-DECODER 911 | 1016 | 882 |
| SUM | 1034 | 908 |

FIG. 22B

NUMBER OF TRANSISTOR SWITCHES OF INVENTIVE DECODER 10

| 10 BITS | FIRST SPECIFICATION (z=5) | | SECOND SPECIFICATION (z=9) | THIRD SPECIFICATION (z=17) |
|---|---|---|---|---|
| | S=1 (FIGS.5~7) | S=2 (FIGS.8~10) | S=1 (FIGS.12, 13, 14B AND 15) | S=1 (FIGS.17, 18, 19A, 19B) |
| SUB-DECODER 13 | 35 | 47 | 55 | 92 |
| SUB-DECODER 11 | 756 | 682 | 620 | 540 |
| SUM | 791 | 729 | 675 | 632 |

FIG. 24

SPECIFICATION
FOR z=5

| level | Vref | DIFFERENCE BETWEEN V(T1)- V(T2) VOLTAGE DIFFERENCES AT TWO NEIGHBORING VOLTAGE LEVELS NOT LARGER THAN 6 LEVELS | | DIFFERENCE BETWEEN V(T1)- V(T2) VOLTAGE DIFFERENCES AT TWO NEIGHBORING VOLTAGE LEVELS LARGER THAN 6 LEVELS | |
|---|---|---|---|---|---|
| | | (V(T1), V(T2)) COMBINATIONS *ORDER IS ARBITRARY | (V(T1), V(T2) ) LEVEL DIFFERENCES | (V(T1), V(T2) ) COMBINATIONS *ORDER IS ARBITRARY | (V(T1), V(T2) ) LEVEL DIFFERENCES |
| 0 | Vr1 | (Vr1,Vr1) | 0 | | |
| 1 | | (Vr1,Vr2) | 2 | | |
| 2 | Vr2 | (Vr2,Vr2) | 0 | | |
| 3 | | (Vr1,Vr3) | 6 | | |
| 4 | | (Vr2,Vr3) | 4 | | |
| 5 | | (Vr1,Vr4) | 10 | | |
| 6 | Vr3 | (Vr2,Vr4) | 8 | (Vr3,Vr3) | 0 |
| 7 | | (Vr1,Vr5) | 14 | | |
| 8 | | (Vr1,Vr6), (Vr2,Vr5) | 16, 12 | (Vr3,Vr4) | 4 |
| 9 | | (Vr2,Vr6) | 14 | | |
| 10 | Vr4 | (Vr3,Vr5) | 8 | (Vr4,Vr4) | 0 |
| 11 | | (Vr3,Vr6) | 10 | | |
| 12 | | (Vr4,Vr5) | 4 | | |
| 13 | | (Vr4,Vr6) | 6 | | |
| 14 | Vr5 | (Vr5,Vr5) | 0 | | |
| 15 | | (Vr5,Vr6) | 2 | | |
| (16) | Vr6 | | | | |

FIG. 26

SPECIFICATION FOR z=9

| | | DIFFERENCE BETWEEN V(T1)- V(T2) VOLTAGE DIFFERENCES AT TWO NEIGHBORING VOLTAGE LEVELS NOT LARGER THAN 6 LEVELS | | DIFFERENCE BETWEEN V(T1)- V(T2) VOLTAGE DIFFERENCES AT TWO NEIGHBORING VOLTAGE LEVELS LARGER THAN 6 LEVELS | |
|---|---|---|---|---|---|
| level | Vref | (V(T1), V(T2)) COMBINATIONS *ORDER IS ARBITRARY | (V(T1),V(T2)) LEVEL DIFFERENCES | (V(T1), V(T2)) COMBINATIONS *ORDER IS ARBITRARY | (V(T1), V(T2)) LEVEL DIFFERENCES |
| 0 | Vr1 | (Vr1,Vr1) | 0 | | |
| 1 | | (Vr1,Vr2) | 2 | | |
| 2 | Vr2 | (Vr2,Vr2) | 0 | | |
| 3 | | (Vr1,Vr3) | 6 | | |
| 4 | | (Vr2,Vr3) | 4 | | |
| 5 | | (Vr1,Vr4) | 10 | | |
| 6 | Vr3 | (Vr2,Vr4) | 8 | (Vr3,Vr3) | 0 |
| 7 | | (Vr1,Vr5) | 14 | | |
| 8 | | (Vr2,Vr5) | 12 | (Vr3,Vr4) | 4 |
| 9 | | (Vr1,Vr6) | 18 | | |
| 10 | Vr4 | (Vr2,Vr6) | 16 | (Vr3,Vr5), (Vr4,Vr4) | 8, 0 |
| 11 | | (Vr1,Vr7) | 22 | | |
| 12 | | (Vr2,Vr7) | 20 | (Vr3,Vr6), (Vr4,Vr5) | 12, 4 |
| 13 | | (Vr1,Vr8) | 26 | | |
| 14 | Vr5 | (Vr2,Vr8) | 24 | (Vr3,Vr7), (Vr4,Vr6), (Vr5,Vr5) | 16, 8, 0 |
| 15 | | (Vr1,Vr9) | 30 | | |
| 16 | | (Vr1,Vr10), (Vr2,Vr9) | 32, 28 | (Vr3,Vr8), (Vr4,Vr7), (Vr5,Vr6) | 20, 12, 4 |
| 17 | | (Vr2,Vr10) | 30 | | |
| 18 | Vr6 | (Vr3,Vr9) | 24 | (Vr4,Vr8), (Vr5,Vr7), (Vr6,Vr6) | 16, 8, 0 |
| 19 | | (Vr3,Vr10) | 26 | | |
| 20 | | (Vr4,Vr9) | 20 | (Vr5,Vr8), (Vr6,Vr7) | 12, 4 |
| 21 | | (Vr4,Vr10) | 22 | | |
| 22 | Vr7 | (Vr5,Vr9) | 16 | (Vr6,Vr8), (Vr7,Vr7) | 8, 0 |
| 23 | | (Vr5,Vr10) | 18 | | |
| 24 | | (Vr6,Vr9) | 12 | (Vr7,Vr8) | 4 |
| 25 | | (Vr6,Vr10) | 14 | | |
| 26 | Vr8 | (Vr7,Vr9) | 8 | (Vr8,Vr8) | 0 |
| 27 | | (Vr7,Vr10) | 10 | | |
| 28 | | (Vr8,Vr9) | 4 | | |
| 29 | | (Vr8,Vr10) | 6 | | |
| 30 | Vr9 | (Vr9,Vr9) | 0 | | |
| 31 | | (Vr9,Vr10) | 2 | | |
| 32 | Vr10 | | | | |

FIG. 27

SPECIFICATION
for z=17

| | | difference between V(T1) - V(T2) voltage differences at two neighboring voltage levels not larger than 6 levels | | difference between V(T1) - V(T2) voltage differences at two neighboring voltage levels larger than 6 levels | |
|---|---|---|---|---|---|
| level | Vref | (V(T1), V(T2)) combinations *order is arbitrary | (V(T1), V(T2)) level differences | (V(T1), V(T2)) combinations *order is arbitrary | (V(T1), V(T2)) level differences |
| 0 | Vr1 | (Vr1,Vr1) | 0 | | |
| 1 | | (Vr1,Vr2) | 2 | | |
| 2 | Vr2 | (Vr2,Vr2) | 0 | | |
| 3 | | (Vr1,Vr3) | 6 | | |
| 4 | | (Vr2,Vr3) | 4 | | |
| 5 | | (Vr1,Vr4) | 10 | | |
| 6 | Vr3 | (Vr2,Vr4) | 8 | (Vr3,Vr3) | 0 |
| 7 | | (Vr1,Vr5) | 14 | | |
| 8 | | (Vr2,Vr5) | 12 | (Vr3,Vr4) | 4 |
| 9 | | (Vr1,Vr6) | 18 | | |
| 10 | Vr4 | (Vr2,Vr6) | 16 | (Vr3,Vr5), (Vr4,Vr4) | 8, 0 |
| 11 | | (Vr1,Vr7) | 22 | | |
| 12 | | (Vr2,Vr7) | 20 | (Vr3,Vr6), (Vr4,Vr5) | 12, 4 |
| 13 | | (Vr1,Vr8) | 26 | | |
| 14 | Vr5 | (Vr2,Vr8) | 24 | (Vr3,Vr7), (Vr4,Vr6), (Vr5,Vr5) | 16, 8, 0 |
| 15 | | (Vr1,Vr9) | 30 | | |
| 16 | | (Vr2,Vr9) | 28 | (Vr3,Vr8), (Vr4,Vr7), (Vr5,Vr6) | 20, 12, 4 |
| 17 | | (Vr1,Vr10) | 34 | | |
| 18 | Vr6 | (Vr2,Vr10) | 32 | (Vr3,Vr9), (Vr4,Vr8), (Vr5,Vr7), (Vr6,Vr6) | 24, 16, 8, 0 |
| 19 | | (Vr1,Vr11) | 38 | | |
| 20 | | (Vr2,Vr11) | 36 | (Vr3, Vr10), (Vr4,Vr9), (Vr5,Vr8), (Vr6,Vr7) | 28, 20, 12, 4 |
| 21 | | (Vr1,Vr12) | 42 | | |
| 22 | Vr7 | (Vr2,Vr12) | 40 | (Vr3, Vr11), (Vr4,Vr10), (Vr5,Vr9), (Vr6,Vr8), (Vr7,Vr7) | 32, 24, 16, 8, 0 |
| 23 | | (Vr1,Vr13) | 46 | | |
| 24 | | (Vr2,Vr13) | 44 | (Vr3, Vr12), (Vr4,Vr11), (Vr5,Vr10), (Vr6,Vr9), (Vr7,Vr8) | 36, 28, 20, 12, 4 |
| 25 | | (Vr1,Vr14) | 50 | | |
| 26 | Vr8 | (Vr2,Vr14) | 48 | (Vr3, Vr13), (Vr4,Vr12), (Vr5,Vr11), (Vr6,Vr10), (Vr7,Vr9), (Vr8,Vr8) | 40, 32, 24, 16, 8, 0 |
| 27 | | (Vr1,Vr15) | 54 | | |
| 28 | | (Vr2,Vr15) | 52 | (Vr3, Vr14), (Vr4,Vr13), (Vr5,Vr12), (Vr6,Vr11), (Vr7,Vr10), (Vr8,Vr9) | 44, 36, 28, 20, 12, 4 |
| 29 | | (Vr1,Vr16) | 58 | | |
| 30 | Vr9 | (Vr2,Vr16) | 56 | (Vr3, Vr15), (Vr4,Vr14), (Vr5,Vr13), (Vr6,Vr12), (Vr7,Vr11), (Vr8,Vr10), (Vr9, Vr9) | 48, 40, 32, 24, 16, 8, 0 |
| 31 | | (Vr1,Vr17) | 62 | | |
| 32 | | (Vr1,Vr18), (Vr2,Vr17) | 64, 60 | (Vr3, Vr16), (Vr4,Vr15), (Vr5,Vr14), (Vr6,Vr13), (Vr7,Vr12), (Vr8,Vr11), (Vr9,Vr10) | 52, 44, 36, 28, 20, 12, 4 |
| 33 | | (Vr2,Vr18) | 62 | | |
| 34 | Vr10 | (Vr3,Vr17) | 56 | (Vr4,Vr16), (Vr5,Vr15), (Vr6,Vr14), (Vr7,Vr13), (Vr8,Vr12), (Vr9,Vr11), (Vr10,Vr10) | 48, 40, 32, 24, 16, 8, 0 |
| 35 | | (Vr3,Vr18) | 58 | | |
| 36 | | (Vr4,Vr17) | 52 | (Vr5,Vr16), (Vr6,Vr15), (Vr7,Vr14), (Vr8,Vr13), (Vr9,Vr12), (Vr10,Vr11) | 44, 36, 28, 20, 12, 4 |
| 37 | | (Vr4,Vr18) | 54 | | |
| 38 | Vr11 | (Vr5,Vr17) | 48 | (Vr6,Vr16), (Vr7,Vr15), (Vr8,Vr14), (Vr9,Vr13), (Vr10,Vr12), (Vr11,Vr11) | 40, 32, 24, 16, 8, 0 |
| 39 | | (Vr5,Vr18) | 50 | | |
| 40 | | (Vr6,Vr17) | 44 | (Vr7,Vr16), (Vr8,Vr15), (Vr9,Vr14), (Vr10,Vr13), (Vr11,Vr12) | 36, 28, 20, 12, 4 |
| 41 | | (Vr6,Vr18) | 46 | | |
| 42 | Vr12 | (Vr7,Vr17) | 40 | (Vr8,Vr16), (Vr9,Vr15), (Vr10,Vr14), (Vr11,Vr13), (Vr12,Vr12) | 32, 24, 16, 8, 0 |
| 43 | | (Vr7,Vr18) | 42 | | |
| 44 | | (Vr8,Vr17) | 36 | (Vr9,Vr16), (Vr10,Vr15), (Vr11,Vr14), (Vr12,Vr13) | 28, 20, 12, 4 |
| 45 | | (Vr8,Vr18) | 38 | | |
| 46 | Vr13 | (Vr9,Vr17) | 32 | (Vr10,Vr16), (Vr11,Vr15), (Vr12,Vr14), (Vr13,Vr13) | 24, 16, 8, 0 |
| 47 | | (Vr9,Vr18) | 34 | | |
| 48 | | (Vr10,Vr17) | 28 | (Vr11,Vr16), (Vr12,Vr15), (Vr13,Vr14) | 20, 12, 4 |
| 49 | | (Vr10,Vr18) | 30 | | |
| 50 | Vr14 | (Vr11,Vr17) | 24 | (Vr12,Vr16), (Vr13,Vr15), (Vr14,Vr14) | 16, 8, 0 |
| 51 | | (Vr11,Vr18) | 26 | | |
| 52 | | (Vr12,Vr17) | 20 | (Vr13,Vr16), (Vr14,Vr15) | 12, 4 |
| 53 | | (Vr12,Vr18) | 22 | | |
| 54 | Vr15 | (Vr13,Vr17) | 16 | (Vr14,Vr16), (Vr15,Vr15) | 8, 0 |
| 55 | | (Vr13,Vr18) | 18 | | |
| 56 | | (Vr14,Vr17) | 12 | (Vr15,Vr16) | 4 |
| 57 | | (Vr14,Vr18) | 14 | | |
| 58 | Vr16 | (Vr15,Vr17) | 8 | (Vr16,Vr16) | 0 |
| 59 | | (Vr15,Vr18) | 10 | | |
| 60 | | (Vr16,Vr17) | 4 | | |
| 61 | | (Vr16,Vr18) | 6 | | |
| 62 | Vr17 | (Vr17,Vr17) | 0 | | |
| 63 | | (Vr17,Vr18) | 2 | | |
| 64 | Vr18 | | | | |

FIG. 31A

PRIOR ART

| LEVEL | INPUT | (T1, T2) | (D2,D1,D0) |
|---|---|---|---|
| 1 | A | AA | 0,0,0 |
| 2 | | AB | 0,0,1 |
| 3 | B | BB | 0,1,0 |
| 4 | | AC | 0,1,1 |
| 5 | | BC (AD) | 1,0,0 |
| 6 | | BD | 1,0,1 |
| 7 | C | CC | 1,1,0 |
| 8 | | CD | 1,1,1 |
| 9 | D | DD | |

* ORDER OF T1 AND T2 IS ARBITRARY.

FIG. 31B

PRIOR ART

| LEVEL | INPUT | (T1, T2) | (D3,D2,D1,D0) |
|---|---|---|---|
| 1 | A | AA | 0,0,0,0 |
| 2 | | AB | 0,0,0,1 |
| 3 | B | BB | 0,0,1,0 |
| 4 | | AC | 0,0,1,1 |
| 5 | | BC | 0,1,0,0 |
| 6 | | AD | 0,1,0,1 |
| 7 | C | CC (BD) | 0,1,1,0 |
| 8 | | AE | 0,1,1,1 |
| 9 | | CD (BE, AF) | 1,0,0,0 |
| 10 | | BF | 1,0,0,1 |
| 11 | D | DD (CE) | 1,0,1,0 |
| 12 | | CF | 1,0,1,1 |
| 13 | | DE | 1,1,0,0 |
| 14 | | DF | 1,1,0,1 |
| 15 | E | EE | 1,1,1,0 |
| 16 | | EF | 1,1,1,1 |
| 17 | F | FF | |

* ORDER OF T1 AND T2 IS ARBITRARY.

DIGITAL ANALOG CONVERTER CIRCUIT, DIGITAL DRIVER AND DISPLAY DEVICE

REFERENCE TO RELATED APPLICATION

This application is based upon and claims the benefit of the priority of Japanese patent application No. 2010-071921, filed on Mar. 26, 2010, the disclosure of which is incorporated herein in its entirety by reference thereto. This invention relates to a digital to analog conversion circuit, a data river employing the digital analog converter, and a display device employing the data driver.

TECHNICAL FIELD

Background

A liquid crystal display device (LCD), featured by thin thickness, light weight and low power consumption has recently come into widespread use, and is being predominantly employed as a display unit of mobile equipments, such as a portable telephone set (mobile phones or cellular phones), or a PDA (Personal Digital Assistants) or a notebook personal computer. In these days, with the progress in the technique for increasing a viewing area and for coping with moving pictures, the LCD display is now usable not only for mobile equipment but also for a stationary large screen display device and for a large screen size liquid crystal television set. A liquid crystal display device of an active matrix driving system is in use. As a thin type display device, a display device of the active matrix driving system employing an organic light emitting diode (OLED) also has been developed.

Referring to FIG. 30, a typical configuration of a thin type display device of the active matrix driving system (a liquid crystal display device and an organic light emitting diode display device) will be briefly described. FIG. 30A is a block diagram showing essential portions of the thin type display device. FIG. 30B is a schematic view, showing essential portions of a unit pixel of a display device panel of a liquid crystal display device. FIG. 30C is a schematic view showing essential portions of a unit pixel of a display device panel of an organic light emitting diode display device. In FIGS. 30B and 30C, a unit pixel is schematically depicted as an equivalent circuit.

Referring to FIG. 30A, the thin type display device of the active matrix driving system includes, as its typical components, a power supply circuit 940, a display controller 950, a display panel 960, a gate driver 970 and a data driver 980. The display device panel 960 includes a matrix array of unit pixels each comprising a pixel switch 964 and a display element 963. In the case of a color SXGA (Super eXtended Graphics Array) panel, for example, the matrix array is made up by 1280×3 pixel columns and 1024 pixel rows. On the display device panel 960, a plurality of scan lines 961 that transmit scan signals output from the gate driver 970 to the respective unit pixels and a plurality of data lines 962 that transmit gray scale voltage signals output from the data driver 980 are arrayed in a lattice-shaped configuration. The gate driver 970 and the data driver 980 are supplied with a clock signal CLK and a control signal under control by the display device controller 950. Image data are supplied to the data driver 980. Nowadays, image data are predominantly digital data. A power supply circuit 940 supplies necessary power supply voltages to the gate driver 970 and the data driver 980. The display device panel 960 includes a semiconductor substrate. As the display device panel 960 for a large display device, a semiconductor substrate formed by an insulating substrate, having a plurality of thin film transistors (pixel switches) formed thereon, has been widely used.

In the display device of FIG. 30, the pixel switch 964 is turned on (made electrically conductive) and off by a scan signal and a gray scale level voltage signal, corresponding to pixel data, is applied to the display device element 963. The display device element 963 then is changed in luminance in response to the gray scale voltage signal, thus displaying an image. Each image data is written in each frame period, which is usually ca. 0.017 sec, for 60 Hz driving. Each scan line 961 sequentially selects pixel rows (lines) to turn on the pixel switches 964. During the time the pixel rows are selected, the gray scale voltage signals are supplied from the data lines 962 via the pixel switches 964 to the display device elements 963. There are cases where a plurality of pixels is simultaneously selected by scan lines or the driving is performed by a frame frequency higher than 60 Hz.

Referring to FIGS. 30A and 30B, a liquid crystal display device has a display panel 960 including a semiconductor substrate and an opposite substrate. The semiconductor substrate has a matrix array of pixel switches 964, as a unit pixel, and transparent electrodes 973. The opposite substrate has a single transparent electrode 974 extending on its entire surface. These substrates are mounted facing each other with a gap, in which a liquid crystal material is sealed. The display element 963, forming a unit pixel, includes a pixel electrode 973, an opposite substrate electrode 974, a liquid crystal capacitance 971 and an auxiliary capacitance 972. A backlight is provided as a light source on a back side of the display device panel.

When the pixel switch 964 is turned on by a scan signal from the scan line 961, the gray scale voltage signal from the data line 962 is applied to the pixel electrode 973. The transmittance of the backlight, transmitted through the liquid crystal, is changed due to the potential difference between each pixel electrode 973 and the opposite substrate 974. The potential difference is held by the liquid crystal capacitance 971 and the auxiliary capacitance 972 for a certain time even after the pixel witch 964 is turned off, thus providing for display.

In driving the liquid crystal display device, the voltage polarity is reversed between plus and minus polarities, with respect to the common voltage of the opposite electrode 974, usually every frame period (inverted driving), in order to prevent deterioration of liquid crystal. Hence, the data line 962 is also driven by dot inversion driving or column inversion driving. The dot inversion driving is a driving method in which a voltage polarity applied to the liquid crystal is changed in every pixel, whereas the column inversion driving is a driving method in which the voltage polarity is changed in every frame.

In the organic light emitting diode display device, shown in FIGS. 30A and 30C, the display device panel 960 includes a semiconductor substrate on which a matrix array of a plurality of unit pixels are arranged. Each of these unit pixels comprises a pixel switch 964, an organic light emitting diode 982 and a thin film transistor (TFT) 981. The organic light emitting diode is formed by an organic film sandwiched between two thin film electrode layers. The TFT controls a current supplied to the organic light emitting diode 982. The organic light emitting diode 982 and the TFT 981 are connected in series with each other between power supply terminals 984 and 985 supplied with different power supply voltages. An auxiliary capacitance 983 holds a control terminal voltage of the TFT 981. The display device element 963, associated with a pixel, includes the TFT 981, organic light emitting diode 982, power supply terminals 984, 985 and the auxiliary capacitance 983.

When the pixel switch 964 is turned on (made electrically conductive) by the scan signal from the scan line 961, the gray scale voltage signal from the data line 962 is applied to the control terminal of the TFT 981. This causes light to be emitted from the organic light emitting diode 982 with the luminance corresponding to the current to make necessary display. Light emission is sustained even after the pixel switch 964 is turned off (made electrically non-conductive), since the gray scale voltage signal applied to the control terminal of the TFT 981 is kept for a certain time by the auxiliary capacitance 983. In FIG. 30C, the pixel switch 964 and the TFT 981 formed by n-channel transistors are shown as an example. The TFT 981 may, however, be formed by a p-channel transistor. An organic EL element may also be connected to the side the power supply terminal 984. In the driving of the organic light emitting diode display device, no inverted driving, such as is used in the liquid crystal display device, need be used.

The above describes the configuration of an organic light emitting diode display device in which display is made in association with a gray scale voltage signal applied to a device element from the data line 962, but there is another configuration in which the display device receives a gray scale current signal output from the data driver to make display. However, the description of the present invention will be made only with reference to the configuration in which the display device receives a gray scale voltage output from the data driver to make display.

Referring to FIG. 30A, it is only sufficient for the gate driver 970 to supply a scan signal which is at least a binary signal. On the other hand, the data driver 980 has to drive each data line 962 with a number of multi-level gray scale voltage signals matched to the number of gray scales of the data lines 962. Therefore, the data driver 980 includes a decoder that converts image data into a gray scale voltage signal and a digital analog converter (DAC) circuit that includes an amplifier which amplifies and outputs the gray scale voltage signal to the data line 962.

For high-end use mobile equipments, notebook PCs, monitors or TV receivers, having thin type display devices, the tendency is towards a high picture quality and a multiple colors. Hence, there is an increasing need for 8 bit image data for each of R, G and B colors, with the number of colors being ca. 16800000, and even for 10 bit image data for each of R, G and B colors, with the number of colors being ca. 1100000000. It is thus required of the data driver, outputting gray scale voltage signals corresponding to multi-bit image data, not only to output a larger number of gray scale voltage values, but also to provide voltage outputs of extremely high accuracy correctly matched to the gray scales. If the number of the reference voltage values generated is increased in keeping with the increasing number of gray scales, the number of elements of the reference voltage generation circuit or the number of the reference voltage lines is increased. In addition, the number of switching transistors of the decoder circuit, selecting the reference voltages, matched to the input video signal, is increased. Namely, the progress in the multiple gray scales (8 to even 10 or more bits for each color) leads to an increased area of the decoder circuit and to increased cost of the driver. The area of the multi-bit DAC depends on the decoder configuration.

There is known a technique of exploiting an interpolation technique (interpolation amplifier) to reduce the number of reference voltages as well as the number of switch transistors in a decoder configuration. The related technique of this sort is disclosed for example in Patent Document 1 (JP Patent Kokai Publication No. JP2006-174180A), and is shown herein as FIGS. 31A and 31B corresponding to FIGS. 8 and 9 of the Patent Document 1, respectively.

A differential amplifier functioning as an interpolation amplifier which outputs a voltage (Vout={V(T1)+V(T2)/2}) which is obtained by interpolating (internally divides) voltages V(T1) and V(T2) at two terminals T1 and T2 at e.g., 1:1, such a method that yields an multi-value output using a smaller number of reference voltages has so far been proposed.

In FIG. 31A, linear 9 levels at the maximum may be output using four reference voltages A to D. 8 levels may be associated with 3-bit digital data D2 to D0, where D0 is the LSB (Least Significant Bit) and D2 is an MSB (Most Significant Bit).

In FIG. 31B, linear 17 levels at the maximum may be output using four reference voltages A to F. 16 levels may be associated with 4-bit digital data D3 to D0, where D0 is the LSB (Least Significant Bit) and D3 is an MSB (Most Significant Bit).

In the above Patent Document 1, there is disclosed a configuration in which the decoder area may be reduced by reducing the number of the reference voltages. However, the configuration of the decoder that reduces the number of the switch elements that select the reference voltages is not disclosed. The area of a digital analog converter, abbreviated below to DAC, significantly depends on the decoder configuration.

In FIG. 31B, there is a plurality of combinations of two voltages that may be selected with specified voltage levels. There are cases where, depending on the combinations of the two voltages, the DNL (Differential Non-Linearity) of the DAC including the decoder is deteriorated.

FIG. 32 depicts a configuration disclosed in Patent Document 2 (JP Patent Kokai Publication No. JP2009-213132A). Referring to FIG. 32, which corresponds to FIG. 1 of Patent Document 2, this DAC includes a plurality of reference voltages, a decoder 910 including first to (3S+1)th sub-decoders 911-1 to 911-(3S+1) and a sub-decoder 913, and an interpolation amplifier 930. The number of the reference voltages is (3h×S+1), at the maximum, where S is a power of 2 (1, 2, 4, . . . ), an index j is 1, 2, . . . , h, where h is an integer not less than 2. The plurality of reference voltages compose a reference voltage ensemble 920 output from a reference voltage generation circuit, not shown. In addition, the plurality of reference voltages are classed into a first reference voltage group 920-1, a second reference voltage group 920-2, . . . and a (3S+1)th reference voltage group 920-(3S+1). The first reference voltage group 920-1 may include (3S+1) reference voltage groups (Vr{(3S×(j−1)+1)}), the second reference voltage group 920-2 may include (Vt{(3S)×(j−1)+2}) reference voltage groups and the (3S+1)th reference voltage group may include (Vt{(3S)×(j−1)+(3S+1)}. Vr(3jS+1)) reference voltage groups. The first to (3S+1)th sub-decoders 911-1 to 911-(3S+1) are able to select each one reference voltage for each of the first to the (3S+1)th reference voltage groups in response to a first bit group (D(m−1), . . . Dn, (D(m−1)B, . . . DnB) of an m-number of bits. The sub-decoder 913 selects and outputs two voltages V(T1) and V(T2), inclusive of overlaps, from (3S+1) or less reference voltages as selected by the first sub-decoder 911-1, to the (3S+1)th sub-decoder 911-(3S+1) in response to a second bit group (D(n−1), (D(n−1) B, . . . Dn0) of the m-number of bits. The interpolation amplifier 930 interpolates two voltages V(T1) and V(T2), output from the sub-decoder 913, at an interpolation ratio of 1:1. 3×S and 3×j×S are represented as 3S and 3jS only for simplicity of notation.

In FIG. 32, with regard to the specification of FIG. 31A, the reference voltages are classed into (3S+1) groups, where S is a power of 2 inclusive 1, to form a decoder, in order to reduce the number of switch elements.

However, the configuration of FIG. 32 does not meet the specification shown in FIG. 31B.

Only six voltages A to F (reference voltages) supplied to the terminals T1 and T2 are provided for 17 voltage levels that are able to be output from the interpolation amplifier, as shown in FIG. 31B. There are 21 combinations of selecting two voltages from six voltages (reference voltages). Linear outputs of 17-levels are possible by the combinations of the two voltages. Referring to FIG. 31B, the six voltages A to F are set, at 1st, 3rd, 7th, 11th, 15th and 17th output voltage levels, respectively.

In the configuration of FIG. 32, if 8 levels allocated to three-bit digital data (D2, D1, D0), as shown in FIG. 31A, are set as one section, reference voltages A to D are used for the combinations of (V(T1), V(T2)) supplied to the interpolation amplifier 930. The voltages A, B and C are set at the 1st, 3rd and 7th levels in the section and D is set at the first level (9th level) of the next section. There is a potential difference equivalent to two levels between A and B and between C and D, while there is a potential difference equivalent to four levels between B and C. There are eight combinations (V(T1), V(T2)) of two out of the four reference voltages A to D: (A, A), (B, A), (B, B), (C,A), (C, B), (D, B), (C, C) and (D,C), such that, from the interpolation amplifier 930, linear outputs of 8-levels including:

level 1=(A+B)/2;
level 2=(B+A)/2;
level 3=(B+B)/2;
level 4=(C+A)/2;
level 5=(C+B)/2;
level 6=(D+B)/2;
level 7=(C+C)/2; and
level 8=(D+C)/2;

may be output. Regarding the combinations of the two voltages at the level 5, two different combinations of (B, C) and (A, D) are possible. To output eight levels including the 9th to 16th levels for the next section, four reference voltages D, E, F and G are used to provide voltage combinations (V(T1), V(T2)) to be supplied to the interpolation amplifier 930. Out of the four reference voltages D to G, the three voltages D, E and F are respectively set at the 9th, 11th and the 15th levels within the same section, whereas the reference voltage G is set at the first level (17th level) of the next section. From the output of the interpolation amplifier 930, linear outputs of 8-levels including:

level 9=(D+D)/2;
level 10=(E+D)/2;
level 11=(E+E)/2;
level 12=(F+D)/2;
level 13=(F+E)/2;
level 14=(G+E)/2;
level 15=(F+F)/2; and
level 16=(G+F)/2;

may be supplied. The configuration of FIG. 32 is in need of 7 reference voltages A to G for 17 levels and hence is not matched to the specification of FIG. 31B.

[Patent Document 1]

Japanese Patent Kokai Publication No. JP2006-174180A

[Patent Document 2]

Japanese Patent Kokai Publication No. JP2009-213132A

SUMMARY

The following is an analysis of the related techniques.

In the above Patent Document 1, there is disclosed method for selecting reference voltages, in which, by using an interpolation amplifier with an interpolation ratio of 1:1, the number of the reference voltages supplied to the decoder may be reduced (FIGS. 31A and 31B). However, the above Patent Document 1 lacks in the description of a specified configuration of a decoder, by which the number of switch elements that select the reference voltages may be reduced.

In the above Patent Document 2, there is disclosed a decoder configuration matched to the specification of FIG. 31A. However, the Patent Document 2 lacks in the description of the decoder configuration matched to the specification of FIG. 31B. In addition, in the above Patent Document 2, there is a plurality of the combinations of two selectable voltages of specified voltage levels. There may thus be cases where, depending on the combination of the two voltages, the DNL in the DAC including the decoder is deteriorated.

It is therefore an object of the present invention to provide a digital analog conversion circuit comprising a decoder including an interpolation amplifier with an interpolation ratio of 1:1, a data driver including the digital analog conversion circuit and a display device including the digital analog conversion circuit, wherein the decoder is made to reduce the number of switch elements and the number of reference voltages and to reduce an area.

It is another object of the present invention to provide a digital analog conversion circuit, a data driver including the digital analog conversion circuit and a display device including the digital analog conversion circuit, wherein the digital analog conversion circuit is made to prevent DNL from becoming deteriorated in relation to combinations of two voltages selected by the decoder.

To solve at least one of the above mentioned problems, the present invention has substantially the following configuration, but not limited thereto.

According to one aspect of the present invention, there is provided a digital to analog conversion circuit comprising:

a decoder that receives a reference voltage ensemble including a plurality of reference voltages, different each other and m-bit digital data, where m is a predetermined positive integer, and that selects first and second voltages from the reference voltage ensemble, in accordance with the m-bit digital data; and an interpolation circuit that receives the first and second voltages selected by the decoder and interpolate the first and second voltages with an interpolation ratio of 1:1 to generate an interpolated voltage level the plurality of reference voltages of the reference voltage ensemble are classed into first to (z×S+1)th reference voltage groups, where S is an integer which is a power of 2 and includes 1, and z is an integer which is not less than 5 and is represented by a power of 2 plus one. The plurality of reference voltages are mapped in a two-dimensional array with (z×S+1) rows and h columns, h being an integer not less than 2. The first to (z×S+1)th reference voltage groups are allocated respectively to first to (z×+1)th rows of the two-dimensional array, and k-th reference voltage in each of the reference voltage groups, where k is an integer not less then 1 and not greater than h, is allocated to k-th column of the two-dimensional array. An array element of an i-th row and j-th column of the two-dimensional array, where i is an integer not less than 1 and not greater than (z×S+1), and j is an integer not less than 1 and not greater than h, corresponds to {(j−1)×(z×S+i)}th reference voltage.

The decoder may include first to (z×S+1)th sub-decoders provided in association with said first to (z×S+1)th reference voltage groups, respectively, and a (z×S+1) input and two output type sub-decoder.

The first to (z×S+1)th sub-decoders receive a first bit group of the m-bit digital data in common and receive the reference voltages of the first to (z×S+1)th reference voltage groups, respectively. The first to (z×S+1)th sub-decoders select, from among the received reference voltages of the respective first to (z×S+1)th reference voltage groups, respective reference voltages allocated in common to a column of the two-dimensional array, respectively, wherein the column corresponds to a value of said first bit group of said m-bit digital data.

The (z×S+1) input and two output type sub-decoder receives a second bit group of the m-bit digital data and receives outputs of the first to (z×S+1)th sub-decoders and that selects the first and second voltages out of the reference voltages which are selected by the first to (z×S+1)th sub-decoders in accordance with a value of the second bit group of the m-bit digital data.

The reference voltage ensemble may include reference voltages associated with ones of a plurality of voltage levels that are able to be output from the interpolation circuit, wherein with an A-th voltage level being as a reference, the reference voltage ensemble includes, regarding the z and an index number N, z number of reference voltages which are associated with (4×(z−1)×N+A)th voltage level;

(4×(z−1)×N+A+2)th voltage level;

reference voltages, each sequentially spaced apart by four unit levels from the (4×(z−1)×N+A+2)th voltage level, namely a (4×(z−1)×N+A+6)th voltage level, a (4×(z−1)×N+A+10)th voltage level, and up to a (4×(z−1)(N+1)+(A−2)th voltage level;

the index number N being an integer value from 0 to (N'−1), where N' being a predetermined integer not less than 1.

The reference voltage ensemble may further include a reference voltage associated with the (4×(z−1)×N'+A)th voltage level. As a result, the reference voltage ensemble may include in total (z×N'+1) reference voltages, for (4×(z−1)×N'+1) voltage levels, that range from the A-th voltage level to the (4×(z−1)×N'+A)th voltage level and that are able to be output by the interpolation circuit.

The first bit group of the m-bit digital data, supplied in common to the first to (z×S+1)th sub-decoders, may include upper order side (m−n) bits of the m-bit digital data, where n is a positive integer such that m>n>1.

The respective first to (z×S+1)th sub-decoders may select reference voltages allocated to a column of the two-dimensional array, the column associated with the value of the first bit group, the first to (z×S+1)th sub-decoders output the reference voltages, the number of which is equal to or less than (z×S+1).

The (z×S+1) input and two output type sub-decoder may select and output the first and second voltages, out of the reference voltages selected by the first to (z×S+1)th sub-decoders, in accordance with a value of the second bit group which includes lower order side n bits of the m-bit digital data.

According to the present invention, the first to (z×S+1)th sub-decoders may decode in an order from the lower order bit side towards the higher order bit side of the upper order side (m−n) bits.

In one of modes according to the present invention, with z being equal to 5 and with the A-th voltage level as a reference, the reference voltage ensemble includes, for the index number N, five reference voltages associated with:

a (16×N+A)th voltage level, a (16×N+A+2)th voltage level; and reference voltages spaced apart each by four levels from the (16×N+A+2)th voltage level, namely a (16×N+A+6)th voltage level, a (16×N+A+10)th voltage level, and a (16×N+A+14)th voltage level, the N taking a value from 0 to (N'−1), N' being an integer not less than 1, and the reference voltage ensemble further including a reference voltage associated with the (16×N'+A)th output voltage level.

The reference voltage ensemble may include in total (5N'+1) reference voltages, for (16×N'+1) voltage levels which ranges from the Ath to (16×N'+A)th voltage level and which are able to be output by the interpolation circuit.

In one of modes according to the present invention, N' is expressed by N'=h×S, and the reference voltage ensemble may include (5×h×S+1) reference voltages. It is also possible that N' is 64, the Ath denotes 0th and the m-bit digital data N' is of 10 bits. The reference voltage ensemble may include 321 reference voltages in relation to the 0th to 1024th voltage levels that may be output from the interpolation circuit, totaling to 1025 voltage levels. 1024 of the 1025 voltage levels may be allocated to the 10-bit digital data. The decoder may select the first and second voltages from the 321 reference voltages in response to the 10-bit digital data. The interpolation circuit outputs one out of the 1024 voltage levels from the interpolation circuit in response to the first and second voltages selected.

In one of modes according to the present invention, with the z being equal to 9 and with the A-th voltage level as a reference, the reference voltage ensemble includes, for the index number N, nine reference voltages associated with a (32×N+A)th voltage level, a (32×N+A+2)th voltage level; and reference voltages spaced apart each by four levels from the (32×N+A+2)th voltage level, namely a (32×N+A+6)th voltage level, a (32×N+A+10)th voltage level, a (32×N+A+14)th voltage level;

a (32×N+A+18)th voltage level, a (32×N+A+22)th voltage level;

a (32×N+A+26)th voltage level; and a (32×N+A+30)th voltage level;

the N taking a value from 0 to (N'−1), N' being a predetermined integer not less than 1 and the reference voltage ensemble further includes a reference voltage associated with the (32×N'+A)th output voltage level.

The reference voltage ensemble may include in total (9N'+1) reference voltages, for (32×N'+1) voltage levels that range from the A-th to (32×N'+A)th voltage levels and that are able to be output from the interpolation circuit.

In one of modes according to the present invention, N' is expressed by N'=h×S, and the reference voltage ensemble may include (9×h×S+1) reference voltages. It is also possible that N' is 32, the Ath denotes 0th and the m-bit digital data N' is of 10 bits. The reference voltage ensemble may include 289 reference voltages in relation to the 0th to 1024th voltage levels that may be output from the interpolation circuit, totaling to 1025 voltage levels. 1024 of the 1025 voltage levels may be allocated to the 10-bit digital data. The decoder may select the first and second voltages from the 289 reference voltages in response to the 10-bit digital data. The interpolation circuit may output one out of the 1024 voltage levels from the interpolation circuit in response to the first and second voltages selected.

In one of modes according to the present invention, with an Ath voltage level as a reference, the reference voltage ensemble may include, in case the z is 17, and in relation to an index N, 17 reference voltages associated with a (64×N+A)th voltage level, a (64×N+A+2)th voltage level and reference voltages spaced apart each by four levels from the (64×N+A+2)th voltage level, namely, a (64×N+A+6)th voltage level, a (64×N+A+10)th voltage level, a (64×N+A+14)th voltage level, a (64×N+A+18)th voltage level, a (64×N+A+22)th voltage level, a (64×N+A+26)th voltage level, a (64×N+A+30)th voltage level, a (64×N+A+34)th voltage level, a (64×N+A+38)th voltage level, a (64×N+A+42)th voltage level, a (64×N+A+46)th voltage level, a (64×N+A+50)nd voltage level, a (64×N+A+54)th voltage level, a (64×N+A+58)th voltage level and a (64×N+A+62)th voltage level. N may take a value from 0 to (N'−1), N' being an integer not less than 1. The reference voltage ensemble may further include a reference voltage associated with the (64×N'+A)th output voltage level. The reference voltage ensemble may include (17N'+1) reference voltages, for (64×N'+1) output voltage levels ranging from the Ath to the (64×N'+A)th voltage levels.

In one of modes according to the present invention, N' is expressed by N'=h×S, and the reference voltage ensemble may include (17×h×S+1) reference voltages. N' may be 16, the Ath may denote 0th and the m-bit digital data N' may be of 10 bits. The reference voltage ensemble may include 273 reference voltages in relation to the 0th to 1024th voltage levels, totaling to 1025 voltage levels, which may be output from the interpolation circuit. 1024 of the 1025 voltage levels may be allocated to the 10-bit digital data. The decoder may select the first and second voltages from the 273 reference voltages in response to the 10-bit digital data. The interpolation circuit may output one out of the 1024 voltage levels from the interpolation circuit in response to the first and second voltages selected.

The digital to analog conversion circuit according to the present invention may further comprise at least one other reference voltage ensemble including a plurality of reference voltages corresponding to output level ranges different from the output level range prescribed by the first to (z×S+1)th reference voltage group. The digital to analog conversion circuit according to the present invention may further comprise another decoder that receives reference voltages of the other reference voltage ensemble to select and output third and fourth voltages in response to the m-bit digital data. The another decoder may include an output node for outputting the third voltage, connected in common with an output node of the decoder for outputting the first voltage, and another output node for outputting the fourth voltage, connected in common with another output node of the decoder for outputting the second voltage The interpolation circuit on receiving the third and fourth voltages may output a voltage level which is an interpolation of the third and fourth voltages at an interpolation ratio of 1:1.

In one of modes according to the present invention, in case there are a plurality of combinations of the first and second voltages, associated with a single voltage level in the ordering of voltage levels output from the interpolation circuit, the first and second voltages being those selected by the (z×S+1) input and two output type sub-decoder out of the reference voltages selected by the first to (z×S+1)th decoders and transmitted to the interpolation circuit, the digital to analog conversion circuit is so configured that the difference between the first voltage/second voltage level difference for the single voltage level and the first voltage/second voltage level difference for a voltage level neighboring to the single voltage level in the ordering will be equal to or less than 37.5% of the maximum value of the level difference of the selectable combination of the first and second voltages.

In one of modes according to the present invention, in case there are a plurality of combinations of the first and second voltages, associated with a single voltage level in the ordering of voltage levels output from the interpolation circuit, the first and second voltages being those selected by the (z×S+1) input and two output type sub-decoder out of the reference voltages selected by the first to (z×S+1)th decoders and transmitted to the interpolation circuit, the digital to analog conversion circuit is so configured that the difference between the first voltage/second voltage level difference for the single voltage level and the first voltage/second voltage level difference for a voltage level neighboring to the single voltage level in the ordering will be equal to or less than six levels.

In one of modes according to the present invention, there is also provided a data driver provided with the digital to analog conversion circuit that receives an input digital signal corresponding to an input video signal to output a voltage associated with the input digital signal. The data driver drives a data line associated with the input video signal.

In one of modes according to the present invention, there is further provided a display device having a unit pixel, composed of a pixel switch and a display element at a location of intersection of a data line and a scan line. A signal on the data line is written in the display element via a pixel switch turned on by the scan line. The display device may include the data driver as defined above as a data driver driving the data line. According to the present invention, the display element may include a liquid crystal element or an organic EL element.

According to the present invention, a DAC, a decoder, a driver and a display device may be provided in which not only the number of the reference voltages and the switch elements but also a chip area may be reduced. In addition, according to the present invention, a DAC, a decoder, a driver and a display device may be provided in which combinations of two voltages by the decoder may be set such as to prevent the DNL from becoming worsened.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a diagram showing the relationship between voltage level that may be output in FIG. 1 and the reference voltages.

FIG. 3 is a diagram showing a reference voltage ensemble and the ordering of the reference voltages in the reference voltage ensemble.

FIG. 4 is a diagram showing a first specification of the Exemplary Embodiment 1 of FIG. 1 of the present invention.

FIG. 11 is a diagram showing a second specification of the exemplary embodiment 1 of FIG. 1 of the present invention.

FIG. 17 is a diagram showing a third specification of the exemplary embodiment of the present invention shown in FIG. 1.

FIG. 22A is a diagram showing the number of transistor switches of a Comparative Example.

FIG. 22B is a diagram showing the number of transistor switches of a decoder of the present invention.

FIG. 24 is a diagram showing the relationship between the V(T1)-V(T2) combinations and the V(T1)-V(T2) level differences as associated with the voltage levels in the specification of z=5.

FIGS. 25A and 25B are graphs illustrating changes in the output levels and in the V(T1)-V(T2) level differences for the specification of z=5, in which FIG. 25A shows the case where changes in the output levels are 6 levels or less and FIG. 25B shows the case where changes in the output levels exceed 6 levels.

FIG. 26 is a diagram showing the relationship between the V(T1)-V(T2) combinations and the V(T1)-V(T2) level differences as associated with the voltage levels in the specification of z=9.

FIG. 27 is a diagram showing the relationship between the V(T1)-V(T2) combinations and the V(T1)-V(T2) level differences as associated with the voltage levels in the specification of z=17.

FIGS. 31A and 31B are diagrams corresponding to views appearing in Patent Document 1.

PREFERRED MODES

Figure 1:
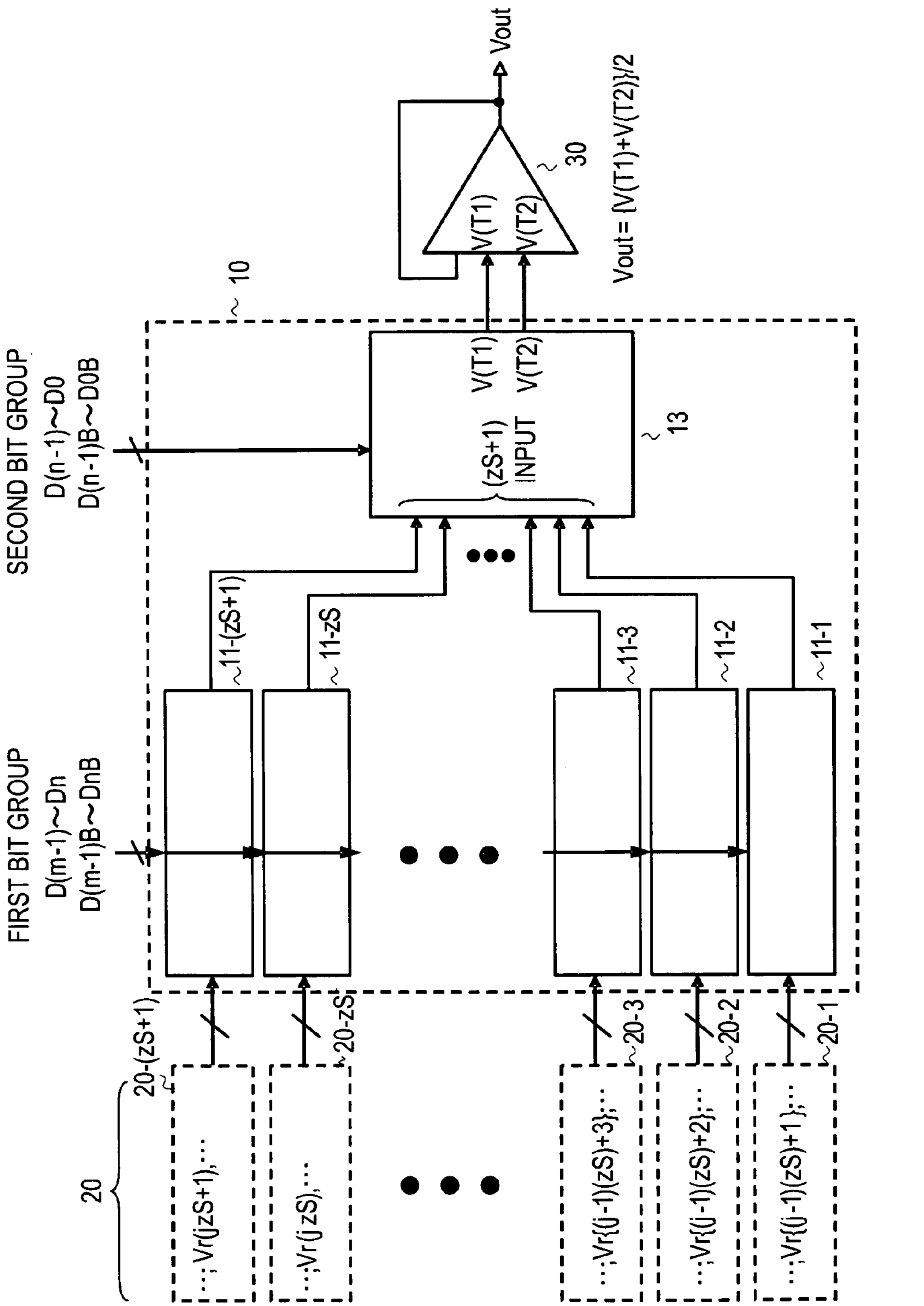
FIG. 1 is a block diagram showing a configuration of an Exemplary Embodiment 1 of the present invention.
Figure 29:
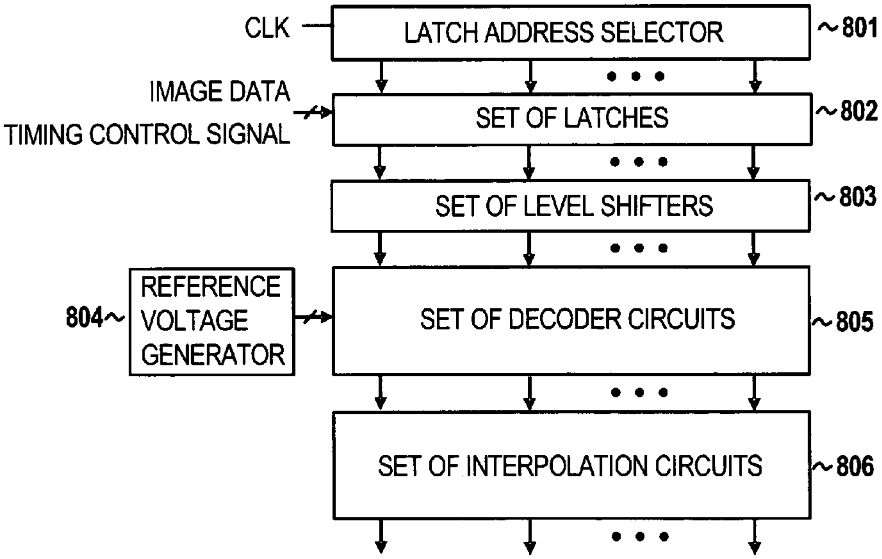
FIG. 29 is a block diagram showing a configuration of a data driver of an exemplary embodiment 3 according to the present invention.

The following describes exemplary embodiments. Referring to FIG. 1, a digital analog conversion circuit (DAC) according to one of exemplary embodiments includes a reference voltage ensemble 20, a decoder 10 having first to (zS+1) sub-decoders 11-1 to 11-(zS+1) and a sub-decoder 13, and an interpolation circuit 30. The reference voltage ensemble 20 is output from a reference voltage generator, not shown. The reference voltage generator is shown as a reference voltage generator 804 in FIG. 29 which will be described later. Referring to FIG. 29, a set of decoder circuits 805 is equivalent to the decoder (set of decoders) 10 of FIG. 1. In the following description, z×S is represented as zS for simplicity of notation.

The reference voltage ensemble 20 includes a plurality of reference voltages which differ each other and are ordered. The plurality of reference voltages are classed in (ZS+1) reference voltage groups (20-1 to 20-(zs+1)), where S is a power of 2 inclusive of 1, viz., 1, 2, 4, . . . and z is an integer which is a power of 2 plus 1 and which is not less than 5, viz., 5, 9, 17, . . . .

The first reference voltage group 20-1 includes a {(j−1)(zS)+1}th reference voltage Vr{(j−1)(zS)+1}, where the index j may assume 1, 2, . . . , and h, h being an integer not less than 2. Specifically, when the index j assumes 1 to h, the first reference voltage group 20-1 includes reference voltages spaced apart from one another, by zS, viz., Vr{1}, Vr{(zS)+1}, Vr{(2zS)+1}, . . . , Vr{(h−1)zS)+1}.

In the following description, (j−1)×(z×S), 2×(z×S) and so forth are represented by (j−1)(zS), 2(zS) and so forth only for simplicity of notation.

The second reference voltage group 20-2 includes a {(j−1)(zS)+2}th reference voltage Vr{(j−1)(zS)+2}. Specifically, when the index j assumes 1 to h, the first reference voltage group 20-2 includes reference voltages spaced apart from one another by (zS), viz., Vr{2}, Vr{(zS)+2}, Vr{2(zS)+2}, . . . , Vr(h−1)(zS)+2}.

The third reference voltage group 20-3 includes {(j−1)(zS)+3}th reference voltage Vr{(j−1)(zS)+3}. Specifically, when the index j assumes the total of 1 to h, the third reference voltage group 20-3 includes reference voltages spaced apart from one another by (zS), viz., Vr{3}, Vr{(zS)+3}, Vr{2(zS)+3}, . . . , Vr(h−1)(zS)+3}. In similar manner, the (zS+1)th reference voltage group 20-(zS+1) includes a {(j−1)(zS)+(zS+1)}th, viz., (jzS+1)th, reference voltage Vr{(j−1)(zS)+(zS+1)}=Vr(jzS+1). Specifically, when the index j assumes the total of 1 to h, the (zS+1)th reference voltage group 20-(zS+1) includes reference voltages spaced apart from one another by (zS), viz., Vr{zS+1}, Vr{2(zS)+1}, Vr{3(zS)+1}, . . . , Vr{h(zS)+1}. In the following description, h×(z×S) is sometimes represented by hzS only for simplicity of notation.

In case the index j assumes 1 to h, the reference voltage ensemble 20 includes a (hzS+1)-number of respective different reference voltages. If a part of reference voltages are absent, there are cases where the corresponding indices are correspondingly absent.

Each of the first to (zS+1)th sub-decoders 11-1 to 11-(zS+1) is able to select one reference voltage from one corresponding reference voltage group of the first to (zs+1)th reference voltage groups 20-1 to 20-(zS+1), in response to the value of the first bit group (D(m−1) to Dn, D(m−1)B to DnB) on the higher order side of the m-bit digital data. D(m−1)B to DnB are complementary signals of the D(m−1) to Dn.

The sub-decoder 13, in response to the values of the low order side second bit group (D(n−1) to D0, D(n−1)B to D0B) of the m-bit digital data, selects and outputs first and second voltages V(T1) and V(T2) out of (zS+1) or less reference voltages, which are selected by the first to (zS+1)th sub-decoders 11-1 to 11-(zS+1).

The interpolation circuit 30 outputs a voltage level {V(T1)+V(T2)}/2, obtained on interpolation by 1:1 of the first voltage V(T1) and the second voltage V(T2) output from the sub-decoder 13.

The reference voltages from Vr1 to Vr{h(zS)+1} of the reference voltage ensemble 20 are voltage levels different each other, and the voltage levels of VrX where X is 1 to (hZS+1) denotes voltage levels ordered in the ascending or descending order of X, that is, in the rising or falling order of X.

The interpolation circuit 30 may be any optional interpolation circuit, in which the two voltages V(T1) and V(T2) are interpolated at a ratio of 1:1 in accordance with (Vout={V (T1)+V(T2)}/2), such as one disclosed in Patent Publication 2. For example, an interpolation circuit having two input terminals T1 and T2, and configured for interpolating the input voltages at the input terminals T1 and T2 at a ratio of 1:1, or an interpolation circuit that performs the similar operation, may be used. Such an interpolation circuit in which voltages V(T1) and V(T2) are supplied to the single input terminal at different timings to interpolate the voltages V(T1) and V(T2) at a ratio of 1:1 may also be used.

The first to the (zS+1)th sub-decoders 11-1 to 11-(zS+1) receive the first bit group (D(m−1) to Dn, D(m−1)B to DnB) in common for selection. The zS+1-number or less reference voltages, selected by the sub-decoders 11-1 to 11-(zS+1), represent reference voltages different in voltage levels and consecutive in sequences in the reference voltage ensemble 20.

In case the reference voltage Vr{(j−1)(zS)+1} is selected by the first sub-decoder 11-1, the second sub-decoder 11-2 selects the reference voltage Vr{(j−1)(zS)+2}, the third sub-decoder 11-3 selects the reference voltage Vr{(j−1)(zS)+3} and so on until the (zS+1)th sub-decoder 11-(zS+1) selects the reference voltage Vr{(j−1)(zS)+(zS+1)=Vr(jZS+1)}.

The relationship between the reference voltages belonging to the reference voltage ensemble 20 of FIG. 1 and the voltage levels that may be output from the interpolation circuit 30 will now be described.

FIG. 2 shows the relationship between the voltage levels of FIG. 1 and the reference voltages VrX. Referring to FIG. 2, the voltage levels that may be output from the interpolation circuit 30 are (4(z−1)N'+1) consecutive voltage levels from the Ath voltage level up to the (4(z−1)N'+A)th voltage level. At this time, an optional Ath voltage level of an optional gradated reference voltage ensemble is taken as a reference. The symbol z represents an integer not less than 5 and that is equal to power of 2 plus 1, viz., 5, 9, 17, . . . , as above. 4(z−1)N' above represents 4×(z−1)×N'. The reference number of the Ath reference voltage may be 0 or 1 in correspondence with an output voltage level 0 or 1, or may be any number corresponding to another different voltage level.

If the Ath voltage level is a reference, and a symbol z as well as an index N is used, the reference voltages of the reference voltage ensemble 20 are allocated in the voltage levels of FIG. 2 such that the (4(z−1)N+A)th is allocated to Vr(zN+1);

the (4(z−1)N+A+2)th, spaced apart by two levels from the {4(z−1)N+A}th, is allocated to Vr(zN+2); and each of the reference voltages, spaced apart by 4 levels from the (4(z−1)N+A+2)th, namely the (4(z−1)N+A+6) the reference voltage is allocated to Vr(zN+3);

the (4(z−1)N+A+10)th is allocated to Vr(zN+4); and the (4(z−1)(N+1)+(A−2))nd is allocated to Vr(z(N+1)).

The index N sequentially assumes values of 0 to (N'−1), where N' is an integer not less than 1, and z reference voltages are allocated to the respective values of the index N.

Further, the (4(z−1)N'+A)th is allocated to Vr(zN'+1).

Namely, (zN'+1) reference voltages are allocated to the Ath to the (4(z−1)N'+A)th voltage levels, totaling to (4(z−1)N'+1)) voltage levels, which may be output from the interpolation circuit 30.

Specifically, the reference voltages associated with the index N=0 are allocated as follows:

The Ath is allocated to Vr1;

the (2+A)th is allocated to Vr2;

the (6+A)th is allocated to Vr3;

the (10+A)th is allocated to Vr4, . . . , and the (4(z−1)+A−2)th is allocated to Vr(z).

The reference voltages associated with the index N=1 are allocated as follows:

the (4(z−1)+A)th is allocated to Vr(z+1), the (4(z−1)+A+2)th is allocated to Vr(z+2), the (4(z−1)+A+4)th is allocated to Vr(r+3) . . . , and the (4(z−1)×2+A−2)th is allocated to Vr(2z).

The reference voltages associated with the index N=(N'−1) are allocated as follows:

the (4(z−1)(N'−1)+A)th is allocated to Vr(z(N'−1)+1)

the (4(z−1)(N'−1)+A+2)th is allocated to Vr(z(N'−1)+2);

the (4(z−1)(N'−1)+A+6)th is allocated to Vr(z(N'−1)+3);

the (4(z−1)(N'−1)+A+10)th is allocated to Vr(z(N'−1)+4) . . . , and the (4(z−1)N'+(A−2))th is allocated to Vr(zN').

Further, the (4(z−1)N'+A)th is allocated to Vr(zN'+1).

Consecutive 4×(z−1) voltage levels from the (4(z−1)N+A)th down to the (4(z−1)(N+1)+A−1)th, as shown in FIG. 2, represent one section. Each section then has z reference voltages. There are N' sections corresponding to the indices N=0 to (N'−1), the first (4(z−1)N'+A)th voltage level of the section next following the section of the index N=(N'−1), and the reference voltage Vr(zN'+1) correlated thereto.

The 4×(z−1) voltage levels of each section are output from the interpolation circuit 30 based on the voltages V(T1) and V(T2), selected from the z reference voltages in the section and the single reference voltage allocated the most adjacent level of the neighboring section, totaling to (z+1) reference voltages.

The reference voltage Vr(zN'+1) is the same as Vr(hzS+1) of FIG. 1, and N'=h×S. Also, in FIG. 1, the symbol S in e.g., Vr(jzS+1) denotes the number of the above sections each thought of as a collection. Thus, S=1 denotes a collection of one section (4(z−1) voltage level sections) and S=2 denotes a collection of two sections (4(z−1)×2 voltage level sections), while S=4 denotes a collection of four sections (4(z−1)×4 voltage level sections).

The grouping of the reference voltage ensemble 20 of FIG. 1 and the reference voltages selected by the sub-decoders 11-1 to 11-(zS+1) will now be described.

FIG. 3 shows the grouping of the reference voltage ensemble 20 in detail. Referring to FIG. 3, as regards the grouping of the (hzS+1)-number at the maximum of the reference voltages of the reference voltage ensemble 20 of FIG. 1, first to (zS+1)th reference voltage groups (20-1 to 20-(zS+1) of FIG. 1), and the ordering of the reference voltages belonging to each reference voltage group within each reference voltage group, such as (1, 2, . . . , h−1, h)

may be represented by (or mapped to) a two-dimensional array of (zS+1) rows and h columns. The row numbers 1~zS+1 of FIG. 3 correspond to 1 to (zS+1) of the first to (zS+1)th reference voltage groups 20-1 to 20-(zS+1).

The elements of i rows by j columns of the two-dimensional array, where i denotes an integer not less than 1 and not larger than (zS+1), j denotes an integer not less than 1 and not larger than h and h denotes an integer not less than 2, correspond to the reference voltage Vr((j−1) (zS)+i).

Namely, the first reference voltage group 20-1 is made up of reference voltages of the first row of the two-dimensional array, spaced apart from one another by zS, namely, (Vr1, Vr(zS+1), Vr(2zS+1), . . . , and Vr((h−1)(zS)+1)).

Namely, the second reference voltage group 20-2 is made up of reference voltages of the second row of the two-dimensional array, spaced apart from one another by zS, namely, (Vr2, Vr(zS+2), Vr(2zS+2), . . . , and Vr((h−1)(zS)+2)).

The ith reference voltage group 20-*i*, where 1≤i≤(zS+1), is made up of reference voltages of the ith row of the two-dimensional array, spaced apart from one another by zS, namely, (Vr(i), Vr(zS+i), Vr(2zS+i), . . . , and Vr((h−1)(zS)+i)).

The (zS+1)th reference voltage group 20-(zS+1) is made up of reference voltages of the (zS+1)th row of the two-dimensional array, spaced, apart from one another by zS, namely, (Vr(zS+1), Vr(2zS+1), Vr(3zS+1), . . . , and Vr(hzS+1)).

The first to (h−1)th reference voltages in the (zS+1)th reference voltage group 20-(zS+1), namely, the reference voltages allocated to the first to the (h−1)th columns of the (zS+1)th row of the two-dimensional array, are respectively the same as the second to the hth reference voltage in the first reference voltage group 20-1, viz., the reference voltages allocated to the second column to the hth column of the first row of the two-dimensional array.

The columns of the two-dimensional array of FIG. 3 correspond to the values of the first bit group (D(m−1) to Dn, D(m−1)B to DnB)) of the input digital signal of FIG. 1. The reference voltages selected by the first to the (zS+1)th sub-decoders 11-1 to 11-(zS+1) of FIG. 1 are each taken to be the reference voltages allocated to one of the first column to the hth column of FIG. 3 corresponding to the value of the first bit group.

FIGS. 2 and 3 show the relationship of correspondence between the Ath voltage level to the (4(z−1)N'+A)th voltage level, totaling to 4(*z*−1)N'+1 voltage levels, and respectively different reference voltages Vr1 to Vr(hzS+1) (=Vr(zN'+1)), totaling to (hzS+1) reference voltages. It is allowed that a preset number of voltage levels from the Ath voltage level are absent and that a preset number of corresponding reference voltages from Vr1 are also absent.

A preset number of the voltage levels may be absent down to the (4(z−1)N'+A)th voltage level. A preset number of reference voltages down to the Vr(hzS+1), corresponding to the absent voltage levels, may also be absent.

Such absence of reference voltages in the two-dimensional array of FIG. 3 will now be described. It is assumed that, as in the configuration of FIG. 28, as later explained, part of values of the first bit group of the m-bit digital data (D(m−1) to Dn, D(m−1)B to DnB) is configured to select reference voltages of a decoder(s) different from the decoder 10. In such case, the reference voltages corresponding to part of values of the digital data are provided in a reference voltage ensemble(s) different from the reference voltage ensemble 20 of the decoder 10. Hence, there arises absence of part of the reference voltages in the two-dimensional of FIG. 3. In such case, the absent reference voltages desirably occur in terms of a column(s) of the two-dimensional of FIG. 3 as a unit. For example, in case the reference voltages of the first column of the two-dimensional are absent, the reference voltages Vr1 to Vr(zS) will be absent. The reference voltage Vr(zS+1) of the (zS+1)th row first column of the two-dimensional array of FIG. 3 is the same as the reference voltage of the first row second column. The array elements of the (zS+1)th row first column will be absent along with Vr1 to Vr(zS). However, the reference voltage Vr(zS+1) exists as the array elements of the first row second column.

If z=5, for example, the voltage level 'level' and the reference voltage 'Vref' of FIG. 2 correspond to the level and the input of FIG. 31B. If, in FIG. 2, z=5, level A is 1 and N' is 1, Vref of FIG. 2 is Vr1, Vr2, Vr3, Vr4, Vr(z)=Vr5 and Vr(z+1)=Vr6. It may be seen that, if these are labeled A, B, C, D, E and F, respectively, the relationship of correspondence between the voltage level and Vref of FIG. 2 is the same as that between the level and the input of FIG. 31B.

<Exemplary Embodiment 12>

FIG. 4 is a diagram showing, as Exemplary Embodiment 1, a first specification of a DAC in the above mentioned exemplary embodiment shown in FIG. 1. The DAC of FIG. 1 outputs 1024 voltage levels from a 0th level up to the 1023rd level, in response to the 10-bit digital data (m=10). In FIG. 4, 'level' denotes a voltage level that may be output by the interpolation circuit 30, and 'Vref' denotes a reference voltage that is supplied to the decoder 10. The respective reference voltages represent the positions corresponding to the voltage levels associated with the ordering in which the reference voltages are arrayed. 'V(T1) and V(T2)' denote the first and second voltages as selected by the decoder 10 (input voltages to the interpolation circuit 3) and D9 to D0 denote digital data.

The specification of FIG. 4 is adaptation of the conversion specification explained with reference to FIG. 31(B), and corresponds to the specification in which, in FIG. 2, A=0, z=5 and N'=64. The total number of the reference voltages in this case is 321. The symbols S and h may be such that h×S=64 and such that, if S is equal to 1, h=64, if S is equal to 2, h=32 and, if S=2, h=16, and so on.

If, in the specification of FIG. 4, 16 levels compose one section, the total number of the sections is 64. The 16 levels of each section are output from the interpolation circuit 30 of FIG. 1 in response to the voltages V(T1) and V(T2) as selected out of five reference voltages in the section and a single reference voltage allocated to the most adjacent level of the neighboring section, totaling to six reference voltages. The 16 levels in one section are of a substantially linear characteristic. The total number of the reference voltages is 321 in relation to the total number 1024 of the output levels corresponding to the 10-bit digital data. The 1024th level, allocated to the reference voltage Vr321, is not contained in the 1024 output levels.

In FIG. 4, there is shown an specification of outputting 1024 voltage levels from the 0th to the 1023rd levels, totaling to 1024 levels, in relation to the first to the 1024th level, totaling to 1025 voltage levels. However, such an specification in which the first to 1024th level voltages, totaling to 1024 voltage levels, may be output, although the corresponding configuration is not shown. In this case, the specification is such that the 0th level corresponding to the reference voltage Vr1 is not included in the 1024 output levels.

The ordering of the voltage levels or the reference voltages is a ordering of monotonously incrementing or decrementing voltage values in all of the Exemplary Embodiments.

<Configuration of Exemplary Embodiment 1>

Figure 5:
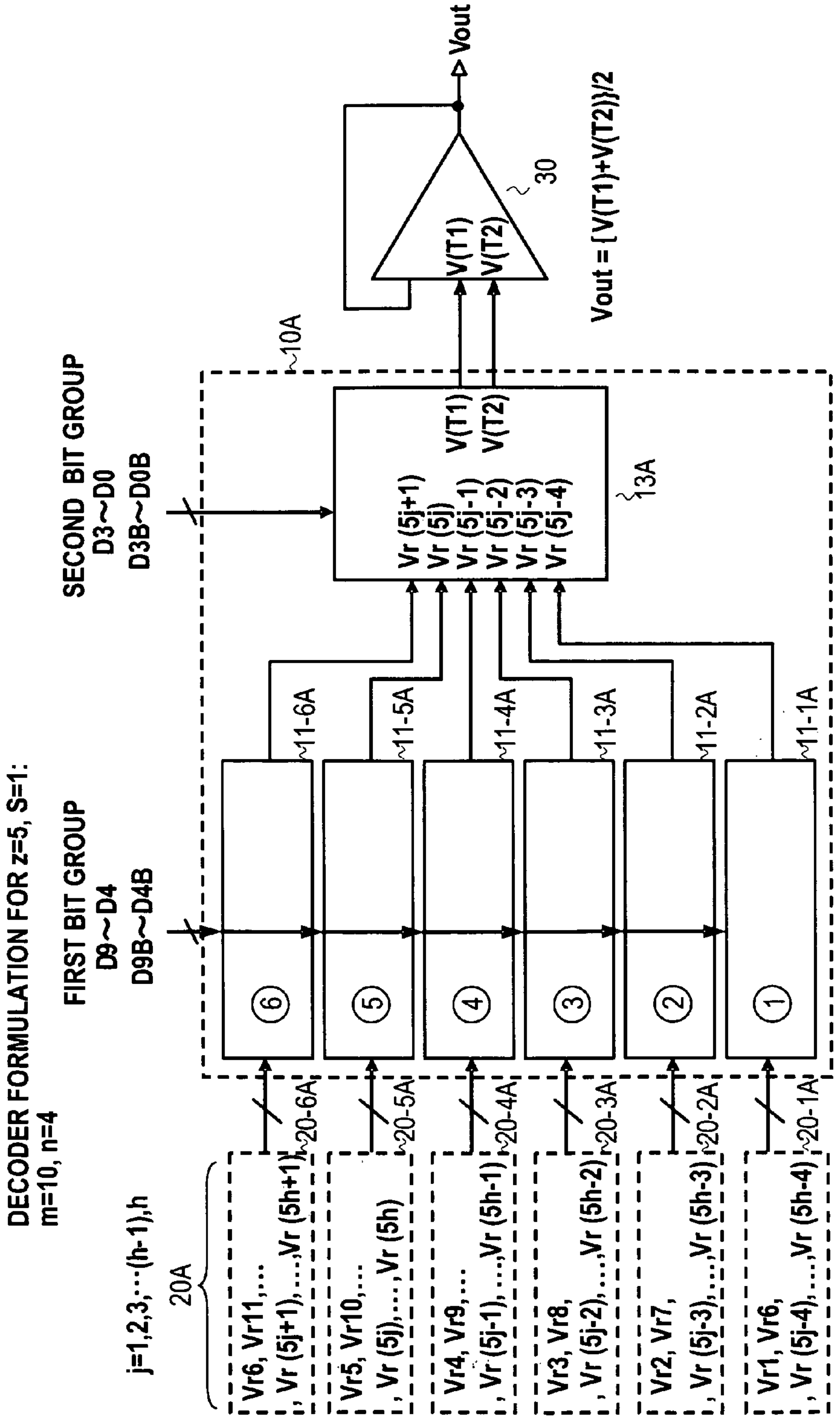
FIG. 5 is a diagram showing a configuration of Example 1 of the present invention associated with the specification of FIG. 4.

FIG. 5 shows a configuration of an Exemplary Embodiment of FIG. 1 which is in correspondence with the specification of FIG. 4. Specifically, FIG. 5 shows a decoder configuration in which, in the exemplary embodiment of FIG. 1, z=5, S=1, m=10 and n=4.

The first bit group D(m−1) to Dn, and D(m−1)B to DnB are made up of D9 to D4, and D9B to D4B. The second bit group D(n−1) to D0, and D(n−1)B to D0B are made up of D3 to D0 and D3B to D0B.

The first to the (zS+1)th sub-decoders 11-1 to 11-(zS+1) of FIG. 1 are composed of (zS+1)=6 sub-decoders, whereas those of FIG. 5 are composed of first to sixth sub-decoders 11-1A to 11-6A.

The first to sixth sub-decoders 11-1A to 11-6A each receives h (=64) reference voltages to select and output a single voltage in response to the first bit group D9 to D4, and D9B to D4B to form a tournament configuration decoder.

The first decoder 11-1A receives a h-number of reference voltages Vr1, Vr6, Vr(5*j*−4), . . . , and Vr(5*h*−4), while the sixth sub-decoder 11-6A receives a h-number of reference voltages Vr6, . . . , Vr(5*j*+1), . . . , and Vr(5*h*+1). Namely, the first decoder 11-1A and the sixth sub-decoder 11-6A receive (h−1)=63 reference voltages in overlapped state, to the exclusion of Vr1 and Vr(5*h*+1). Only sub-decoders 11-1A and 11-6A receive the reference voltages in overlapped state.

In the two-dimensional array of FIG. 3, with (zS+1)=6 rows an h=64 columns, the voltages selected by the first to sixth sub-decoders 11-1A to 11-6A are associated with the reference voltages (Vr(5*j*−4), Vr(5*j*−3), Vr(5*j*−2), Vr(5*j*−1) Vr(5*j*), Vr(5*j*+1)) allocated to a column associated with values of the first bit group (D9 to D4, D9B to D4B). In the above two-dimensional array, z=5, S=1 and h=64. In addition, the voltages selected are also associated with the reference voltages needed to output 16 voltage levels of each section of the specification of FIG. 4.

The sub-decoder 13A selects and outputs V(T1) and V(T2), from the six voltages (Vr(5*j*−4), Vr(5*j*−3), Vr(5*j*−2), Vr(5*j*−1) Vr(5*j*), and Vr(5*j*+1)), as selected by the first to sixth sub-decoders 11-1A to 11-6A, in response to the second bit group D3 to D0, and D3B to D0B.

<Configuration of Sub-Decoder 11A (i=1 to 6)>

Figure 6:
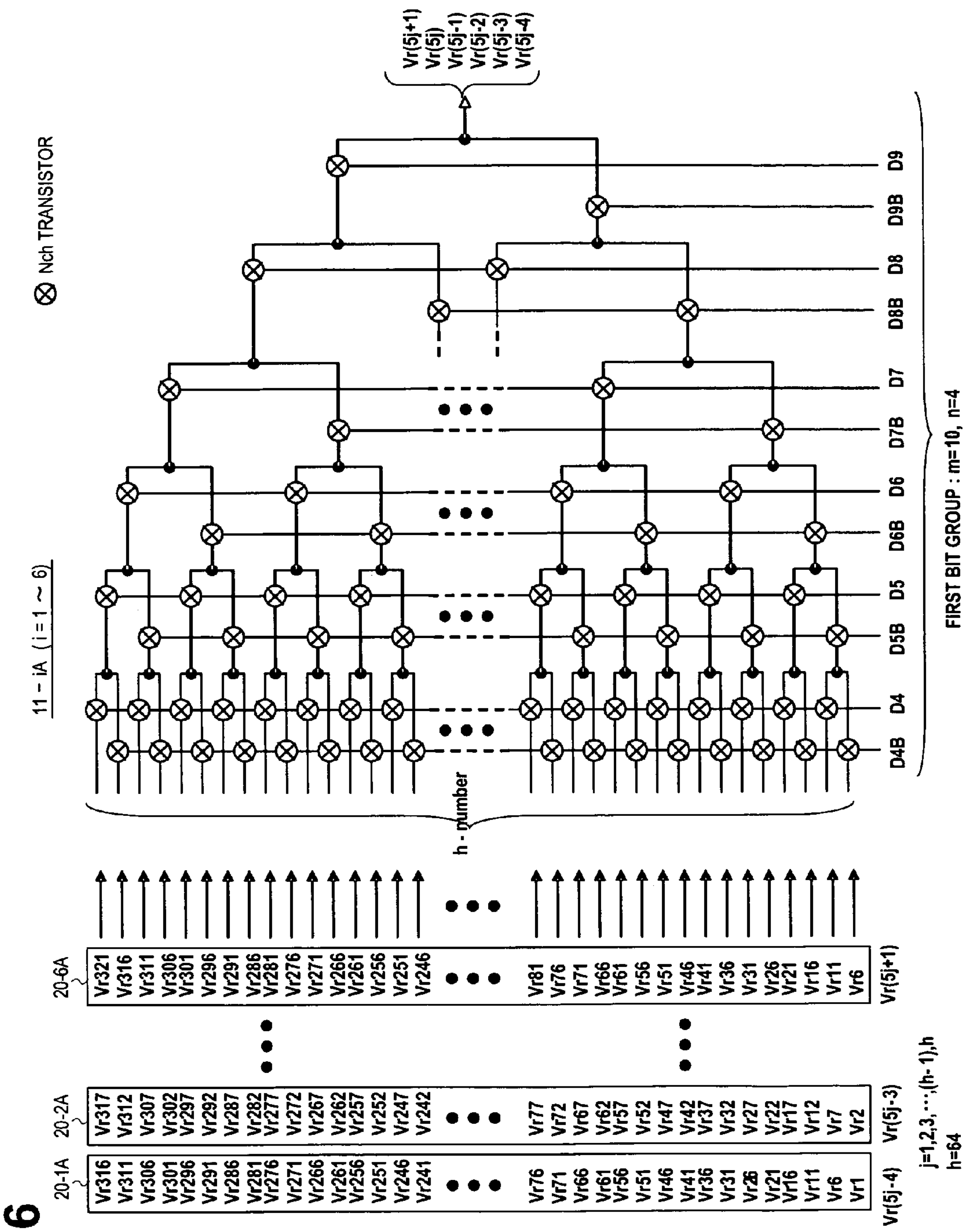
FIG. 6 is a diagram showing a configuration of the sub-decoders 11-1A to 11-6A of FIG. 5.

FIG. 6 shows the configuration of an ith sub-decoder 11-*i*A of FIG. 5, where i=1 to 6. The first to sixth sub-decoders 11-1A to 11-6A differ only as to the sets of the input reference voltages, with the circuit configurations of the sub-decoders being the same. Referring to FIG. 6, the left most reference voltage group 20-1A is supplied to the first sub-decoder 11-A, and the reference voltage group 20-2A is supplied to the second sub-decoder 11-2A. The reference voltage group 20-6A is supplied to the sixth sub-decoder 11-6A. An ith sub-decoder is shown as the sub-decoder. In FIG. 6, the first to sixth sub-decoders 11-*i*A, where i=1 to 6, select the reference voltages Vr, with the ordering j in the associated reference voltage groups, from the first to sixth reference voltage groups 20-1A to 20-6A. The reference voltages Vr, with the ordering j in the associated reference voltage groups, are Vr(5*j*−4), Vr(5*j*−3), Vr(5*j*−2), Vr(5*j*−1) Vr(5*j*), and Vr(5*j*+1).

In FIG. 6, each switch is formed by Nch transistors. In case each switch is formed by a Pch transistor, the Nch transistor of FIG. 6 is replaced by a Pch transistor. In addition, the non-inverting signal and the inverting signal of the digital signal (Dy and DyB), y being such that y=0, 1, . . . , 9, are interchanged.

In FIG. 6, the sub-decoder 11-*i*A (i=1 to 6) receives h (=64) reference voltages, and sequentially selects and outputs one of these reference voltages by the bits in a sequence from the lower order bits (D4, D4B) towards the higher order bits up to (D9, D9B) of the first bit group D9 to D4, and D9A to D4B. The sub-decoder 11-*i*A is thus a tournament configuration switch.

<Configuration of Sub-Decoder 13A>

Figure 7:
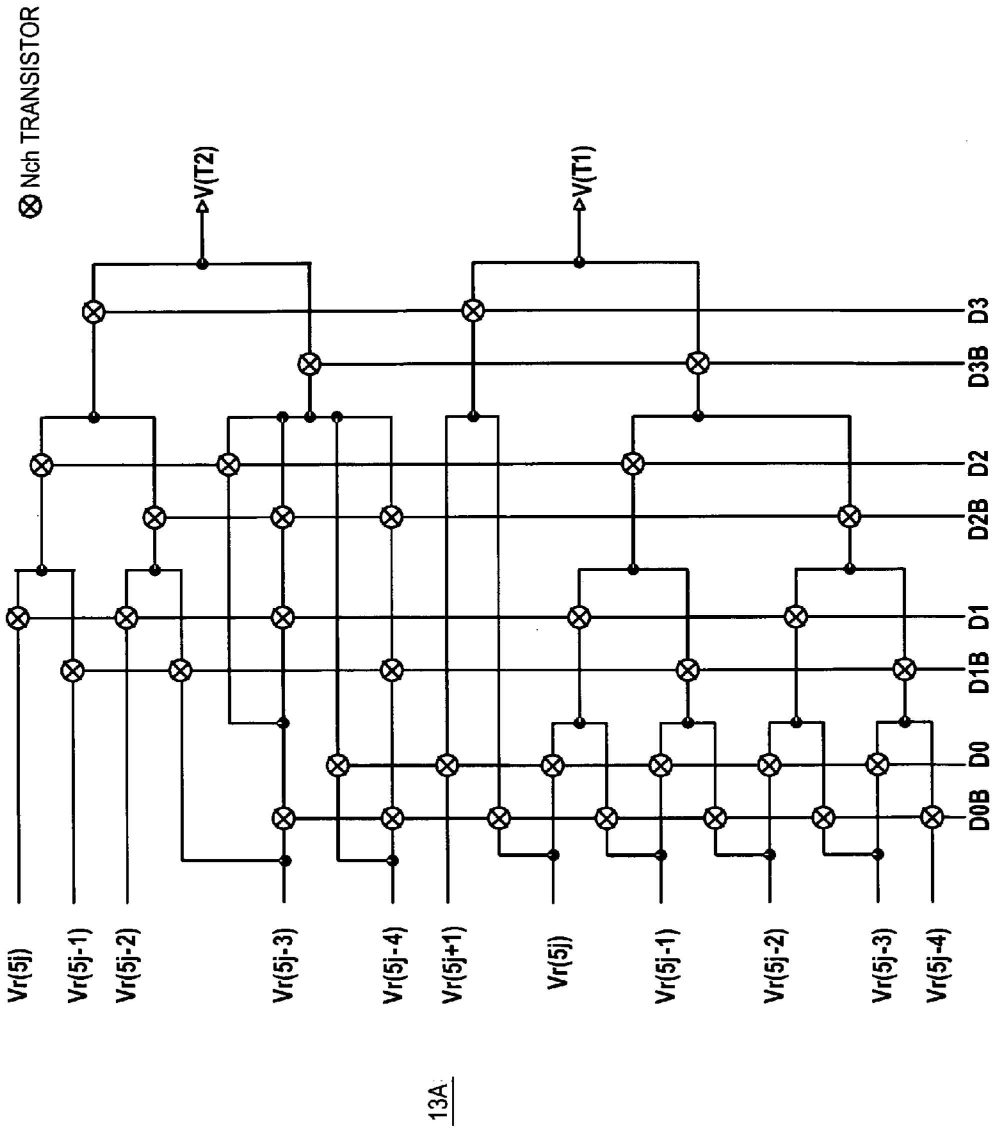
FIG. 7 is a diagram showing a configuration of a sub-decoder 13A of FIG. 5.

FIG. 7 depicts an example configuration of a sub-decoder 13A of FIG. 5. The sub-decoder 13A selects and outputs the voltages V(T1) and V(T2), in response to the second bit group D3 to D0, and D3B to D0B, from the voltages (Vr(5*j*−4), Vr(5*j*−3), Vr(5*j*−2), Vr(5*j*−1) Vr(5*j*), Vr(5*j*+1)) as selected by the sub-decoders 11-1A to 11-6A. The sequence of selection of the lower order four bits D3 to D0, and D3B to D0B is arbitrary. FIG. 7 shows a configuration in which selection is from the lower most bit (D0, D0B) down to (D3, D3B). The relationship of correspondence between the values of the D3 to D0, (D3B to D0B) and the reference voltages selected and output as V(T1) and V(T2) is as shown in the following Table 1.

TABLE 1

| D3D2D1D0 | V(T1) | V(T2) |
|---|---|---|
| 0000 | Vr(5j − 4) | Vr(5j − 4) |
| 0001 | Vr(5j − 3) | Vr(5j − 4) |
| 0010 | Vr(5j − 3) | Vr(5j − 3) |
| 0011 | Vr(5j − 2) | Vr(5j − 4) |
| 0100 | Vr(5j − 2) | Vr(5j − 3) |
| 0101 | Vr(5j − 1) | Vr(5j − 4) |
| 0110 | Vr(5j − 1) | Vr(5j − 3) |
| 0111 | Vr(5j) | Vr(5j − 4) |
| 1000 | Vr(5j) | Vr(5j − 3) |
| 1001 | Vr(5j + 1) | Vr(5j − 3) |
| 1010 | Vr(5j) | Vr(5j − 2) |
| 1011 | Vr(5j + 1) | Vr(5j − 2) |
| 1100 | Vr(5j) | Vr(5j − 1) |
| 1101 | Vr(5j + 1) | Vr(5j − 1) |
| 1110 | Vr(5j) | Vr(5j) |
| 1111 | Vr(5j + 1) | Vr(5j) |

<Exemplary Embodiment 2>

Figure 8:
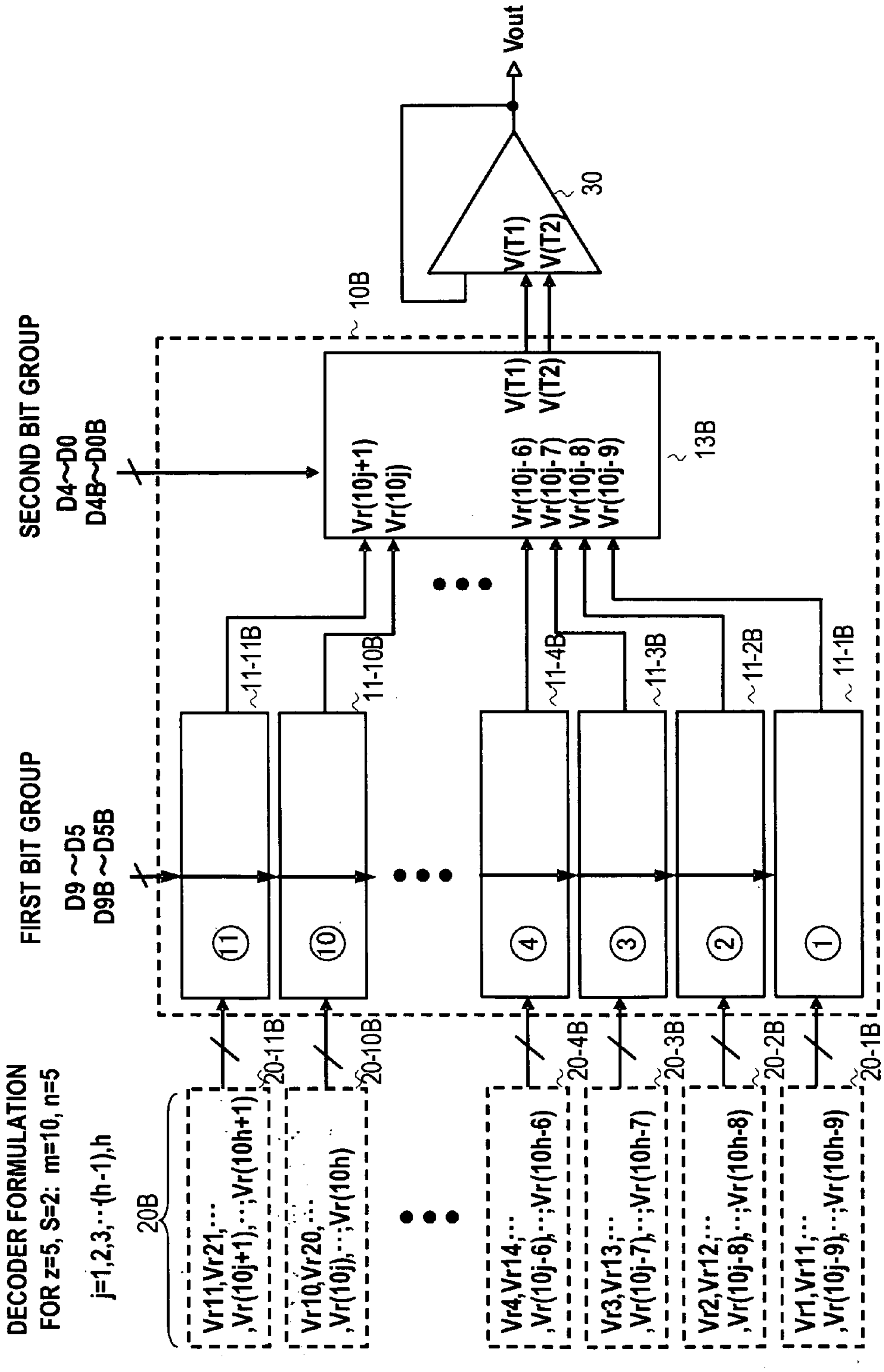
FIG. 8 is a block diagram showing a configuration of a modification of FIG. 5.

FIG. 8 shows the configuration of Exemplary Embodiment 2 which is in correspondence with the specification of FIG. 4. Specifically, FIG. 8 shows a configuration of a decoder in which z, S and m are set, in the exemplary embodiment of FIG. 1, so that z=5, S=2, m=10 and n=5. The first bit group D(m−1) to Dn, and D(m−1)B to DnB are D9 to D5, and D9B to D5B. The second bit group D(n−1) to D0, and D(n−1)B to D0B are D4 to D0 and D4B to D0B.

zS=5×2=10. The first to (zS+1)th reference voltages 20-1 to 20-(zS+1) of FIG. 1 correspond to the first to 11th reference voltage 20-1B~20-11B of FIG. 8, while the first to (zS+1)th sub-decoders 11-1 to 11-(zS+1) correspond to the first to 11th sub-decoders 11-1B to 11-11B of FIG. 8. The first to eleventh sub-decoders 11-1B to 11-11B input h (=32) reference voltages to output a single reference voltage in response to the first bit group D9 to D5, and D9B to D5B. The configuration of FIG. 8 is thus a tournament configuration decoder.

The first to eleventh sub-decoders 11-1B and 11-11B input (h−1)=31 reference voltages, with the exception of Vr1 and Vr(10*h*+1), in an overlapped state. The reference voltages are supplied in this overlapped state only to the first sub-decoder 11-1B and to the 11th sub-decoder 11-11B. The first sub-decoder 11-1B receives Vr1, Vr11, Vr21, . . . , and Vr311 of the reference voltage group 20-1B, while the 11th sub-decoder 11-11B receives Vr11, Vr21, Vr311, and Vr321 of the reference voltage group 20-11B. Vr11, Vr21, . . . , and Vr311 are overlapped.

In the configuration of FIG. 8, the number of overlapped reference voltages is lesser than that of the FIG. 5. Hence, the number of switches that select the overlapping reference voltages is lesser than that of FIG. 5, thus saving the area that might be taken up by the decoder.

The voltages selected by the first to 11th sub-decoders 11-1B to 11-11B correspond to reference voltages allocated to a column associated with the values of the first bit group (D9 to D5, D9B to D5B) of the two-dimensional array of (zS+1)=11 rows and h=32 columns (z=5, S=2 and h=32) of FIG. 3. These reference voltages are {Vr(10*j*−9), Vr(10*j*−8), Vr(10*j*−7), Vr(10*j*−6), Vr(10*j*−5), Vr(10*j*−4), Vr(10*j*−3), Vr(10*j*−2), Vr(10*j*−1), Vr(10*j*), Vr(10+1)}. The voltages selected by the first to 11th sub-decoders also correspond to reference voltages necessary to output the voltage levels of two sections of the specification of FIG. 4.

The sub-decoder 13B selects V(T1) and V(T2), from the voltages selected by the decoder 11-1B to 11-11B, in response to the second bit group D4 to D0, and D4B to D0B to output the so selected V(T1) and V(T2).

<Sub-Decoders 11-*i*B (i=1 to 11)>

Figure 9:
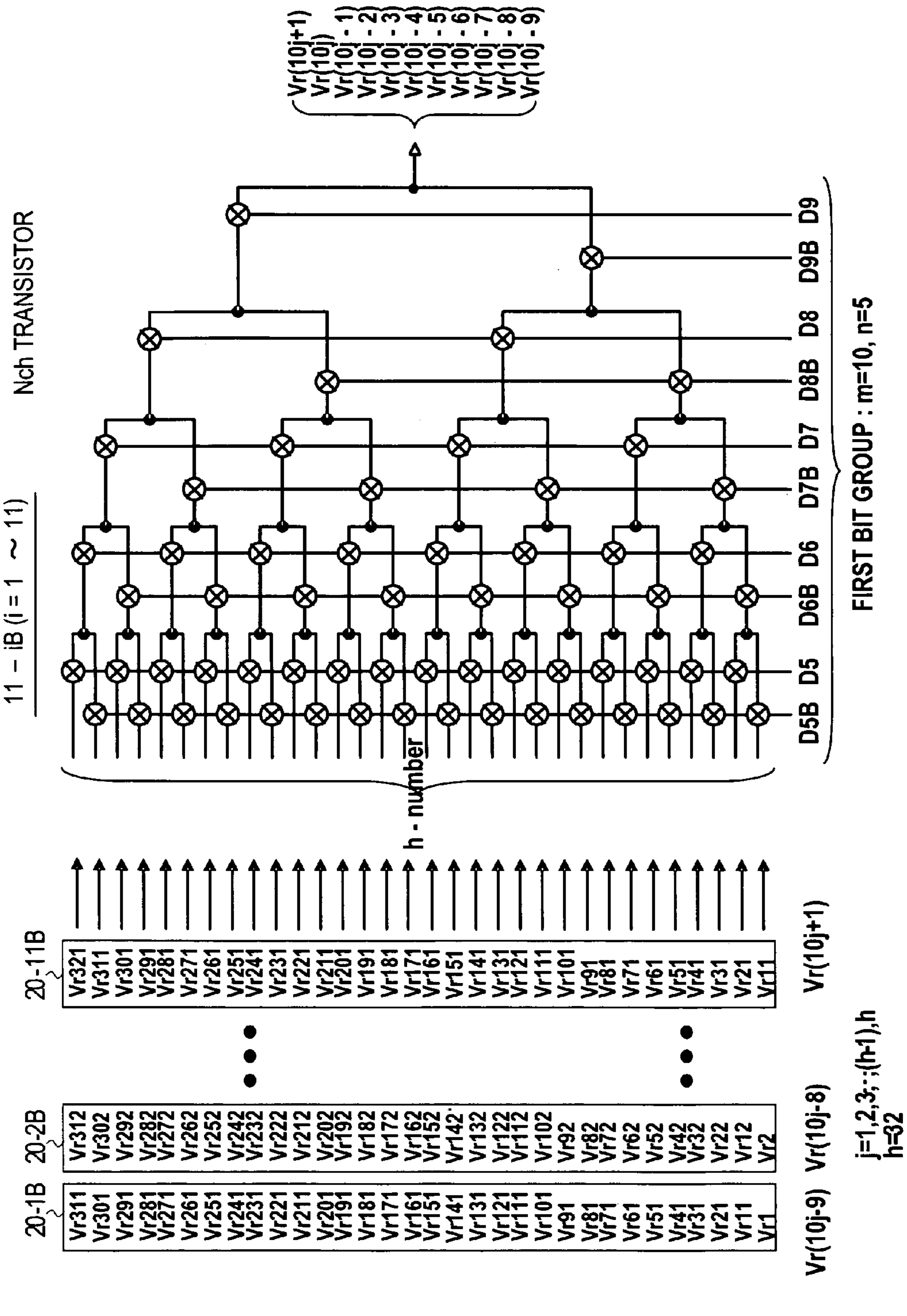
FIG. 9 is a diagram showing a configuration of sub-decoders 11-1B to 11-11B of FIG. 8.

FIG. 9 shows the configuration of the sub-decoder 11-*i*B (i=1 to 11). Specifically, FIG. 9 shows an example configuration in which the sub-decoder 11-*i*B is formed by Nch transistors. In case each switch is formed by a Pch transistor, the Nch transistor of FIG. 9 is replaced by a Pch transistor. In addition, the non-inverting signal and the inverting signal of the digital signal (Dy and DyB) are interchanged.

The first to 11th sub-decoders 11-1B to 11-11B are the same as one another in circuit constitution, except that the sets of the input reference voltages are different. In FIG. 9, the left most reference voltage group 20-1B is supplied to the first sub-decoder 11-1B, while the reference voltage group 20-2B is supplied to the second sub-decoder 11-2B and the reference voltage group 20-11B is supplied to the 11th sub-decoder 11-11B. An ith sub-decoder is shown as a sub-decoder.

The sub-decoder 11-*i*B (i=1 to 11) receives h (=32) reference voltages, and sequentially selects and outputs one of these reference voltages by the bits from the lower order side bits (D5, D5B) of the first bit group (D9 to D5, D9B to D5B) towards the upper order side bits up to (D9, D9B), in a tournament configuration.

In FIG. 9, the first to 11th sub-decoder 11-*i*B (i=1 to 11) select, from the reference voltage groups 20-1B to 20-11B, the reference voltages with the ordering j in the associated reference voltage groups. The reference voltage selected are Vr(10*j*−9), Vr(10*j*−8), Vr(10*j*−7), Vr(10*j*−6), Vr(10*j*−5), Vr(10*j*−4), Vr(10*j*−3), Vr(10*j*−2), Vr(10*j*−1), Vr(10*j*), and Vr(10*j*+1).

<Sub-Decoder 13B>

Figure 10:
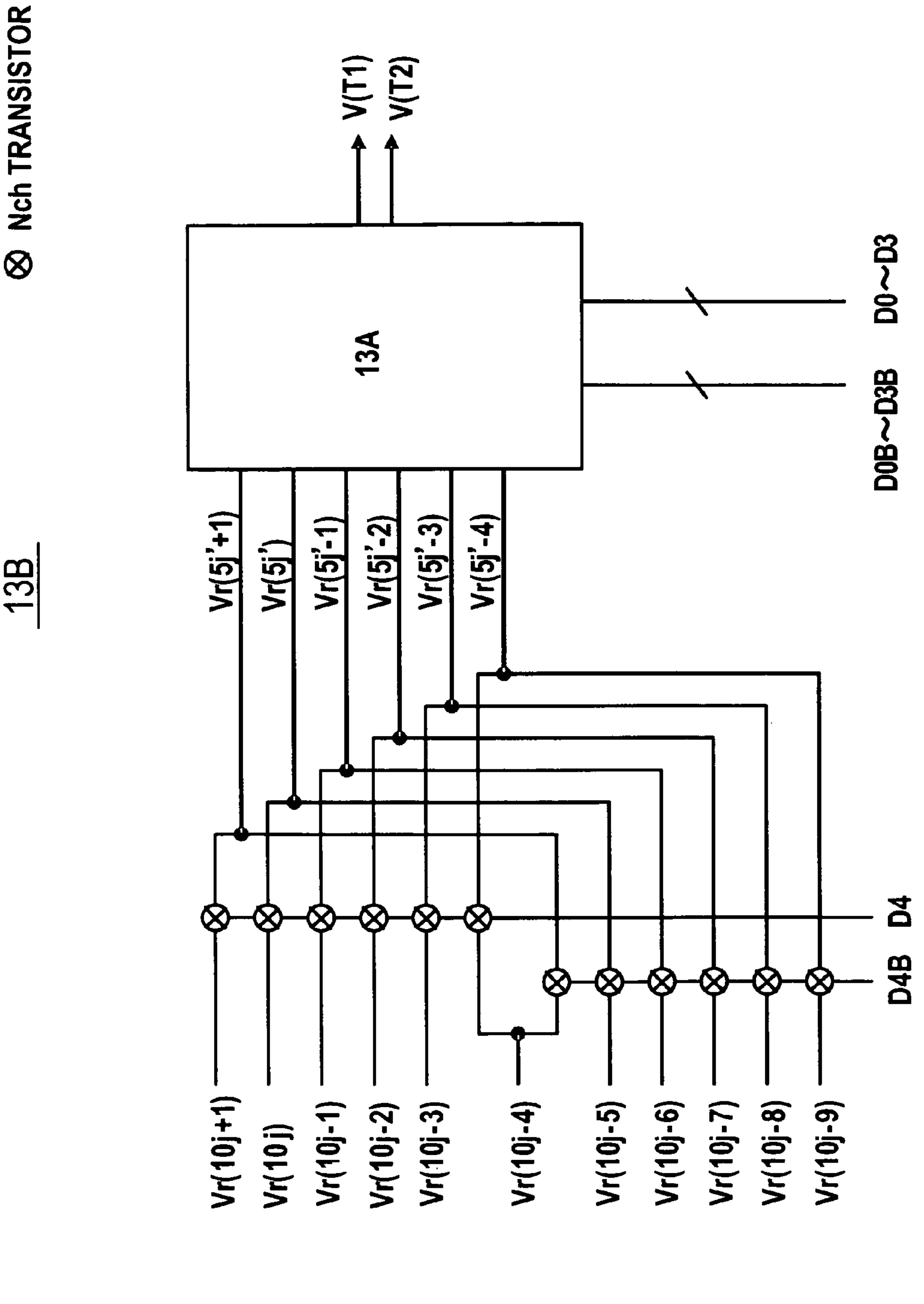
FIG. 10 is a diagram showing a configuration of the sub-decoder 13B of FIG. 8.

FIG. 10 shows an example configuration of the sub-decoder 13B of FIG. 8. The sub-decoder 13B selects and outputs V(T1) and V(T2), in response to the second bit group (D4 to D0, D4B to D0B), from the voltages selected by the first to 11th sub-decoders 11-1B to 11-11B. The voltages selected by the first to 11th sub-decoders are Vr(10*j*-9), Vr(10*j*−8), Vr(10*j*−7), Vr(10*j*−6), Vr(10*j*−5), Vr(10*j*−4), Vr(10*j*−3), Vr(10*j*−2), Vr(10*j*−1), Vr(10*j*), and Vr(10*j*+1).

The sequence of selection of the lower order side 5 bits D4 to D0, D4B to D0B is arbitrary. It is however preferred to select the voltages from the (D4, D4B), as shown in FIG. 10, since the number of transistor switches may then be reduced.

The sub-decoder circuit 13B of FIG. 10 includes a sub-decoder 13A of FIG. 7 and a switch controlled on or off by the bit signals D4B, D4. This switch is the Nch transistor in FIG. 10. The sub-decoder circuit 13B of FIG. 10 selects six voltages from the 11 voltages as selected by the first to 11th sub-decoders 11-1B to 11-11B, The 11 voltages are Vr(10*j*−9), Vr(10*j*−8), Vr(10*j*−7), Vr(10*j*−6), Vr(10*j*−5), Vr(10*j*−4), Vr(10*j*−3), Vr(10*j*−2), Vr(10*j*−1), Vr(10*j*), and Vr(10*j*+1), and the six voltages are (V(5*j*'−4), V(5*j*'−3), V(5*j*'−2), V(5*j*'−1), V(5*j*'), V (5*j*'+1)). The sub-decoder circuit selects, from these six voltages, V(T1) and V(T2), in response to D3 to D0, D3B to D0B, using the above mentioned sub-decoder 13A. When D4=1 (D4B=0), Vr(10*j*−4), Vr(10*j*−3), Vr(10*j*−2), Vr(10*j*−1), Vr(10*j*), Vr(10*j*+1) are selected as the voltages (V(5*j*'−4), V(5*j*'−3), V(5*j*'−2), V(5*j*'−1)V (5*j*'), V(5*j*'+1)). When D4=0 (D4B=1), Vr(10*j*−9), Vr(10*j*−8), Vr(10*j*−7), Vr(10*j*−6), Vr(10*j*−5), and Vr(10*j*−4) are so selected.

The decoder configuration with z=5, S=1, 2 has now been explained with reference to FIGS. 5 to 10. From the configuration of FIG. 5 (z=5, S=1) and that of FIG. 8 (z=5, S=2), which are in correspondence with the specification of FIG. 4, those skilled in the art will readily comprehend how the decoder configuration is changed in case the value of the symbol S is increased (for example, S=4, 8, . . . ). In the present description, explanation of the case of S=4 or higher is dispensed with.

<Exemplary Embodiment 3>

FIG. 11 illustrates a second specification of the DAC of FIG. 1 in which, in the exemplary embodiment, shown in FIG. 1, the 0th to 1023rd levels, totaling to 1024 levels, of voltages are output in response to the 10 bit digital data (m=10). In FIG. 11, as in FIG. 4, 'level' denotes a voltage level that may be output by the interpolation circuit 30, and 'Vref' denotes a reference voltage that is supplied to the decoder 10. The respective reference voltages are represented by the positions corresponding to the voltage levels associated with the ordering of the reference voltages. V(T1) and V(T2) denote the first and second voltages as selected by the decoder 10 (input voltages to the interpolation circuit 3) and D9 to D0 denote digital data. FIG. 11 shows the specification corresponding to that of FIG. 2 where A, z and N' are set so that A=0, z=9 and N'=32. In this case, the total number of the reference voltages is 289. The symbols S and h are set so that h×S=32 and, when S=1, h=32, when S=2, h=16, when S=4, h=8 and so on.

If, in the specification of FIG. 11, 32 levels make up a section, and the total number of the sections is 32. The 32 levels of each section are output from the interpolation circuit 30 of FIG. 1 in response to the voltages V(T1) and V(T2) as selected from the total of ten reference voltages, which are made up of nine reference voltages in the section and a single reference voltage allocated to the most adjacent level of the neighboring section. At this time, the 32 levels in each section exhibit a substantially linear characteristic. FIG. 11 shows an specification of outputting 1024 voltage levels from the 0th to the 1023rd levels, totaling to 1024 levels, in relation to the 0th to the 1024th levels, totaling to 1025 voltage levels. The 1024th level, not contained in the output levels of the interpolation circuit 30, is allocated to the reference voltage Vr289.

Figure 12:
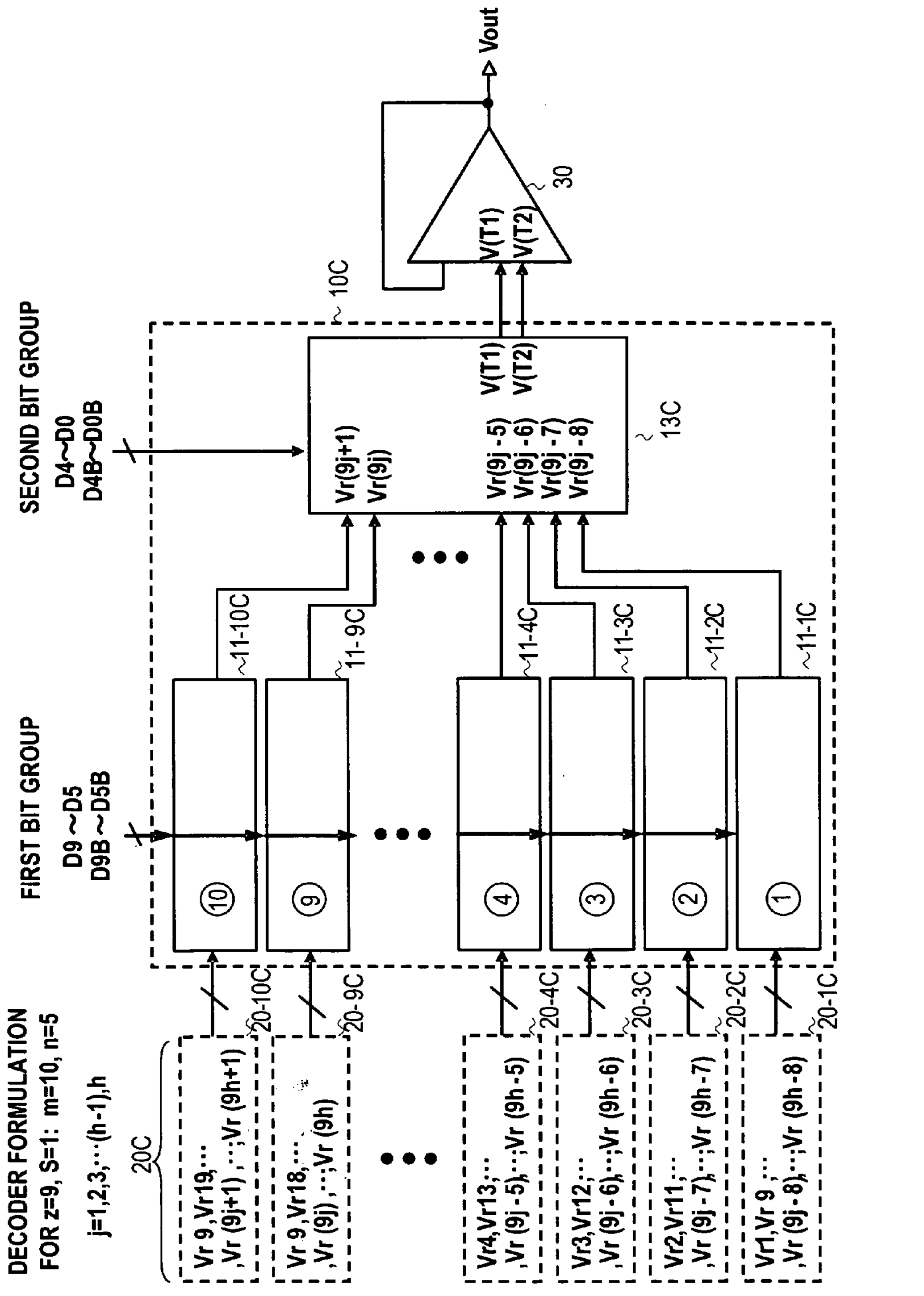
FIG. 12 is a diagram showing a configuration of Example 2 of the present invention, as matched to the specification of FIG. 11.

FIG. 12 shows an example configuration of the Exemplary Embodiment of FIG. 1 associated with the specification of FIG. 11. Specifically, FIG. 12 shows the configuration of the decoder 10C where z=9, S=1, m=10 and n=5. The first bit group D(m−1) to Dn, and D(m−1) to DnB are D9 to D5, and D9B to D5B, while the second bit group D(n−1) to D0 and D(n−1)B to D0B are D4 to D0, and D4B to D0B.

The first to the (zS+1)th sub-decoders 11-1C to 11-10C each input h(=32) reference voltages and, in response to the first bit group (D9 to D5, D9B to D5B), selects and outputs a single voltage. These decoders thus operate as a tournament configuration decoder.

In FIG. 12, the sub-decoder 11-1C and 11-10C receive (h−1)=31 reference voltages, to the exclusion of Vr1 and Vr(9*h*+1), in an overlapped state. The reference voltages are supplied in this overlapped state only to the sub-decoders 11-1C and 11-10C.

In the configuration of FIG. 12, the number of overlapped reference voltages is lesser than that in FIG. 5. Hence, the number of switches that select the overlapping reference voltages is lesser than that of FIG. 5, thus saving the area that might be taken up by the decoder. Although the number of the overlapping reference voltages of FIG. 12 is smaller by only one than that of FIG. 8, the total number of the reference voltages is quite smaller than that in FIG. 8, so that the total number of the switches is less than that of FIG. 8, thus further reducing the chip area that might be taken up by the decoder.

The voltages selected by the first to tenth sub-decoders 11-1C to 11-10C correspond to reference voltages allocated to a column, associated with the values of the first bit group (D9 to D5, D9B to D5B), of the two-dimensional array of (zS+1)=10 rows and h=32 columns (z=9, S=1 and h=32) of FIG. 3. These reference voltages are Vr(9*j*−8), Vr(8*j*−7), Vr(9*j*−6), Vr(9*j*−5), Vr(9*j*−4), Vr(9*j*−3), Vr(9*j*−2), Vr(9*j*−1), Vr(9*j*), and Vr(9+1). The voltages selected by the first to tenth sub-decoders also correspond to reference voltages necessary to output the voltage levels of one section of the specification of FIG. 11.

The sub-decoder 13C selects V(T1) and V(T2), from the voltages selected by the first to tenth sub-decoders 11-1C to 11-10C in response to the second bit group D4 to D0, and D4B to D0B, to output the so selected V(T1) and V(T2).

<Sub-Decoders 11-*i*C (i=1 to 10)>

Figure 13:
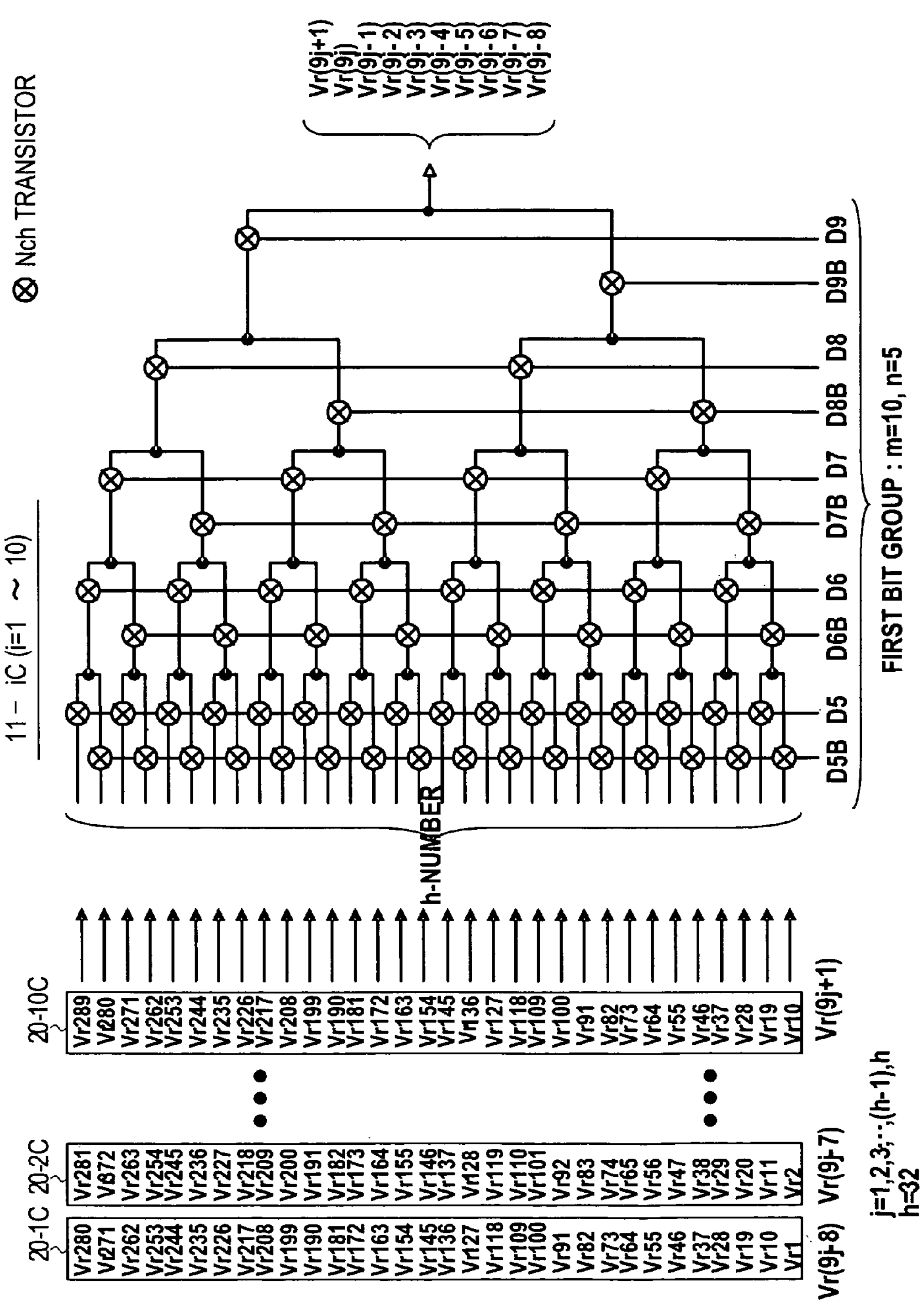
FIG. 13 is a diagram showing the configuration of sub-decoders 11-1C to 11-10C of FIG. 12.

FIG. 13 shows the configuration of the sub-decoders 11-*i*C (i=1 to 10). The first to tenth sub-decoders 11-1C to 11-10C are the same as one another in circuit constitution, except that the sets of the input reference voltages are different. In FIG. 13, the left most reference voltage group 20-1C is supplied to the first sub-decoder 11-1C, while the reference voltage group 20-2C is supplied to the second sub-decoder 11-2C. The reference voltage group 20-10C is supplied to the tenth sub-decoder 11-10C. The ith sub-decoder is shown as a sub-decoder.

The sub-decoder 11-*i*C (i=1 to 10) receives h (=32) reference voltages, and sequentially selects and outputs one of these reference voltages by the bits from the lower order side bits (D5, D5B) of the first bit group (D9 to D5, D9B to D5B) towards the upper order side bits up to (D9, D9B), in a tournament configuration.

In FIG. 13, the first to tenth sub-decoders 11-*i*C (i=1 to 10) select, from the reference voltage groups 20-1C to 20-10C, those reference voltages whose ordering in the associated reference voltage groups are j, namely the reference voltages Vr(9*j*−8), Vr(8*j*−7), Vr(9*j*−6), Vr(9*j*−5), Vr(9*j*−4), Vr(9*j*−3), Vr(9−2), Vr(9*j*−1), Vr(9*j*), and Vr(9+1).

FIG. 13 shows an example configuration in which the sub-decoders 11-*i*C are constituted by Nch transistor switches. In case each transistor switch is formed by a Pch transistor switch, the Nch transistor of FIG. 13 is replaced by a Pch transistor. In addition, the non-inverting signal and the inverting signal of the digital signal are interchanged.

<Sub-Decoder 13C>

Figure 14:
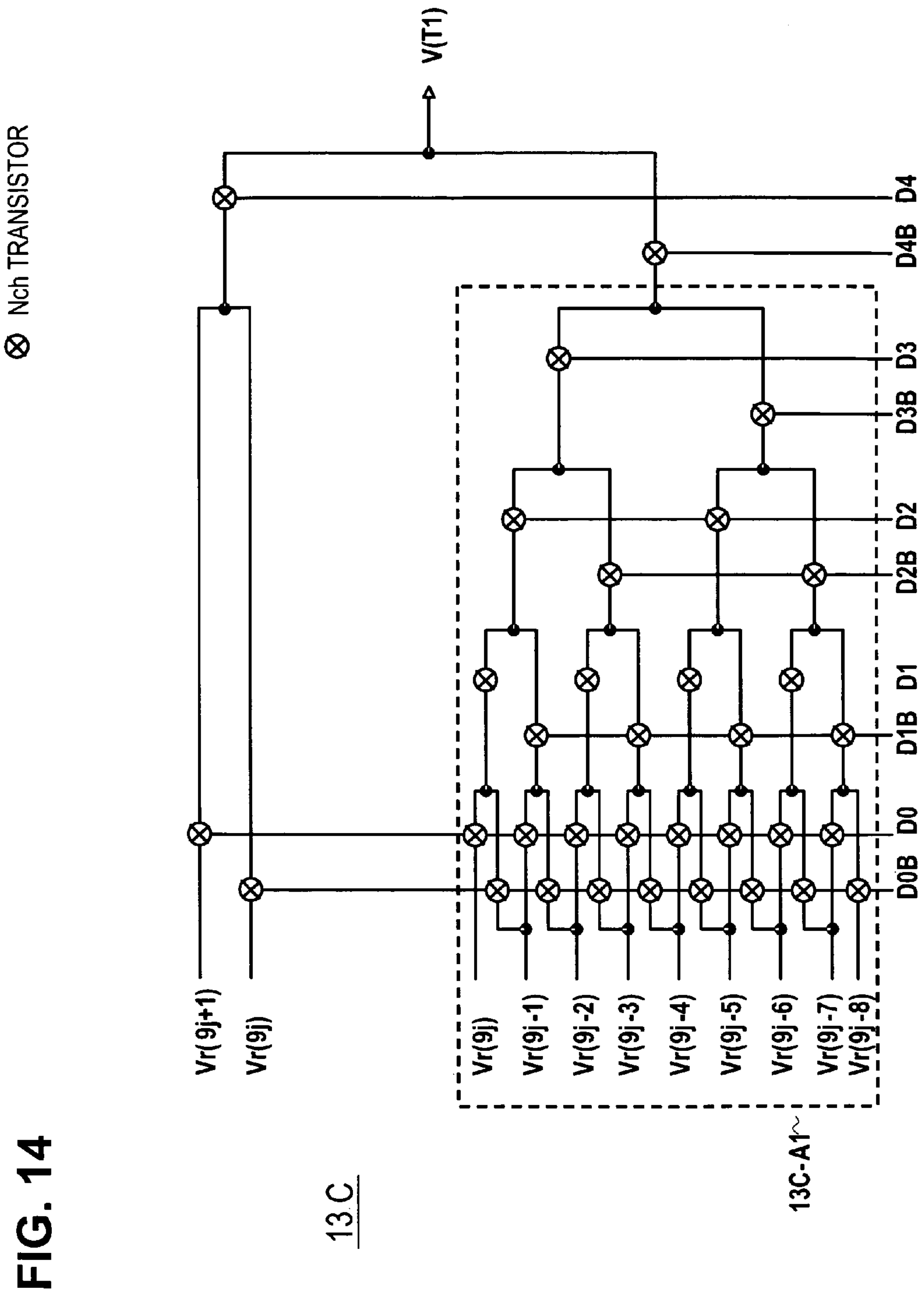
FIG. 14 is a circuit diagram showing a configuration for selection of V(T1) of the sub-decoder 13C of FIG. 12.
Figure 15:
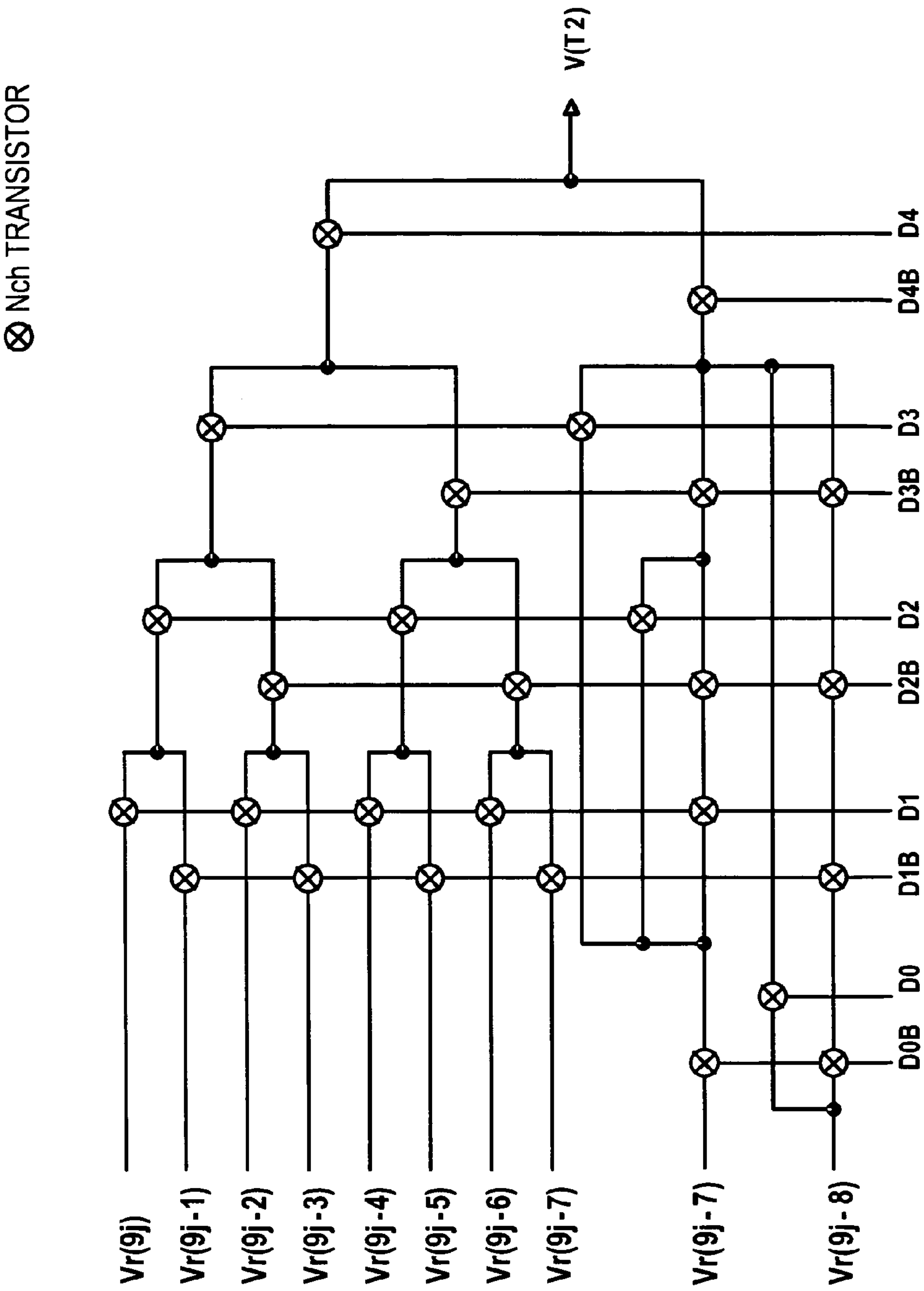
FIG. 15 is a circuit diagram showing a configuration for selection of V(T2) of the sub-decoder 13C of FIG. 12.

FIGS. 14 and 15 show a configuration of the sub-decoder 13C of FIG. 12. Specifically, FIG. 14 shows the sub-decoder that selects and outputs V(T1) and FIG. 15 shows the sub-decoder that selects and outputs V(T2). FIGS. 14 and 15 are shown fractionated only for convenience in the preparation of the drawings.

Referring to FIG. 14, the sub-decoder 13C selects and outputs V(T1), in response to the second bit group (D4 to D0, D4B to D0B), from the voltages selected by the first to tenth sub-decoders 11-1C to 11-10C. The selected voltages are Vr(9*j*−8), Vr(8*j*−7), Vr(9*j*−6), Vr(9*j*−5), Vr(9*j*−4), Vr(9*j*−3), Vr(9*j*−2), Vr(9*j*−1), Vr(9*j*), and Vr(9+1). Specifically, a block 13C-A1 receives Vr(9*j*−8) to Vr(9*j*) to select one of them by the lower order four bits (D0 to D0B) to (D3 to D3B) of the second bit group. Also, one of Vr(9*j*) and Vr(9*j*+1) is selected by the lower most bit (D0, D0B) of the second bit group. One of the voltages selected by the block 13C-A1 and the voltage (Vr(9*j*) or Vr(9*j*+1)) selected by (D0, D0B) are selected by (D4, D4B), and the so selected voltage is output as V(T1).

Referring to FIG. 15, the sub-decoder 13C selects V(T2) from the voltages (Vr(9*j*−8) to Vr(9*j*)), as selected by the sub-decoders 11-1C to 11-10C, in response to the second bit group (D3 to D3B, D0 to D0B). Specifically, the sub-decoder 13C selects one of Vr(9*j*−8) and Vr(8*j*−7), by the lower order four bits (D0, D0B) to (D3, D3B), while selecting one out of Vr(9*j*−7) to Vr(9*j*) by three bits (D1, D1B) to (D3, D3B) of the second bit group, in accordance with the tournament system. One of the two voltages, selected by the lower order side bits, is selected by (D4, D4B), and the so selected voltage is output as V(T2).

FIGS. 14 and 15 show an example configuration in which the sub-decoder 13-C is constituted by Nch transistor switches. In case each switch is formed by a Pch transistor switch, the Nch transistor of FIGS. 14 and 15 is replaced by a Pch transistor. In addition, the non-inverting signal and the inverting signal of the digital signal are interchanged.

The selecting operation by the sub-decoder 12C, shown in FIGS. 14 and 15, is shown in the following Table 2:

TABLE 2

| D4D3D2D1D0 | V(T1) | V(T2) |
|---|---|---|
| 00000 | V(9j − 8) | Vr(9j − 8) |
| 00001 | Vr(9j − 7) | Vr(9j − 8) |
| 00010 | Vr(9j − 7) | Vr(9j − 7) |
| 00011 | Vr(9j − 6) | Vr(9j − 8) |
| 00100 | Vr(9j − 6) | Vr(9j − 7) |
| 00101 | Vr(9j − 5) | Vr(9j − 8) |
| 00110 | Vr(9j − 5) | Vr(9j − 7) |
| 00111 | Vr(9j − 4) | Vr(9j − 8) |
| 01000 | Vr(9j − 4) | Vr(9j − 7) |
| 01001 | Vr(9j − 3) | Vr(9j − 8) |
| 01010 | Vr(9j − 3) | Vr(9j − 7) |
| 01011 | Vr(9j − 2) | Vr(9j − 8) |
| 01100 | Vr(9j − 2) | Vr(9j − 7) |
| 01101 | Vr(9j − 1) | Vr(9j − 8) |
| 01110 | Vr(9j − 1) | Vr(9j − 7) |
| 01111 | Vr(9j) | Vr(9j − 8) |
| 10000 | Vr(9j) | Vr(9j − 7) |
| 10001 | Vr(9j + 1) | Vr(9j − 7) |
| 10010 | Vr(9j) | Vr(9j − 6) |
| 10011 | Vr(9j + 1) | Vr(9j − 6) |
| 10100 | Vr(9j) | Vr(9j − 5) |
| 10101 | Vr(9j + 1) | Vr(9j − 5) |
| 10110 | Vr(9j) | Vr(9j − 4) |
| 10111 | Vr(9j + 1) | Vr(9j − 4) |
| 11000 | Vr(9j) | Vr(9j − 3) |

TABLE 2-continued

| D4D3D2D1D0 | V(T1) | V(T2) |
|---|---|---|
| 11001 | Vr(9j + 1) | Vr(9j − 3) |
| 11010 | Vr(9j) | Vr(9j − 2) |
| 11011 | Vr(9j + 1) | Vr(9j − 2) |
| 11100 | Vr(9j) | Vr(9j − 1) |
| 11101 | Vr(9j + 1) | Vr(9j − 1) |
| 11110 | Vr(9j) | Vr(9j) |
| 11111 | Vr(9j + 1) | Vr(9j) |

The sequence of selection of the lower order bits (D4 to D0, D4B to D0B) is arbitrary. FIGS. 14 and 15 show a configuration in which selection is from the lower most bits (D0, D0B) down to (D4, D4B).

<Another Configuration of Sub-Decoder 13*c*>

Figure 16:
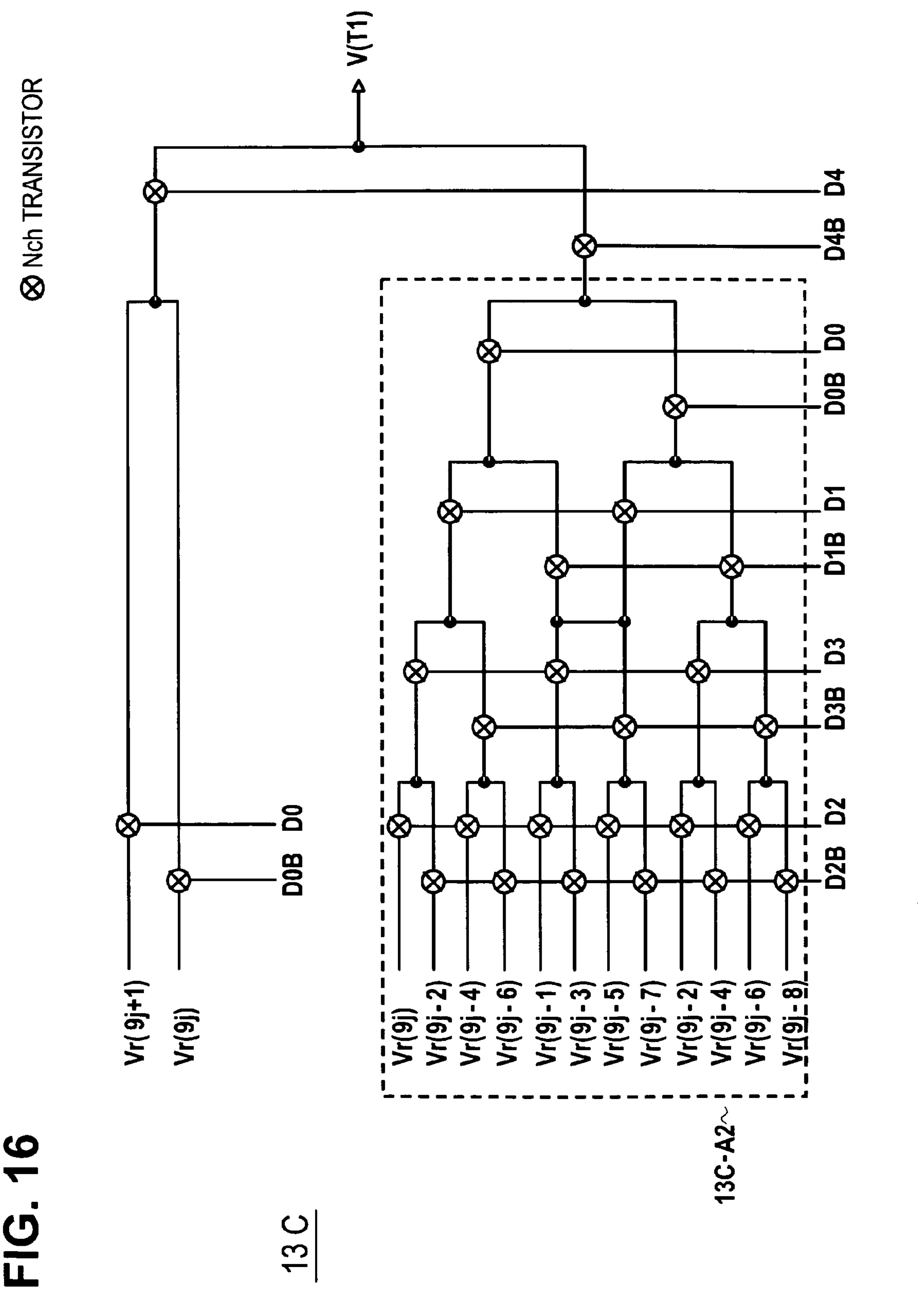
FIG. 16 is a circuit diagram showing a configuration of the sub-decoder 13C of FIG. 12 different from that of FIG. 14.

FIG. 16 shows another configuration of the sub-decoder 13C, and specifically shows another configuration of FIG. 15 of selecting and outputting V(T1). In FIG. 16, a sub-decoder 13C-A2 modifies the configuration of 13C-A 1 of FIG. 14 of sequentially selecting the bits from (D0, D0B) to (D4, D4B) for saving in the use of the elements. In FIG. 14, the sub-decoder 13C-A1 is in need of 30 switches. In the Exemplary Embodiment of FIG. 16, the number of the switches used in the sub-decoder 13C-A2, outputting the voltage selected as V(T1), is 24. A decoder configuration of z=9 and S=1 has now be described with reference to FIGS. 12 to 16.

<Exemplary Embodiment 4>

As an Exemplary Embodiment of FIG. 1, distinct from the configuration of FIG. 12, matched to the specification of FIG. 11, a decoder configuration of z=9 and S=2 is possible. If reference is had to FIG. 5 (z=5, S=1) and to FIG. 8 (z=5, S=2), matched to the specification of FIG. 4, those skilled in the art will readily comprehend how the decoder configuration is changed in case the value of the symbol S is increased so that z=9. If, with z=9 and S=2, m=10, then n=6 and h=16. Thus, the first bit group D(m−1) to Dn, and D(m−1)B to DnB are D9 to D6, and D9B to D6B, while the second bit group. D(n−1) to D0, and D(n−1)B to D0B are D5 to D0, and D5B to D0B.

Each of 19 sub-decoders from the first to (zS+1)th sub-decoders receives h(=16) reference voltages to select and output one of these voltages in response to the first bit group (D9 to D6, D9B to D6B) in accordance with a tournament configuration.

The first sub-decoder and the (zS+1)th sub-decoder input (h−1)=15 reference voltages in overlapped state.

Since the number of the overlapping reference voltages is smaller than in FIG. 12, the number of switches that select the overlapping reference voltages may be smaller than that of FIG. 12, thus saving the area of the decoder circuit.

<Exemplary Embodiment 5>

FIG. 17 illustrates a third specification of the DAC of FIG. 1. In accordance with this third implementation statement, the exemplary embodiment of FIG. 1 selects 0th to 1023rd levels, totaling to 1024 voltage levels, in response to 10-bit digital data (m=10), and outputs the so selected voltage levels. The manner of representation is similar to that of FIGS. 4 and 11. The specification of FIG. 17 is equivalent to that of FIG. 2, provided that A, z and N' are set so that A=0, z=17 and N'=16. The total number of reference voltages in this case is 273. The symbols S and h are such that h×S=16 and, if S=1, h=16 and if S=2, h=8 and so on.

If, in the specification of FIG. 17, 64 levels make up a section, the total number of the sections is 64. The 64 levels of each section are output from the interpolation circuit 30 of FIG. 1 in response to the voltages V(T1) and V(T2) as selected from the total of 18 reference voltages. The 18 reference voltages are made up of 17 reference voltages in the section and a single reference voltage allocated to the most adjacent level of a neighboring section. In this case, the 64 levels in each section exhibit a substantially linear characteristic. In FIG. 17, the 1024th level, not contained in the output levels of the interpolation circuit 30, is allocated to the reference voltage Vr273.

<Configuration of Exemplary Embodiment 5>

Figure 18:
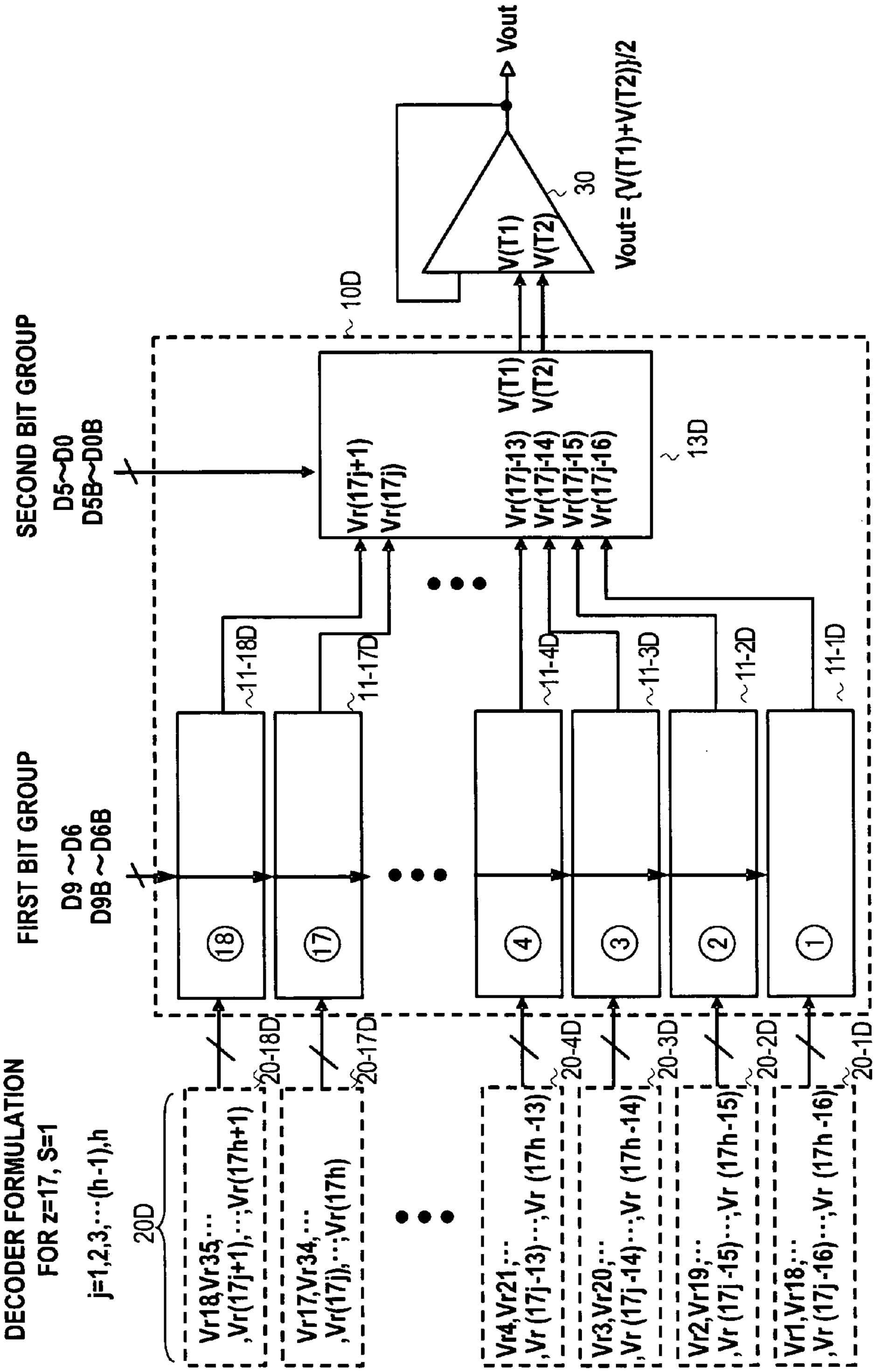
FIG. 18 is a circuit diagram showing a configuration of Example 3 matched to the specification of FIG. 17 according to the present invention.

FIG. 18 shows an Exemplary Embodiment of FIG. 1 matched to the specification of FIG. 17, and specifically shows a configuration of the decoder 10D with z=17, S=1, m=10 and n=6. The first bit group D(m−1) to Dn, and D(m−1)B to DnB are D9 to D6 and D9B to D6B, while the second bit group D(n−1) to D0, and D(n−1)B to D0B are D5 to D0 and D5B to D0B.

The first to (zS+1)th sub-decoders 11-1D to 11-18D each input h (=16) reference voltages to select and output a single voltage in response to the first bit group (D9 to D6, D9B to D6B), in accordance with a tournament configuration.

The sub-decoders 11-1D and 11-18D input (h−1)=15 overlapping reference voltages to the exclusion of Vr1 and Vr(17*h*+1).

The overlapping reference voltages are supplied just to the sub-decoders 11-1D and 11-18D.

In the configuration of FIG. 18, the number of overlapping reference voltages is less than that of FIG. 5, 8 or 12, and hence the number of the switches that select the overlapping reference voltages is smaller, thus saving the circuit area of the decoder circuit. In addition, the total number of the reference voltages in FIG. 18 is less than that of the configuration of FIGS. 5, 8 and 12. Hence, the total number of the switches is smaller, thus further saving the circuit area of the decoder circuit.

The voltages selected by the sub-decoders 11-1D to 11-18D correspond to reference voltages allocated to a column associated with the values of the first bit group (D9 to D6, D9B to D6B) of the two-dimensional array of (zS+1)=18 rows and h=16 columns (z=17, S=1 and h=16) of FIG. 3. These reference voltages are (Vr(17*j*−16), Vr(17*j*−15), Vr(17*j*−14), Vr(17*j*), Vr(17+1)). The voltages selected by the sub-decoders 11-1D to 11-18D also correspond to reference voltages necessary to output the voltage levels of one section of the specification of FIG. 17.

The sub-decoder 13D selects V(T1) and V(T2), from the voltages selected by the decoder 11-1D~11-18D in response to the second bit group D5 to D0 and D5B to D0B, to output the so selected V(T1) and V(T2).

<Sub-Decoders 11-*i*D (i=1~18)>

Figure 19:
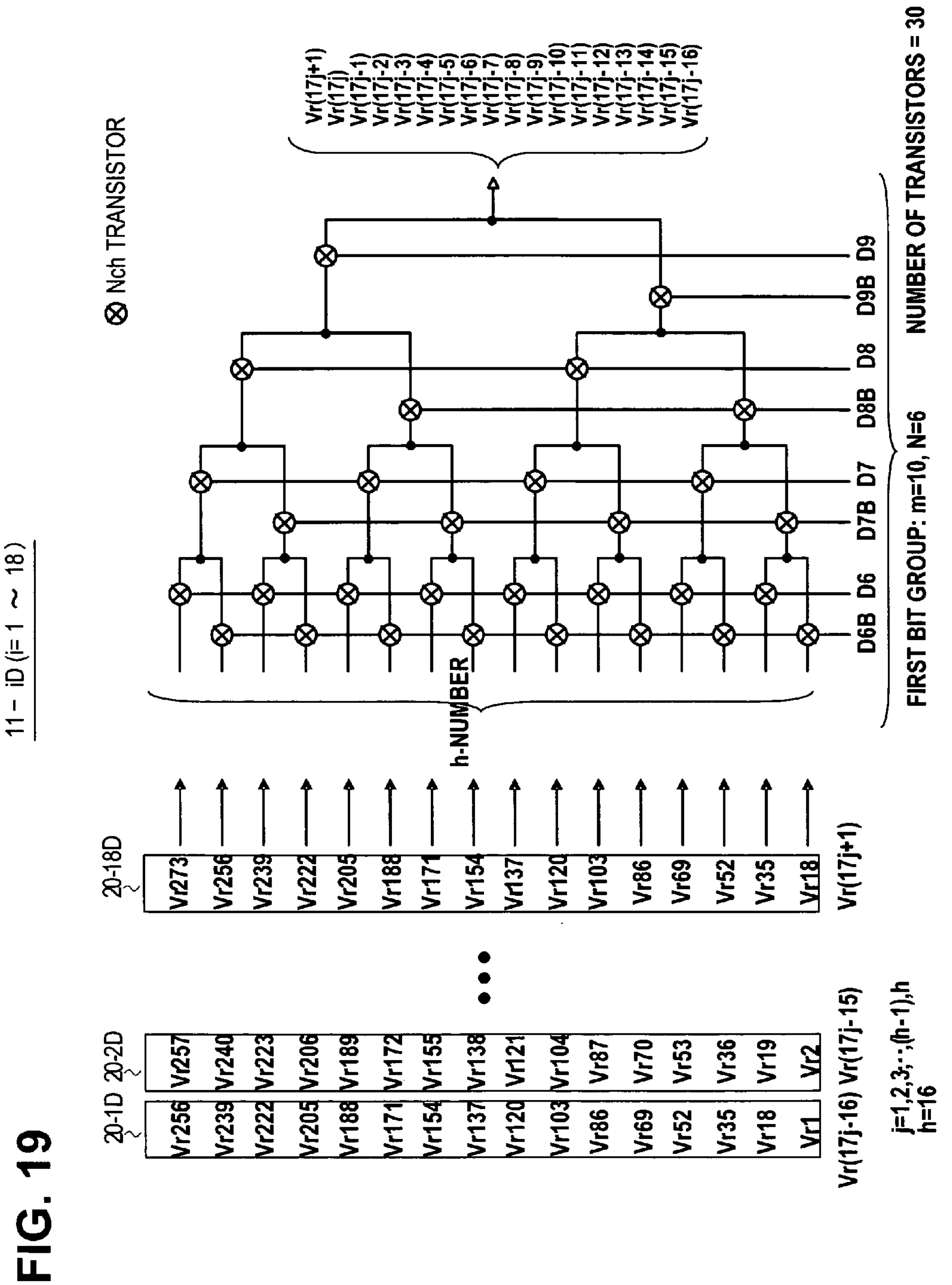
FIG. 19 is a diagram showing a configuration of sub-decoders 11-1D to 11-18D of FIG. 18.

FIG. 19 shows the configuration of the sub-decoders 11-*i*D (i=1 to 18) of FIG. 18. The first to 18th sub-decoders 11-1D to 11-18D are the same as one another in circuit constitution, except that the sets of the input reference voltages are different. In FIG. 19, the sole ith sub-decoder is shown. In the example configuration of FIG. 19, the switch is constituted by an Nch transistor.

The sub-decoder 11-*i*D (i=1 to 18) receives h (=16) reference voltages, and sequentially selects and outputs one of these reference voltages by the bits from the lower order side bits (D6, D6B) of the first bit group (D9 to D6, D9B to D6B) towards the upper order side bits up to (D9, D9B), in accordance with the tournament configuration.

In case the sub-decoder 11-1D has selected a single voltage Vr(17*i*-16) from the reference voltage group 20-1D, the sub-decoder 11-2D selects a single reference voltage Vr(17*i*-15) from the reference voltage group 20-2D, and so on until the sub-decoder 11-18D selects a single reference voltage Vr(17*i*+1) from the reference voltage group 20-18D. In this manner, 18 voltages, namely the voltages Vr(17*i*-16), Vr(17*i*-15), to Vr(17*i*+1), are supplied to the sub-decoder 13-D. In case each switch is formed by a Pch transistor, the Nch transistor of FIG. 19 is replaced by a Pch transistor. In addition, the non-inverting signal and the inverting signal of the digital signal are interchanged.

<Sub-Decoder 13D>

Figure 20:
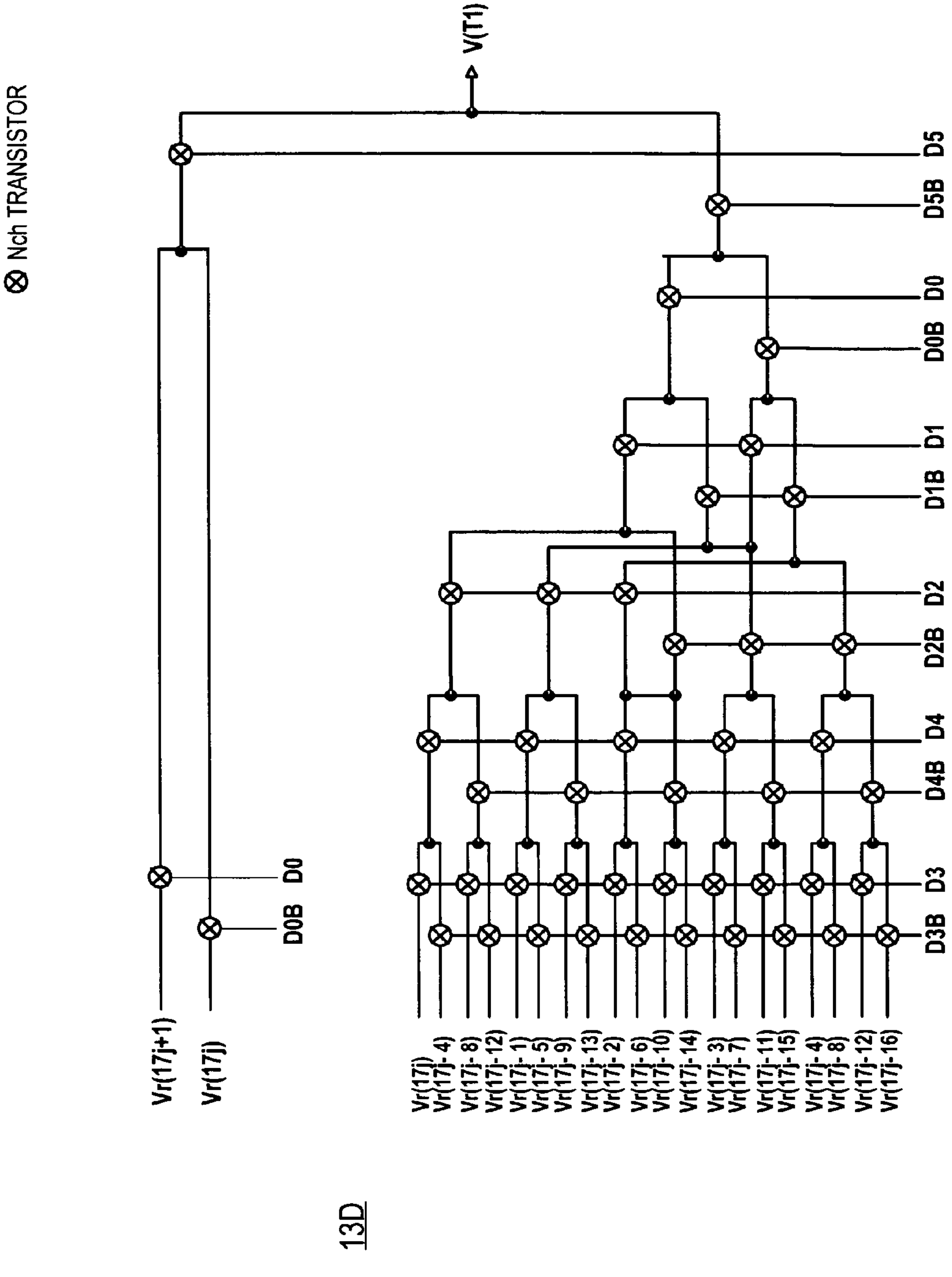
FIG. 20 is a circuit diagram showing a configuration for selection of V(T1) of the sub-decoder 13D of FIG. 18.
Figure 21:
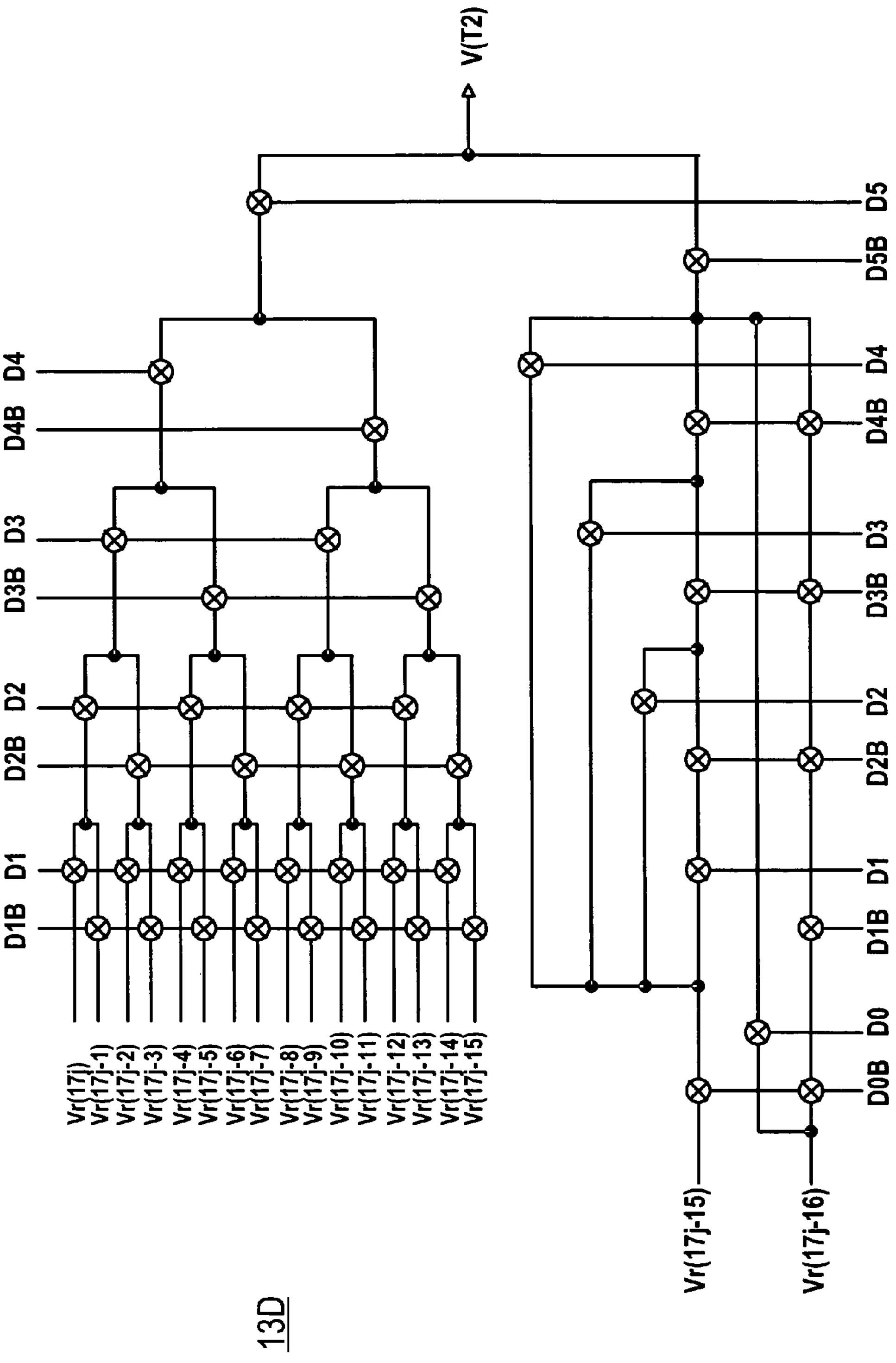
FIG. 21 is a circuit diagram showing a configuration for selection of V(T2) of the sub-decoder 13D of FIG. 18.

FIGS. 20 and 21 show an example configuration of the sub-decoder 13D of FIG. 18. FIG. 20 shows a sub-decoder that selects and outputs V(T1) and FIG. 21 shows a sub-decoder that selects and outputs V(T2). FIGS. 20 and 21 are shown fractionated only for convenience for the preparation of drawings.

The sub-decoder 13-D of FIG. 20 selects and outputs V(T1) from the voltages Vr(17*i*-16), Vr(17*i*-15), Vr(17*i*-15), . . . , Vr(17*j*), and Vr(17*i*+1), as selected by the sub-decoders 11-1D to 11-18D, in response to the second bit group (D5 to D0, D5B to D0B).

The sub-decoder 13D of FIG. 21 selects and outputs V(T2) from the voltages selected by the sub-decoders 11-1D to 11-18D in response to the second bit group (D5 to D0, D5B to D0B). The selecting operation of the sub-decoder 13D is shown in Table 3. The sequence of selection of the lower order side six bits D5 to D0, and D5B to D0B is arbitrary.

TABLE 3

| D5D4D3D2D1D0 | V(T1) | V(T2) |
|---|---|---|
| 000000 | Vr(17j − 16) | Vr(17j − 16) |
| 000001 | Vr(17j − 15) | Vr(17j − 16) |
| 000010 | Vr(17j − 15) | Vr(17j − 15) |
| 000011 | Vr(17j − 14) | Vr(17j − 16) |
| 000100 | Vr(17j − 14) | Vr(17j − 15) |
| 000101 | Vr(17j − 13) | Vr(17j − 16) |
| 000110 | Vr(17j − 13) | Vr(17j − 15) |
| 000111 | Vr(17j − 12) | Vr(17j − 16) |
| 001000 | Vr(17j − 12) | Vr(17j − 15) |
| 001001 | Vr(17j − 11) | Vr(17j − 16) |
| 001010 | Vr(17j − 11) | Vr(17j − 15) |
| 001011 | Vr(17j − 10) | Vr(17j − 16) |
| 001100 | Vr(17j − 10) | Vr(17j − 15) |
| 001101 | Vr(17j − 9) | Vr(17j − 16) |
| 001110 | Vr(17j − 9) | Vr(17j − 15) |
| 001111 | Vr(17j − 8) | Vr(17j − 16) |
| 010000 | Vr(17j − 8) | Vr(17j − 15) |
| 010001 | Vr(17j − 7) | Vr(17j − 16) |
| 010010 | Vr(17j − 7) | Vr(17j − 15) |
| 010011 | Vr(17j − 6) | Vr(17j − 16) |
| 010100 | Vr(17j − 6) | Vr(17j − 15) |
| 010101 | Vr(17j − 5) | Vr(17j − 16) |
| 010110 | Vr(17j − 5) | Vr(17j − 15) |
| 010111 | Vr(17j − 4) | Vr(17j − 16) |
| 011000 | Vr(17j − 4) | Vr(17j − 15) |
| 011001 | Vr(17j − 3) | Vr(17j − 16) |
| 011010 | Vr(17j − 3) | Vr(17j − 15) |
| 011011 | Vr(17j − 2) | Vr(17j − 16) |
| 011100 | Vr(17j − 2) | Vr(17j − 15) |
| 011101 | Vr(17j − 1) | Vr(17j − 16) |
| 011110 | Vr(17j − 1) | Vr(17j − 15) |
| 011111 | Vr(17j) | Vr(17j − 16) |
| 100000 | Vr(17j) | Vr(17j − 15) |
| 100001 | Vr(17j + 1) | Vr(17j − 15) |
| 100010 | Vr(17j) | Vr(17j − 14) |
| 100011 | Vr(17j + 1) | Vr(17j − 14) |
| 100100 | Vr(17j) | Vr(17j − 13) |
| 100101 | Vr(17j + 1) | Vr(17j − 13) |
| 100110 | Vr(17j) | Vr(17j − 12) |
| 100111 | Vr(17j + 1) | Vr(17j − 12) |
| 101000 | Vr(17j) | Vr(17j − 11) |
| 101001 | Vr(17j + 1) | Vr(17j − 11) |
| 101010 | Vr(17j) | Vr(17j − 10) |
| 101011 | Vr(17j + 1) | Vr(17j − 10) |
| 101100 | Vr(17j) | Vr(17j − 9) |
| 101101 | Vr(17j + 1) | Vr(17j − 9) |
| 101110 | Vr(17j) | Vr(17j − 8) |

TABLE 3-continued

| D5D4D3D2D1D0 | V(T1) | V(T2) |
|---|---|---|
| 101111 | Vr(17j + 1) | Vr(17j − 8) |
| 110000 | Vr(17j) | Vr(17j − 7) |
| 110001 | Vr(17j + 1) | Vr(17j − 7) |
| 110010 | Vr(17j) | Vr(17j − 6) |
| 110011 | Vr(17j + 1) | Vr(17j − 6) |
| 110100 | Vr(17j) | Vr(17j − 5) |
| 110101 | Vr(17j + 1) | Vr(17j − 5) |
| 110110 | Vr(17j) | Vr(17j − 4) |
| 110111 | Vr(17j + 1) | Vr(17j − 4) |
| 111000 | Vr(17j) | Vr(17j − 3) |
| 111001 | Vr(17j + 1) | Vr(17j − 3) |
| 111010 | Vr(17j) | Vr(17j − 2) |
| 111011 | Vr(17j + 1) | Vr(17j − 2) |
| 111100 | Vr(17j) | Vr(17j − 1) |
| 111101 | Vr(17j + 1) | Vr(17j − 1) |
| 111110 | Vr(17j) | Vr(17j) |
| 111111 | Vr(17j + 1) | Vr(17j) |

The decoder configuration of z=1, S=1, m=10 and n=6 has been explained as above.

As an Exemplary Embodiment of FIG. 1, distinct from the Exemplary Embodiment of FIG. 18, and which meets the specification of FIG. 17, a decoder configuration with z=17, S=2, m=10 and n=7, not shown, is also possible. If reference is made to FIG. 5 (z=5, S=1) or to FIG. 8 (z=5, S=2), matched to the specification of FIG. 4, those skilled in the art will readily comprehend how the decoder configuration will change in case the value of the symbol S is increased. Namely, if, with z=17 and S=2, m=10, then n=7 and h=8. Hence, the first bit group D(m−1) to Dn, and D(m−1)B to DnB are (D9 to D7, D9B to D7B), whereas the second bit group D(n−1) to D0, D(n−1)B to D0B} are (D6 to D0, D6B to D0B). The first to (zS+1)th, totaling to 35, sub-decoders each input h (=8) reference voltages to select and output a single reference voltage in response to the first bit group D9 to D7, D9B to D7B as a tournament configuration decoder system. The first sub-decoder and the (zS+1)th sub-decoder input (h−1)=7 reference voltages in overlapped state. Since the number of the reference voltages overlapped is less than that in FIG. 18, the number of switches used in selecting the overlapped reference voltages may be less than in FIG. 18, thus saving the area otherwise taken up by the decoder circuit.

<Comparison of the Numbers of Transistor Switches of Decoders>

Figure 32:
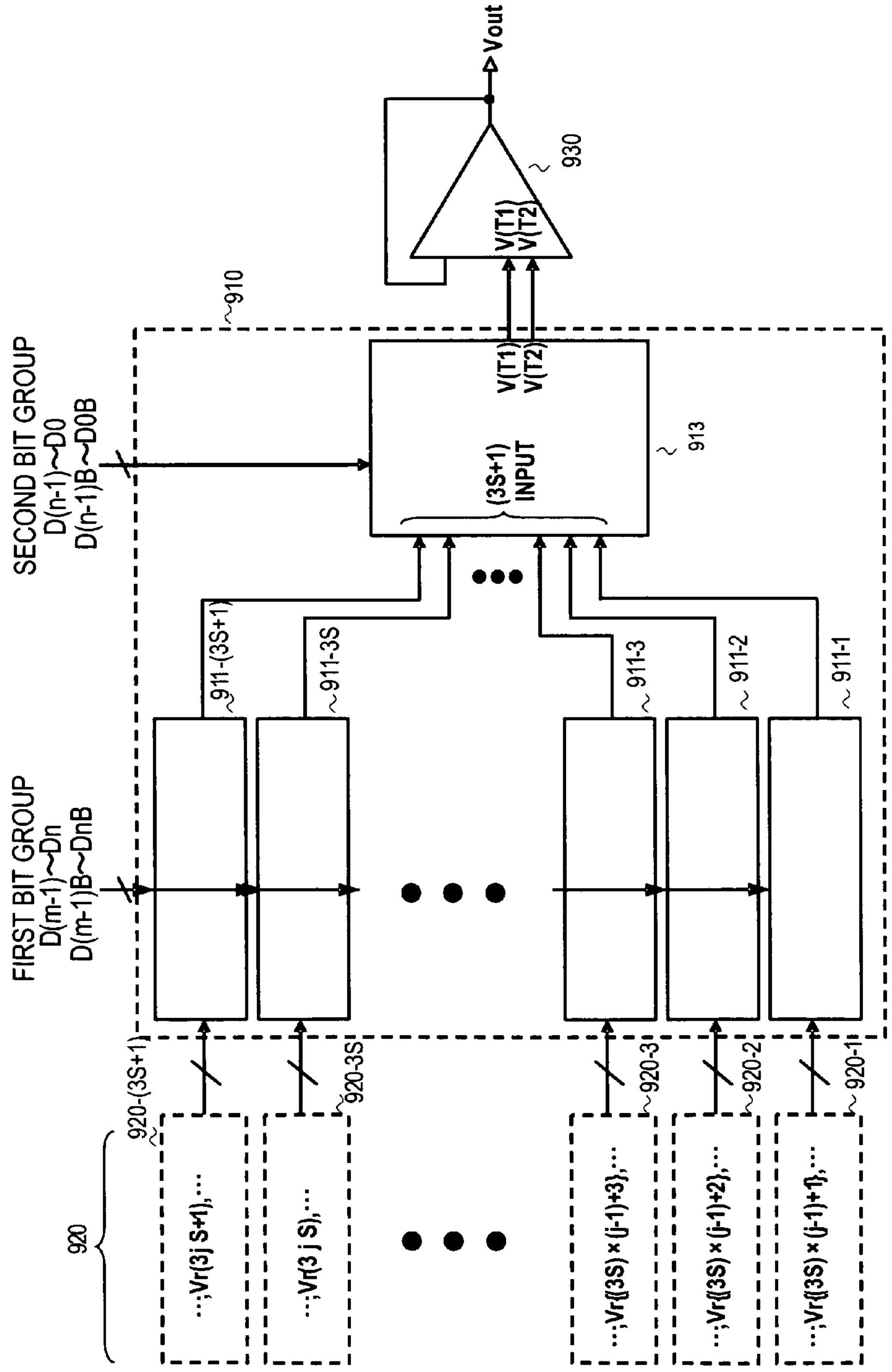
FIG. 32 PRIOR ART
FIG. 32 is a circuit diagram showing a configuration of FIG. 1 of Patent Document 1.

FIGS. 22A and B show the comparison of the number of the transistor switches of a Comparative Exemplary Embodiment (related technique of FIG. 32) of a 10-bit decoder with the number of output levels equal to 1024, to that of the present invention. The number of the transistor switches is that in case the transistors are formed solely by Nch transistors or by Pch transistors.

The total number of the transistor switches in the 10-bit DAC of the present invention is less than in the Comparative Exemplary Embodiment (FIG. 32), thus indicating that the area taken up by the decoder may be reduced. It may also be indicated that, in each of the configurations of the present invention, the larger the value of the symbol z and the larger the value of the symbol S, the smaller may be the total number of the switches, thus enabling the area of decoder and the DAC inclusive of the decoders to be reduced.

Referring to FIGS. 23 to 27, optimum combinations of the reference voltages, as selection of the voltages V(T1) and V(T2), supplied to the interpolation circuit 30, will now be described.

<DNL>

Figure 23:
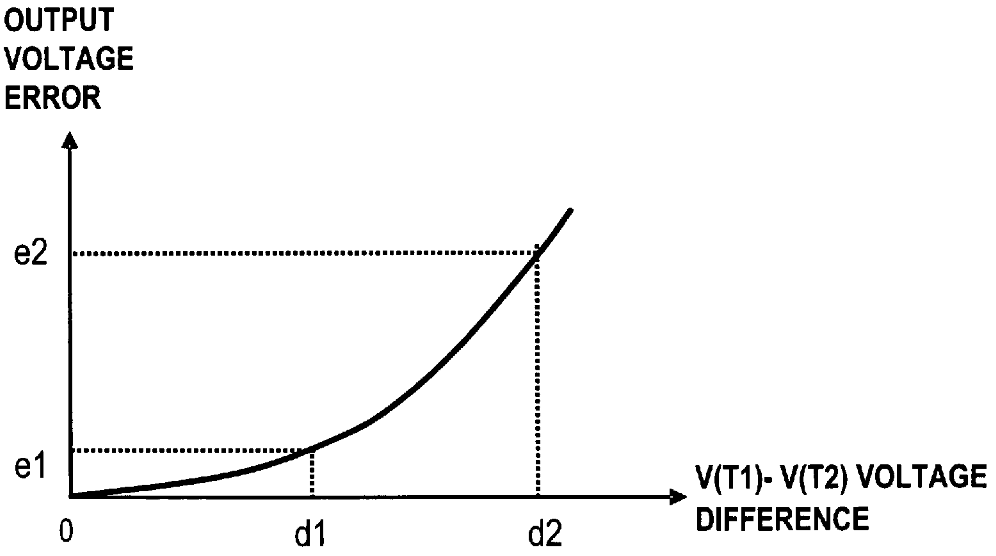
FIG. 23 is a graph for illustrating an output voltage error.

If, in actually constructing the interpolation circuit 30 by e.g., an amplifier, the potential difference between the voltages V(T1) and V(T2) supplied to the interpolation circuit 30 is increased, an output voltage error in the interpolation circuit 30 is also increased due to e.g., variations in an amplifier characteristic or in elements constituting the amplifier, as indicated in FIG. 23. Such has been demonstrated by the analyses conducted by the present inventor. This output error in the interpolation circuit 30 significantly affects output voltage characteristics of the interpolation circuit 30 in the present invention.

In an exemplary embodiment of the present invention, a plurality of combinations of the voltages V(T1) and V(T2), supplied to the interpolation circuit 30, are possible for certain voltage levels, as shown in FIGS. 24, 26 and 27, as will be explained later. However, depending on the selection of combinations of the voltages V(T1) and V(T2), the DNL (Differentiable Non-Linearity), a crucial criteria of an output voltage characteristic of the interpolation circuit 30, may be worsened. This DNL is a deviation of an actual variation from an ideal variation of 1 level.

In a gray scale characteristic of, for example, a display device, in particular, there is a problem that, when monotonic change of the output voltage in relation to a gray scale, also referred to as monotonicity, is deteriorated by DNL worsening, thus producing the gray scale inversion, the display quality is appreciably lowered.

The relationship between DNL and the combinations of the voltages V(T1) and V(T2), supplied to the interpolation circuit 30, will now be specifically described with reference to FIG. 23. In FIG. 23, the abscissa and the ordinate respectively denote the voltage difference between the voltages V(T1) and V(T2) and an error of the output voltage. It is now assumed that, if, in a characteristic curve of FIG. 23, the voltage difference between the voltages V(T1) and V(T2) for a specific voltage level is d1, the output voltage error in relation to the specific voltage level is e1. It is also assumed that, in case the voltage difference between the voltages V(T1) and V(T2) for a voltage level neighboring to the above mentioned specific voltage level in the voltage level ordering is d2, the output voltage error in relation to the above mentioned neighboring voltage level is e2.

It is further assumed that there is a plurality of combinations of the voltages V(T1) and V(T2) for the above mentioned neighboring voltage levels. Then, d2 is changed by the combinations of V(T1) and V(T2), with the corresponding output voltage error e2 being also changed.

As may be seen from the characteristic curve of FIG. 23, if the difference between d1 in a voltage level and d2 in a voltage level neighboring thereto is larger, the difference in the output voltage error is also larger. In this case, the DNL is deteriorated.

To suppress the deterioration of the DNL to a smaller extent, such a combination of V(T1) and V(T2), for which the difference between d1 in a voltage level and d2 in a voltage level neighboring thereto, will become smaller, is selected. Namely, in case there is a plurality of combinations of V(T1) and V(T2) for a certain voltage level in the voltage level ordering, such combination for which the difference between the V(T1)-V(T2) voltage difference (level difference) for the above mentioned certain level and the V(T1)-V(T2) voltage difference (level difference) for the above mentioned neighboring voltage level will be smaller is selected. The value of the voltage difference between V(T1) and V(T2) corresponds to that of a level difference of the voltage levels of V(T1) and V(T2). In the description to follow, the value of the voltage difference is referred to in terms of the value of the level difference.

FIG. 24 shows an specification for z=5 by way of an Exemplary Embodiment of the present invention. Specifically, reference voltages (Vr1 to Vr6) needed for outputting the 0th to the 15th levels for the initial one section, the combinations of V(T1) and V(T2) that may be selected from the reference voltages (Vr1 to Vr6) and the V(T1)-V(T2) level differences are shown for a case where the difference(s) between a given V(T1)-V(T2) level difference and V(T1)-V(T2) level difference(s) at a neighboring voltage level(s) is not greater than 6 and for a case where the difference(s) is greater than 6. Although the sections of the voltage levels not less than the level 16 are not shown, the V(T1)-V(T2) combinations as selected from the reference voltages associated with the voltage levels are similar to those shown in FIG. 24.

In FIG. 24, there is just one V(T1)-V(T2) combination insofar as the 0th to fifth levels are concerned.

As regards the difference(s) between a given V(T1)-V(T2) level difference and V(T1)-V(T2) level difference(s) at a neighboring voltage level(s), the maximum level difference is 6 levels corresponding to a difference between the level difference at the second level (0 level) and the level difference at the third level (6 levels), and 6 levels corresponding to a difference between the level difference at the fourth level (4 levels) and the level difference at the fifth level (10 levels).

At the sixth level, there are two V(T1)-V(T2) combinations, namely ((Vr2, Vr4) and (Vr3, Vr3)).

In case the V(T1)-V(T2) combination at the sixth level is (Vr2, Vr4), the difference between the level difference at the sixth level (8 levels) and the level difference at the fifth level (10 levels) is 2 level and hence small.

On the other hand, in case the V(T1)-V(T2) combination at the sixth level is (Vr3, Vr3), the difference between the level difference at the sixth level (0 level) and the level difference at the fifth level (10 levels) is 10 levels. There is thus a marked difference, exceeding 6, between the V(T1)-V(T2) level differences.

There is just one V(T1)-V(T2) combination at the seventh level. However, the difference(s) between the V(T1)-V(T2) level difference and V(T1)-V(T2) level difference(s) at a neighboring voltage level(s) will differ depending on the V(T1)-V(T2) combination at the sixth level. In case the combination at the sixth level is (Vr2, Vr4), the difference between the level difference at the sixth level (8 levels) and that at the seventh level (14 levels) is six.

On the other hand, if the combination at the sixth level is (Vr3, Vr3), the difference between the level difference at the sixth level (0 level) and that at the seventh level (14 levels) is 14 levels. The difference between the V(T1)-V(T2) level differences is thus larger (namely, exceeds six levels).

There are three V(T1)-V(T2) combinations at the eight levels, namely (Vr1, Vr6), (Vr2, Vr5) and (Vr3, Vr4).

In case the combination at the eighth level is (Vr1, Vr6), the difference between the level difference at the eighth level (16 levels) and that at the seventh level (14 levels) is two. On the other hand, in case the combination at the eighth level is (Vr2, Vr5), the difference between the level difference at the eighth level (12 levels) and that at the seventh level (14 levels) is two.

On the other hand, in case the combination at the eighth level is (Vr3, Vr4), the difference between the level difference at the eighth level (4 levels) and that at the seventh level (14 levels) is 10. There is thus a marked difference, exceeding 6, between the V(T1)-V(T2) level differences.

There is just one V(T1)-V(T2) combination at the ninth level. However, the difference(s) between this V(T1)-V(T2) level difference and V(T1)-V(T2) level difference(s) at a neighboring voltage level(s) differs in dependence upon the V(T1)-V(T2) combinations at the eighth level.

In case the combination at the eighth level is (Vr1, Vr6) or (Vr2, Vr5), the difference between the level difference at the eighth level (16 or 12 levels) and that at the ninth level (14 levels) is two.

If, on the other hand, the combination at the eighth level is (Vr3, Vr4), the difference between the level difference at the eighth level (4 levels) and that at the ninth level (14 levels) is 10. There is thus a marked difference, exceeding 6, between the V(T1)-V(T2) level differences.

There are two V(T1)-V(T2) combinations ((Vr3, Vr5) and (Vr4, Vr4)) at the tenth level.

In case the combination at the tenth level is (Vr3, Vr5), the difference between the level difference at the tenth level (8 levels) and that at the ninth level (14 levels) is 6 levels.

On the other hand, in case the combination at the tenth level is (Vr4, Vr4), the difference between the level difference (0 level) at the tenth level and that (14 levels) at the ninth level is 14 levels. There is thus a marked change, exceeding 6, in the V(T1)-V(T2) level difference.

There is just one V(T1)-V(T2) combination at the 11th level. However, the difference between the V(T1) and V(T2) level difference at a different neighboring voltage level(s) differs in dependence upon the V(T1)-V(T2) combinations at the tenth level.

In case the combination at the eighth level is (Vr3, Vr5), the difference between the level difference at the tenth level (8 levels) and that at the eleventh level (10 levels) is two.

If, on the other hand, the combination at the tenth level is (Vr4, Vr4), the difference between the level difference at the tenth level (0 level) and that at the eleventh level (10 levels) is 10. There is thus a marked difference, exceeding 6, between the V(T1)-V(T2) level differences.

There is only one V(T1)-V(T2) combination at each of 12th to 15th level. The maximum difference between the V(T1)-V(T2) level differences at the neighboring voltage levels is six.

The relationship between the voltage level at the 16th level of the next section, and the reference voltages correlated thereto is the same as that at the 0th level. Hence, the difference(s) between the V(T1)-V(T2) level differences of neighboring voltage level(s) is two.

Namely, referring to FIG. 24, in order to suppress worsening of DNL, it is desirable to use the V(T1)-V(T2) combination in which the level difference between two neighboring voltage levels is not greater than 6 levels.

The difference of six levels between the V(T1)-V(T2) combinations at the neighboring voltage levels is 37.5% of the selectable maximum value of the V(T1)-V(T2) voltage differences (=16 levels for one section).

In FIG. 24, a case where the difference between the V(T1)-V(T2) level differences at neighboring voltage levels is not greater than 6, and a case where the difference between the level difference at neighboring voltage levels is greater than 6 are separately shown. However, in case the voltage difference per voltage level (quantum step) is sufficiently small, the output voltage error itself of the interpolation circuit 30 becomes small, even if the difference between the V(T1)-V(T2) level differences at the two neighboring voltage, levels exceeds 6 levels. In such case, the DNL may not be worsened.

Examples of V(T1)-V(T2) selection shown in table columns titled 'decoder selected voltage' in the specification of FIG. 4 (z=5) are for such a case where the difference between the V(T1)-V(T2) level differences at two neighboring voltage levels is six or less. In case a plurality of different combinations is possible, such a combination that will yield the least V(T1)-V(T2) level difference is shown.

Figure 25A:
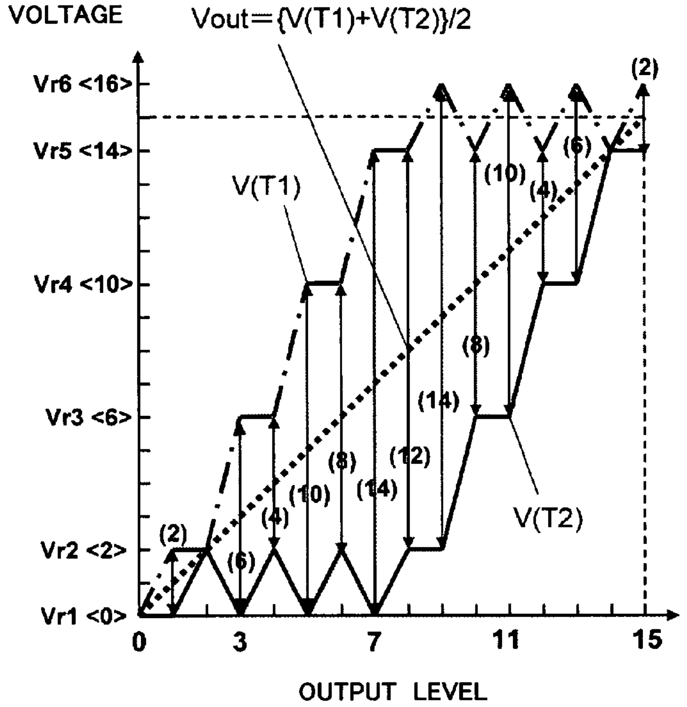
Figure 25B:
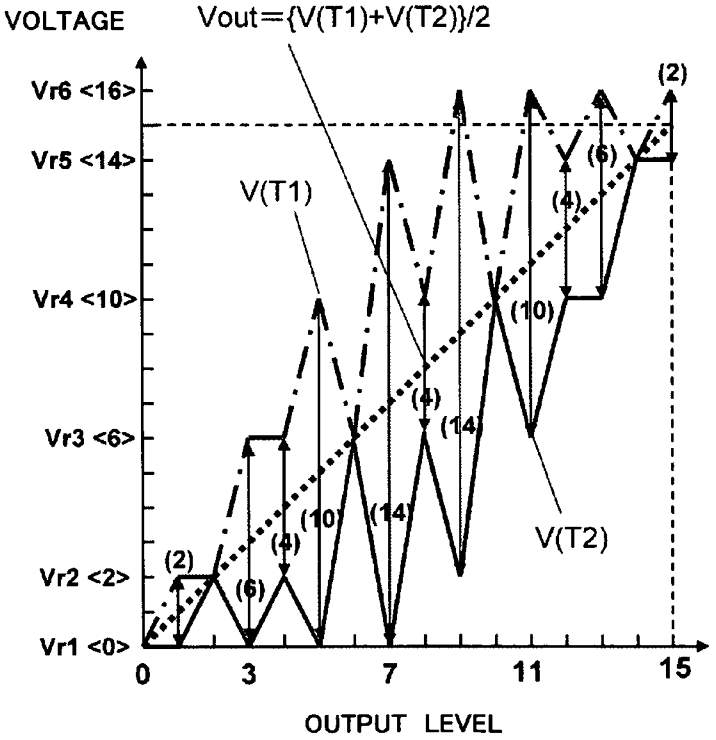

FIGS. 25A and 25B depict graphs showing the relationship between the voltages (reference voltages) in the V(T1)-V(T2) combinations of FIG. 24 at each output level and the output level Vout(={V(T1)+V(T2)}/2) of the interpolation circuit 30. Specifically, FIG. 25A shows an example of V(T1)-V(T2) combinations in which the difference between the V(T1)-V(T2) level difference at two neighboring voltage levels is not greater than 6 levels. FIG. 25B shows an example of V(T1)-V(T2) combinations in which the difference between the V(T1)-V(T2) level difference at two neighboring voltage levels exceeds 6 levels. In both FIGS. 25A and 25B, a horizontal axis denotes an output level (0th to 15th levels) and a vertical axis denotes the reference voltages entered as V(T1) and V(T2) and Vout. V(T1) and V(T2) and Vout for the respective output levels are respectively connected by a chain dotted line, a solid line and a broken line. The V(T1)-V(T2) level differences at the respective output levels are denoted by numerals enclosed in parentheses. The zero level difference is omitted.

Referring to FIG. 25A, in the V(T1)-V(T2) combinations in which the differences between the V(T1)-V(T2) level differences at two neighboring voltage levels are not greater than 6 levels, the level difference between the V(T1)-V(T2) level differences is gradually increased from the 0th level, becoming maximum in the vicinity of a mid part of one section of the output levels. There are 0th to 15th output levels in the section. The difference between the V(T1)-V(T2) level differences is 14 levels at the seventh and ninth levels, and is gradually decreased towards the 15th level.

An output voltage error of the interpolation circuit 30 is increased in the vicinity of the mid part of one section (seventh and ninth levels) where the V(T1)-V(T2) level difference between two neighboring voltage levels becomes broader. However, the difference between the V(T1)-V(T2) level differences at the neighboring output levels is small. For example, even though the V(T1)-V(T2) level difference at the seventh level is 14, the V(T1)-V(T2) level difference at the sixth level is 8, with the difference between the level differences being six level. In similar manner, the V(T1)-V(T2) level difference at the eighth level is 12 and the difference between the V(T1)-V(T2) level differences at the seventh and eighth levels is two. Hence, the DNL may be prevented from being worsened.

FIG. 25A shows a V(T1)-V(T2) setting example in which changes in V(T1) and V(T2) are small in relation to changes in the output level (horizontal axis). Namely, V(T1) and V(T2) are set so as to be on the higher and on lower voltage sides than Vout, respectively. This setting is effective in improving a response characteristic in relation to change in the output level in view of input capacitances at the terminals of the interpolation circuit 30 that receive V(T1) and V(T2). Namely, in FIG. 25A, V(T1)≥V(T2), and (V(T1), V(T2))=(Vr2, Vr1), (Vr3, V41), (Vr3, Vr2), (Vr4, Vr1), . . . , are selected for output levels 1, 3, 4, 5, . . . .

FIG. 25B is for contrasting to FIG. 25A. Referring to FIG. 25B, in the V(T1)-V(T2) combinations in which the difference in the V(T1)-V(T2) level differences at two neighboring voltage levels exceeds six levels, changes in the level differences are significant at the fifth to 11th levels in the vicinity of a mid part of one output level section (0th to 15th levels). The V(T1)-V(T2) level differences are 10, 0, 14, 4, 14, 0 and 10 level at the fifth, sixth, seventh, eighth, ninth, tenth and 11th levels, respectively.

The V(T1)-V(T2) level difference (voltage difference) are associated with the output voltage error, as shown in FIG. 23. If the change in the V(T1)-V(T2) level difference (horizontal axis) is significant, the change in the output voltage error is also significant. In such case, the probability is high that the DNL is deteriorated to give rise to gray scale inversion.

FIG. 26 shows, for an specification of z=9, the reference voltages (Vr1 to Vr10) necessary for outputting the 0th to 31st levels of the first one section and the V(T1)-V(T2) combinations that may be selected from the reference voltages (Vr1 to Vr10). Specifically, FIG. 26 separately shows, for the level differences of respective V(T1)-V(T2) combinations, the case of the level difference between the V(T1)-V(T2) level differences at neighboring voltage levels being not greater than 6 levels and the case of the difference exceeding 6 levels. Although the respective sections not less than the 32nd level are not shown in FIG. 26, the V(T1)-V(T2) combinations selected from the voltage levels and coordinated reference voltages are the same as those of FIG. 26.

To suppress the DNL from becoming worsened, the V(T1)-V(T2) combination for which the difference between the V(T1)-V(T2) level differences at two neighboring voltage-levels is six or less is desirably used in FIG. 26 as well. In FIG. 26, the case where the difference between the V(T1)-V(T2) level differences at two neighboring voltage levels is six or less and the case where the difference exceeds 6 levels are separately shown. However, there are cases where DNL is not worsened in case the voltage difference per voltage level (quantum step) is sufficiently small. It is because the output voltage error itself of the interpolation circuit 30 becomes small in such case even though the difference between the V(T1)-V(T2) level differences at two neighboring voltage levels exceeds 6 levels.

It is thus possible to change the allowable level of the difference between the V(T1)-V(T2) level differences at two neighboring voltage levels in dependence upon the voltage difference per voltage level. For example, the allowable level of the difference between the V(T1)-V(T2) level differences at two neighboring voltage levels may be changed to 12 level or less. The difference between the V(T1)-V(T2) level differences at two neighboring voltage levels equal to 12 level is equivalent to 37.5% of the maximum value of the selectable V(T1)-V(T2) voltage differences (=32 levels for each section). With the equal value of the voltage difference for one section, the allowable level of 12 is equivalent to the allowable level (6 levels) of the level differences for the 16 levels for one section of FIG. 24.

FIG. 11 shows examples of V(T1)-V(T2) selection, shown in columns titled 'decoder selected voltages' in the specification of (z=9). Specifically, FIG. 11 shows the difference between the V(T1)-V(T2) combinations at two neighboring voltage levels of six or less. In case a plurality of the combinations are possible, the example of the minimum V(T1)-V(T2) level difference is shown.

FIG. 27 shows, for an specification of z=17, the reference voltages (Vr1 to Vr18) necessary for outputting the 0th to 63rd levels of the initial section and the V(T1)-V(T2) combinations that may be selected from the reference voltages (Vr1 to Vr18). Specifically, FIG. 27 separately shows, for the V(T1)-V(T2) lever differences of respective combinations, the case of the difference between the V(T1)-V(T2) level differences at neighboring voltage levels being not greater than 6 levels and the case of the difference exceeding 6 levels. Although the respective sections not less than the 64th level are not shown in FIG. 27, the V(T1)-V(T2) combinations selected from the voltage levels and coordinated reference voltages are the same as those of FIG. 26.

To suppress the DNL form worsening, it is desirable to use the V(T1)-V(T2) combinations for which the difference between the V(T1)-V(T2) level differences at two neighboring voltage levels is six or less, in the example of FIG. 27 as well.

In FIG. 27, the case where the difference between the V(T1)-V(T2) level differences at two neighboring voltage levels is six or less and the case where the difference between the V(T1)-V(T2) level differences at two neighboring voltage levels exceeds 6 levels are separately shown. There are, however, cases where DNL is not worsened in case the voltage difference per voltage level is sufficiently small. It is because the output voltage error itself of the interpolation circuit 30 becomes small in such case even though the difference between the V(T1)-V(T2) level differences at two neighboring voltage levels exceeds 6 levels.

It is thus possible to change the allowable level of the difference between the V(T1)-V(T2) level differences at two neighboring voltage levels in dependence upon the voltage difference per voltage level. For example, the allowable level of the difference between the V(T1)-V(T2) level differences at two neighboring voltage levels may be changed to 24 levels or less. The difference between the V(T1)-V(T2) level differences at two neighboring voltage levels equaling 24 levels is equivalent to 37.5% of the maximum value of the selectable V(T1)-V(T2) voltage differences (=64 levels for one section). With the equal value of the voltage difference for one section, the allowable level of 24 is equivalent to the allowable difference level (six levels) of the level differences for the 16 levels for one section of FIG. 24.

FIG. 17 shows examples of selection of V(T1), V(T2) of the specification of FIG. 17 (z=17). Specifically, FIG. 17 shows the difference between the V(T1)-V(T2) level differences at two neighboring voltage levels of 6 or less levels. In case a plurality of the combinations are possible, an example of the minimum V(T1)-V(T2) level difference is shown.

<Exemplary Embodiment 2>

Figure 28:
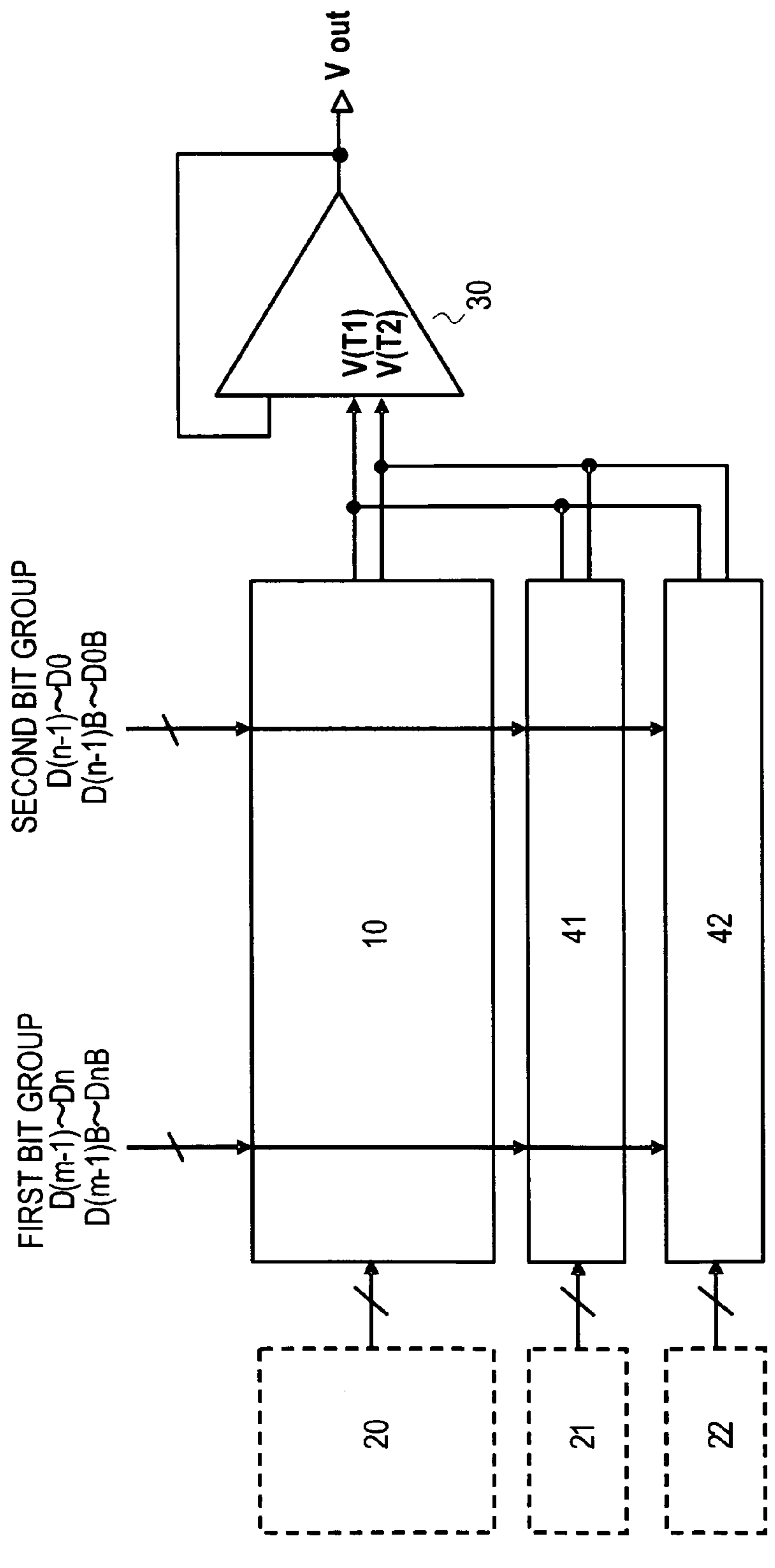
FIG. 28 is a block diagram showing a configuration of an exemplary embodiment 2 according to the present invention.

FIG. 28 shows a configuration of another exemplary embodiment of the present invention. Referring to FIG. 28, the present exemplary embodiment further includes reference voltage ensembles 21 and 22 that prescribe an output level range different from the output level range of the reference voltage ensemble 20 of FIG. 1. The present exemplary embodiment also further includes decoders 41 and 42 distinct from the decoder 10. Namely, the output nodes of the decoders 10, 41 and 42, which first voltages from the respective decoders are output to, are connected in common. Also, the output nodes of the decoders 10, 41 and 42, which second voltages from the respective decoders are output to, are connected in common. The decoders 41 and 42 receive reference voltages of the reference voltage ensembles 21 and 22, as inputs, while also receiving m-bit digital data, as inputs, in common with the decoder 10 of FIG. 1. The decoders 41 and 42 select and output two voltages in response to the m-bit digital data. Outputs of the decoders 41 and 42 are connected in common with the output of the decoder 10. The interpolation circuit 30 is shared by the three decoders. In case the reference voltage ensemble 20 includes a reference voltage(s) associated with the voltage level(s) not included in the range of output levels prescribed by the reference voltage ensemble 20, and the voltage level(s) is included in the output levels prescribed by the reference voltage ensembles 21 and 22, the reference voltage(s) associated with the voltage level(s) is also included in the reference voltage ensemble 21 or 22.

<Exemplary Embodiment 3>

Figure 30A:
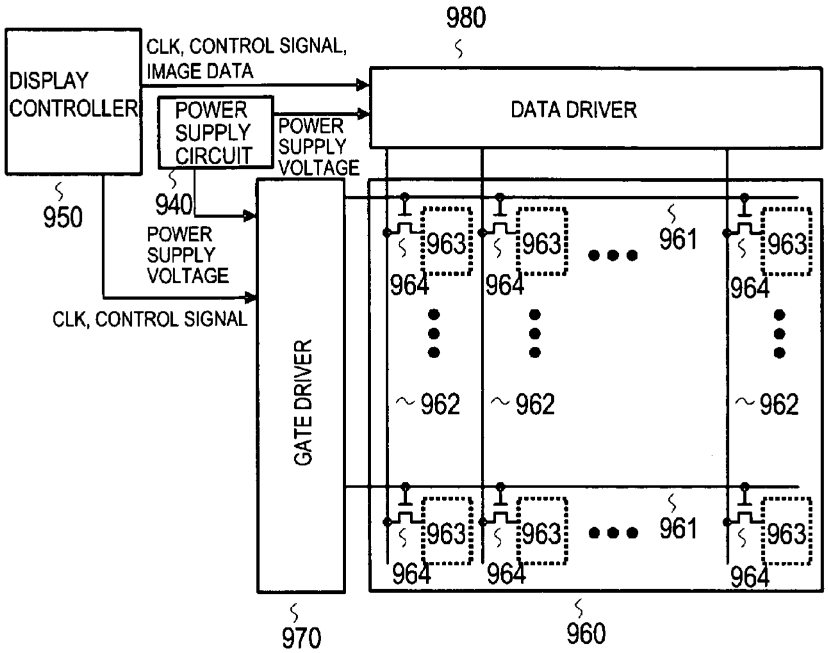
FIG. 30A RELATED ART
FIG. 30A is a block diagram showing a configuration of a display device.
Figure 30B:
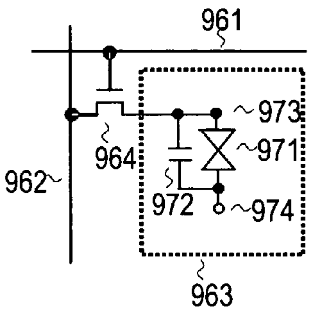
FIG. 30B RELATED ART
FIG. 30B is a circuit diagram showing a configuration of a unit pixel of a display panel of a liquid crystal display device and FIG. 30C is a circuit diagram showing a configuration of a unit pixel of a display panel of an organic EL display device.
Figure 30C:
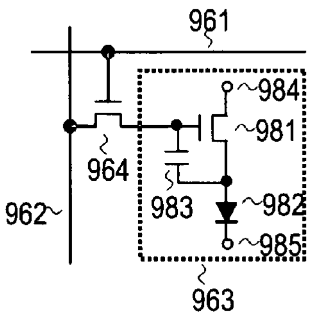
FIG. 30C RELATED ART

FIG. 29 shows essential portions of the configuration of a data driver of a display device according to yet another exemplary embodiment of the present invention. The display element connected to the data line driven by the data driver of the display device may be the liquid crystal element shown in FIG. 30B or the organic EL element shown in FIG. 30C.

Referring to FIG. 29, the present data driver is made up of a reference voltage generator 804, a set of decoder circuits 805, a set of interpolation circuits 806, a latch address selector 801, a set of latches 802 and a set of level shifters 803. The reference voltage generator 804 generates the reference voltages of the reference voltage ensembles 20, 20A, 20B, 20C or 20D of FIG. 1, 5, 8, 12, or 18, respectively. The set of decoder circuits 805 each is formed by the decoder 10, 10A, 10B, 10C and 10D of FIG. 1, 5, 8, 12 or 18, respectively, or by the decoders 10, 41 and 42 of FIG. 28. The set of interpolation circuits 806 are made up of a plurality of the interpolation circuits 30 corresponding to the number of outputs.

The latch address selector 801 determines the data latch timing based on the clock signal CLK. The set of latches 802 latches image digital data based on the timing as determined by the latch address selector 801 and outputs the digital data to the set of decoder circuits 805 via the set of level shifters 803 in response to an STB signal (strobe signal). The set of decoder circuits 805 each selects and outputs two voltages V(T1) and V(T2) from the reference voltage ensemble, generated by the reference voltage generator 804, in response to the input digital data.

The set of interpolation circuits 806 each outputs a voltage corresponding to 1:1 interpolation of the two voltages V(T1) and V(T2). A set of output terminals of the interpolation circuits 806 are connected to data lines of a display device. The latch address selector 801 and the set of latches 802 are formed by logic circuits of, in general, a low voltage, such as 0V to 3.3V, and are supplied with corresponding power supply voltages. The set of level shifters 803, set of decoder circuits 805 and the set of interpolation circuits 806 operate with a high voltage, such as 0V to 18V, necessary for driving display elements, and are supplied with corresponding power supply voltages. The digital analog converter of the present invention is applied to the reference voltage ensemble(s) generated by the reference voltage generator 804, set of decoder circuits 805, and the set of interpolation circuits 806.

With the above described Exemplary Embodiments, it is possible to provide a data driver and a display device in which the number of reference voltages needed for the number of voltage levels output from the interpolation circuit as well as the number of transistor switches composing the decoder circuit may be appreciably reduced to render it possible to reduce an area taken up by the decoder. In addition, it is possible to prevent worsening of the DNL in a gray scale characteristic to make it possible to provide a data driver and a display device having an improved display quality.

The total disclosures of the above mentioned Patent Documents are to be incorporated into the present Application. The particular exemplary embodiments or examples may be modified or adjusted within the gamut of the entire disclosure of the present invention, inclusive of claims, based on the fundamental technical concept of the invention. Further, variegated combinations or selections of elements disclosed herein may be made within the framework of the claims. The present invention may encompass various modifications or corrections that may occur to those skilled in the art in accordance with and within the gamut of the entire disclosure of the present invention, inclusive of claims, and the technical concept of the present invention.

What is claimed is:

1. A digital to analog conversion circuit comprising a decoder that receives a reference voltage ensemble including a plurality of reference voltages, different each other and m-bit digital data, where m is a predetermined positive integer, and that selects first and second voltages from said reference voltage ensemble, in accordance with said m-bit digital data; and an interpolation circuit that receives said first and second voltages selected by said decoder and interpolates said first and second voltages with an interpolation ratio of 1:1 to generate an interpolated voltage level;

wherein said plurality of reference voltages of said reference voltage ensemble are classed into first to (z×S+1)th reference voltage groups, where S is an integer which is a power of 2 and includes 1, and z is an integer which is not less than 5 and is represented by a power of 2 plus one, said plurality of reference voltages of said reference voltage ensemble being mapped in a two-dimensional array with (z×S+1) rows and h columns, h being an integer not less than 2, said first to (z×S+1)th reference voltage groups being allocated respectively to first to (z×S+1)th rows of said two-dimensional array, and k-th reference voltage in each of said reference voltage groups, where k is an integer not less then 1 and not greater than h, being allocated to k-th column of said two-dimensional array, an array element of an i-th row and j-th column of said two-dimensional array, where i is an integer not less than 1 and not greater than (z×S+1), and j is an integer not less than 1 and not greater than h, corresponding to {(j−1)×(z×S+i)}th reference voltage, wherein said decoder includes:

first to (z×S+1)th sub-decoders which are provided in association with said first to (z×S+1)th reference voltage groups, respectively, receive a first bit group of said m-bit digital data in common and receive said reference voltages of said respective first to (z×S+1)th reference voltage groups, and which select, from among said received reference voltages of said respective first to (z×S+1)th reference voltage groups, respective reference voltages allocated in common to a column of said two-dimensional array, said column corresponding to a value of said first bit group of said m-bit digital data; and a (z×S+1) input and two output type sub-decoder that receives a second bit group of said m-bit digital data and receives outputs of said first to (z×S+1)th sub-decoders and that selects said first and second voltages out of said reference voltages which are selected by said first to (z×S+1)th sub-decoders in accordance with a value of said second bit group of said m-bit digital data, wherein said reference voltage ensemble includes reference voltages associated with ones of a plurality of voltage levels that are able to be output from said interpolation circuit, with an A-th voltage level being as a reference, said reference voltage ensemble including, regarding said z and an index number N, z number of reference voltages which are associated with (4×(z−1)×N+A)th voltage level;

(4×(z−1)×N+A+2)th voltage level;

reference voltages, each sequentially spaced apart by four unit levels from said (4×(z−1)×N+A+2)th voltage level, namely a (4×(z−1)×N+A+6)th voltage level, a (4×(z−1)×N+A+10)th voltage level, and up to a (4×(z−1)(N+1)+(A−2)th voltage level;

said index number N being an integer value from 0 to (N'−1), where N' being a predetermined integer not less than 1, said reference voltage ensemble further includes in total a reference voltage associated with the (4×(z−1)×N'+A)th voltage level, such that said reference voltage ensemble includes in total (z×N'+1) reference voltages, for (4×(z−1)×N'+1) voltage levels, that range from the A-th voltage level to the (4×(z−1)×N'+A)th voltage level and that are able to be output by said interpolation circuit.

2. The digital to analog conversion circuit according to claim 1, wherein said first bit group of said m-bit digital data, supplied in common to aid first to (z×S+1)th sub-decoders, includes upper order side (m−n) bits of said m-bit digital data, where n is a positive integer such that m>n>1, said first to (z×S+1)th sub-decoders select reference voltages allocated to a column of said two-dimensional array, respectively, said column associated with the value of said first bit group, said first to (z×S+1)th sub-decoders output said reference voltages, the number of which is equal to or less than (z×S+1);

said (z×S+1) input and two output type sub-decoder selects and outputs said first and second voltages, out of the reference voltages selected by said first to (z×S+1)th sub-decoders, in accordance with a value of said second bit group which includes lower order side n bits of said m-bit digital data.

3. The digital to analog conversion circuit according to claim 2, wherein said first to (z×S+1)th sub-decoders performs decoding in a sequence from lower order bit side towards higher order bit side of said upper order side (m−n) bits.

4. The digital to analog conversion circuit according to claim 1, wherein, with said z being equal to 5 and with said A-th voltage level as a reference, said reference voltage ensemble includes, for said index number N, five reference voltages associated with:

a (16×N+A)th voltage level;

a (16×N+A+2)th voltage level; and reference voltages spaced apart each by four levels from said (16×N+A+2)th voltage level, namely a (16×N+A+6)th voltage level;

a (16×N+A+10)th voltage level; and a (16×N+A+14)th voltage level, said N taking a value from 0 to (N'−1), N' being an integer not less than 1, said reference voltage ensemble further including a reference voltage associated with the (16×N'+A)th output voltage level, such that said reference voltage ensemble includes in total (5N'+1) reference voltages, for (16×N'+1) voltage levels which ranges from said Ath to (16×N'+A)th voltage level and which are able to be output by said interpolation circuit.

5. The digital to analog conversion circuit according to claim 4, wherein said N' is expressed by N'=h×S, and said reference voltage ensemble includes (5×h×S+1) reference voltages.

6. The digital to analog conversion circuit according to claim 5, wherein said N' is 64, said A-th is 0th, and said m-bit digital data is of 10 bits, wherein said reference voltage ensemble includes 321 reference voltages for 1025 voltage levels that range from the 0th to 1024th voltage levels and that are able to be output from said interpolation circuit, 1024 out of said 1025 voltage levels being allocated to said 10-bit digital data, and wherein said decoder selects said first and second voltages from said 321 reference voltages in response to said 10-bit digital data, and said interpolation circuit outputs one out of said 1024 voltage levels in response to said first and second voltages selected.

7. The digital to analog conversion circuit according to claim 1, wherein, with said z being equal to 9 and with said A-th voltage level as a reference, said reference voltage ensemble includes, for said index number N, nine reference voltages associated with a (32×N+A)th voltage level;

a (32×N+A+2)th voltage level; and reference voltages spaced apart each by four levels from said (32×N+A+2)th voltage level, namely a (32×N+A+6)th voltage level;

a (32×N+A+10)th voltage level;

a (32×N+A+14)th voltage level;

a (32×N+A+18)th voltage level;

a (32×N+A+22)th voltage level;

a (32×N+A+26)th voltage level; and a (32×N+A+30)th voltage level;

said N taking a value from 0 to (N'−1), N' being a predetermined integer not less than 1.

said reference voltage ensemble further including a reference voltage associated with the (32×N'+A)th output voltage level, such that said reference voltage ensemble includes in total (9N'+1) reference voltages, for (32×N'+1) voltage levels that range from said A-th to (32×N'+A)th voltage levels and that are able to be output from said interpolation circuit.

8. The digital to analog conversion circuit according to claim 7, wherein said N' is expressed by N'=h×S and said reference voltage ensemble includes (9×h×S+1) reference voltages.

9. The digital to analog conversion circuit according to claim 8, wherein said N' is 32, said A-th is 0th, and said m-bit digital data N' is of 10 bits, wherein said reference voltage ensemble includes 289 reference voltages, for 1025 voltage levels that range from said 0th to 1024th voltage levels that are able to be output from said interpolation circuit, 1024 of said 1025 voltage levels being allocated to said 10-bit digital data, and wherein said decoder selects said first and second voltages from said 289 reference voltages in response to said 10-bit digital data, and said interpolation circuit outputs one out of said 1024 voltage levels from said interpolation circuit in response to said first and second voltages selected.

10. The digital to analog conversion circuit according to claim 1, wherein, with an Ath voltage level as a reference, said reference voltage ensemble includes, in case said z is 17, and in relation to an index N, 17 reference voltages associated with a (64×N+A)th voltage level, a (64×N+A+2)th voltage level; and reference voltages spaced apart each by four levels from said (64×N+A+2)th voltage level, namely a (64×N+A+6)th voltage level, a (64×N+A+10)th voltage level, a (64×N+A+14)th voltage level;

a (64×N+A+18)th voltage level, a (64×N+A+22)th voltage level;

a (64×N+A+26)th voltage level;

a (64×N+A+30)th voltage level;

a (64×N+A+34)th voltage level, a (64×N+A+38)th voltage level, a (64×N+A+42)th voltage level;

a (64×N+A+46)th voltage level, a (64×N+A+50)nd voltage level;

a (64×N+A+54)th voltage level;

a (64×N+A+58)th voltage level; and a (64×N+A+62)th voltage level;

said N taking a value from 0 to (N'−1), N' being an integer not less than 1, said reference voltage ensemble further including a reference voltage associated with the (64×N'+A)th output voltage level, such that said reference voltage ensemble includes in total (17N'+1) reference voltages, for (64×N'+1) voltage levels that range from said Ath to said (64×N'+A)th voltage level and that are able to be output from said interpolation circuit.

11. The digital to analog conversion circuit according to claim 10, wherein said N' is expressed by N'=h×S, and said reference voltage ensemble including (17×h×S+1) reference voltages.

12. The digital to analog conversion circuit according to claim 11, wherein said N' is 16, said A-th is 0th, and said m-bit digital data N' is of 10 bits, wherein said reference voltage ensemble includes 273 reference voltages, for 1025 voltage levels that range from said 0th to 1024th voltage levels and that are able to be output from said interpolation circuit, 1024 of said 1025 voltage levels being allocated to said 10-bit digital data, and wherein said decoder selects said first and second voltages from said 273 reference voltages in response to said 10-bit digital data, and said interpolation circuit outputs one out of said 1024 voltage levels from said interpolation circuit in response to said first and second voltages selected.

13. The digital to analog conversion circuit according to claim 1, further comprising:

at least one other reference voltage ensemble including:

a plurality of reference voltages, corresponding to an output level range different from an output level range prescribed by said first to (z×S+1)th reference voltage group; and another decoder that receives reference voltages of said other reference voltage ensemble to select and output third and fourth voltages in response to said m-bit digital data, said another decoder including:

an output node for outputting said third voltage, connected in common with an output node of said decoder for outputting said first voltage; and another output node for outputting said fourth voltage, connected in common with another output node of said decoder for outputting said second voltage;

said interpolation circuit receiving said third and fourth voltages outputting a voltage level which is an interpolation of said third and fourth voltages at an interpolation ratio of 1:1.

14. The digital to analog conversion circuit according to claim 1, wherein, for a plurality of combinations of said first and second voltages, associated with a specific voltage level in an ordering of voltage levels output from said interpolation circuit, said first and second voltages being selected by said (z×S+1) input and two output type sub-decoder out of reference voltages selected by said first to (z×S+1)th decoders and supplied to said interpolation circuit, a difference between said first voltage/second voltage level difference associated with said specific voltage level, and said first voltage/second voltage level difference associated with voltage levels neighboring to said specific voltage level in said ordering is equal to or less than 37.5% of a maximum value of level difference of selectable combinations of said first and second voltages.

15. The digital to analog conversion circuit according to claim 1, wherein, for a plurality of combinations of said first and second voltages, associated with a specific voltage level in an ordering of voltage levels output from said interpolation circuit, said first and second voltages being selected by said (z×S+1) input and two output type sub-decoder out of the reference voltages selected by said first to (z×S+1)th decoders and supplied to said interpolation circuit, a difference between said first voltage/second voltage level difference for said specific voltage level and said first voltage/second voltage level difference for a voltage level neighboring to said specific voltage level in said ordering is equal to or less than 6 levels.

16. A data driver including a digital to analog conversion circuit that receives an input digital signal corresponding to an input video signal to output a voltage associated with said input digital signal, said a digital to analog conversion circuit according to claim 1, said data driver driving a data line with a voltage associated with said input video signal.

17. A display device including a unit pixel, said unit pixel comprising:

a pixel switch; and a display element at a location of intersection of a data line and a scan line, a signal on said data line being written into said display element via said pixel switch which is turned on by said scan line, said display device further including a data driver driving said data line, said data driver according to claim 16.

18. The display device according to claim 17, wherein said display element includes a liquid crystal element or an organic EL element.

* * * * *